United States Patent
Kawai et al.

(10) Patent No.: US 9,363,491 B2
(45) Date of Patent: Jun. 7, 2016

(54) IMAGING DEVICE, IMAGE PROCESSING DEVICE, IMAGE PROCESSING METHOD AND PROGRAM

(71) Applicant: FUJIFILM Corporation, Tokyo (JP)

(72) Inventors: Tomoyuki Kawai, Saitama (JP); Kenkichi Hayashi, Saitama (JP); Hidekazu Kurahashi, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/804,915

(22) Filed: Jul. 21, 2015

(65) Prior Publication Data

US 2015/0326838 A1    Nov. 12, 2015

Related U.S. Application Data

(63) Continuation of application No. PCT/JP2014/053817, filed on Feb. 18, 2014.

(30) Foreign Application Priority Data

Mar. 5, 2013    (JP) .................................. 2013-043005

(51) Int. Cl.
*H04N 9/04* (2006.01)
*H04N 5/372* (2011.01)
*H04N 5/374* (2011.01)
*H04N 9/73* (2006.01)

(Continued)

(52) U.S. Cl.
CPC ............... *H04N 9/045* (2013.01); *H04N 5/359* (2013.01); *H04N 5/372* (2013.01); *H04N 5/374* (2013.01); *H04N 9/646* (2013.01); *H04N 9/735* (2013.01); *H01L 27/14621* (2013.01)

(58) Field of Classification Search
None
See application file for complete search history.

(56) References Cited

U.S. PATENT DOCUMENTS 7,760,256 B2 * 7/2010 Kanamori .............. H04N 9/045 348/222.1
7,812,382 B2 * 10/2010 Iida ................... H01L 27/14603 257/292

(Continued)

FOREIGN PATENT DOCUMENTS

| JP | 2005-333251 A | 12/2005 |
| JP | 2008-54206 A | 3/2008 |
| JP | 2012-9919 A | 1/2012 |

OTHER PUBLICATIONS

International Search Report issued in PCT/JP2014/053817, mailed on May 27, 2014.

(Continued)

*Primary Examiner* — Michael Osinski
(74) *Attorney, Agent, or Firm* — Birch, Stewart, Kolasch & Birch, LLP

(57) ABSTRACT

Pixels constituting the imaging element include at least four types of the determination pixels for which color filter patterns of adjacent pixels thereof are different from one another. At least one of pixels, which are adjacent to each determination pixel, is a first color pixel that has a color filter with a first color. Further, among the pixels which are adjacent to each determination pixel, a pixel, which is opposed to the first color pixel with the determination pixel interposed therebetween, has a color filter other than the color filter with the first color. Abnormal oblique incident light, which is incident into the imaging element, is detected on the basis of average values of the respective pixel data pieces corresponding to the types of these determination pixels.

23 Claims, 30 Drawing Sheets

(51) Int. Cl.
  *H04N 9/64* (2006.01)
  *H04N 5/359* (2011.01)
  *H01L 27/146* (2006.01)

(56) References Cited

U.S. PATENT DOCUMENTS

| | | | | |
|---|---|---|---|---|
| 8,130,293 | B2* | 3/2012 | Kanamori | H04N 9/045 348/222.1 |
| 8,564,700 | B2* | 10/2013 | Kanamori | H01L 27/14621 348/273 |
| 8,742,309 | B2* | 6/2014 | Agranov | G01S 3/782 250/208.1 |
| 9,160,990 | B2* | 10/2015 | Kawai | H04N 5/23212 |
| 9,172,925 | B2* | 10/2015 | Sugawara | G02B 7/34 |
| 2011/0076001 | A1* | 3/2011 | Iwasaki | G03B 7/099 396/114 |
| 2013/0201388 | A1* | 8/2013 | Hsiao | H04N 5/3572 348/360 |
| 2013/0286261 | A1* | 10/2013 | Tanaka | H04N 5/3728 348/280 |
| 2014/0211076 | A1* | 7/2014 | Inoue | G02B 7/34 348/349 |
| 2015/0009367 | A1* | 1/2015 | Kobayashi | G02B 7/34 348/240.3 |
| 2015/0042858 | A1* | 2/2015 | Kokubun | H01L 27/14625 348/302 |
| 2015/0062386 | A1* | 3/2015 | Sugawara | G02B 7/34 348/241 |
| 2015/0076643 | A1* | 3/2015 | Kikuchi | H01L 27/14621 257/432 |
| 2015/0077597 | A1* | 3/2015 | Furuta | H04N 5/359 348/242 |
| 2015/0090909 | A1* | 4/2015 | Shih | G01J 1/0266 250/578.1 |
| 2015/0156405 | A1* | 6/2015 | Izawa | G02B 7/34 348/246 |
| 2015/0187843 | A1* | 7/2015 | Hatano | H01L 27/1464 257/40 |
| 2015/0237273 | A1* | 8/2015 | Sawadaishi | H04N 5/3572 348/234 |
| 2015/0244926 | A1* | 8/2015 | Inoue | G02B 7/34 348/350 |
| 2015/0244955 | A1* | 8/2015 | Kurahashi | H04N 9/07 348/300 |
| 2015/0244957 | A1* | 8/2015 | Kim | H04N 5/3696 348/302 |
| 2015/0271461 | A1* | 9/2015 | Hayashi | H04N 9/07 348/223.1 |
| 2015/0288901 | A1* | 10/2015 | Tanaka | H01L 27/14605 250/208.1 |

OTHER PUBLICATIONS

Written Opinion of the International Searching Authority issued in PCT/JP2014/053817, mailed on May 27, 2014.

* cited by examiner

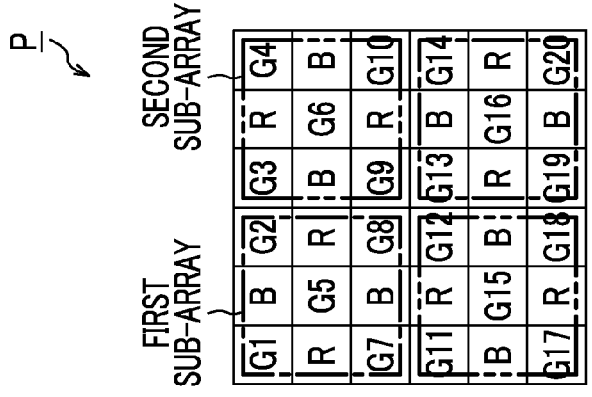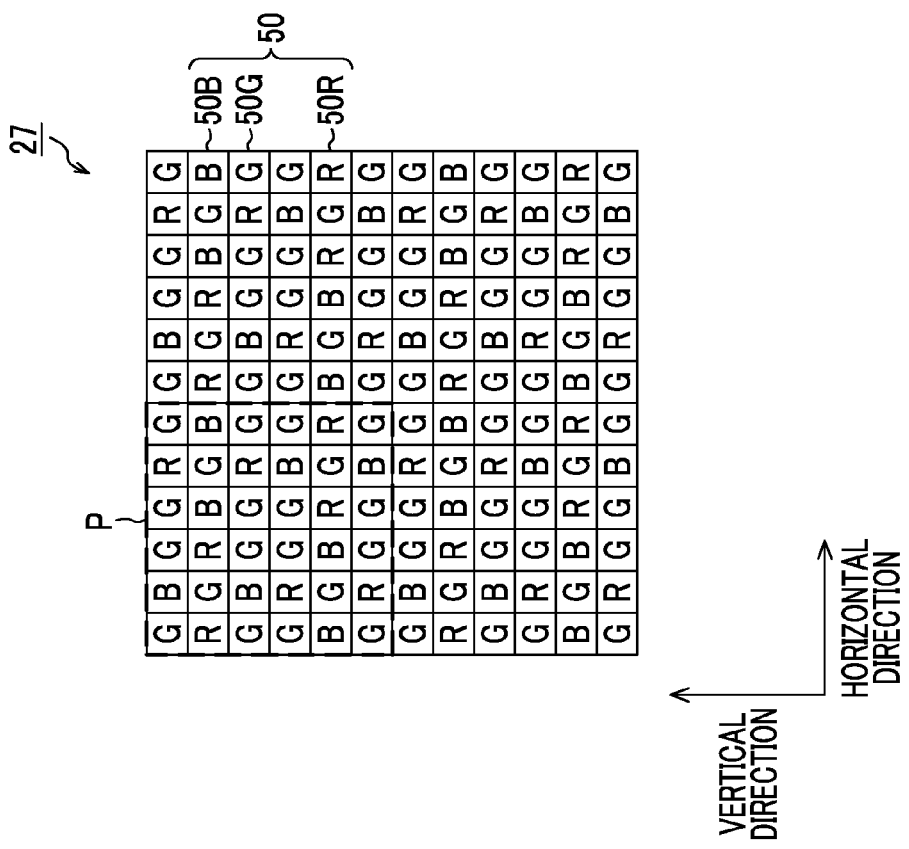

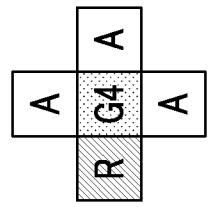
FIG. 8A
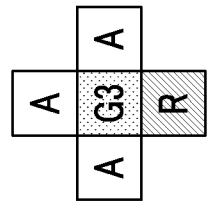
FIG. 8B
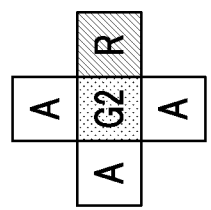
FIG. 8C
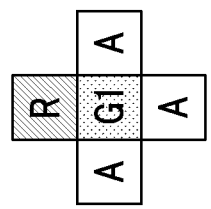
FIG. 8D
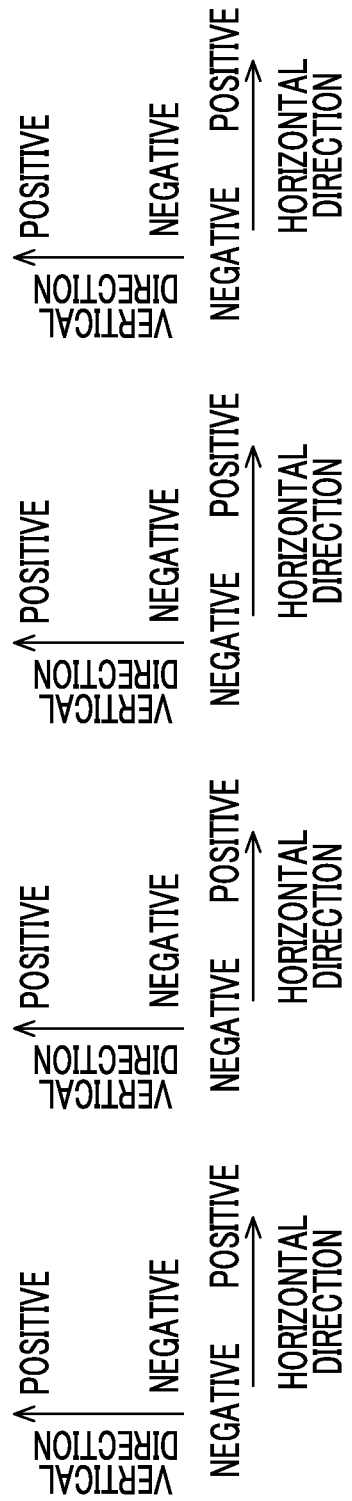

FIG. 9

| | G1 PIXEL DATA | G2 PIXEL DATA | G3 PIXEL DATA | G4 PIXEL DATA |
|---|---|---|---|---|
| RED ABNORMAL OBLIQUE INCIDENT LIGHT (VERTICAL DIRECTION POSITIVE→NEGATIVE) | LARGE | SMALL | SMALL | SMALL |
| RED ABNORMAL OBLIQUE INCIDENT LIGHT (VERTICAL DIRECTION NEGATIVE→POSITIVE) | SMALL | SMALL | LARGE | SMALL |
| RED ABNORMAL OBLIQUE INCIDENT LIGHT (HORIZONTAL DIRECTION POSITIVE→NEGATIVE) | SMALL | LARGE | SMALL | SMALL |
| RED ABNORMAL OBLIQUE INCIDENT LIGHT (HORIZONTAL DIRECTION NEGATIVE→POSITIVE) | SMALL | SMALL | SMALL | LARGE |

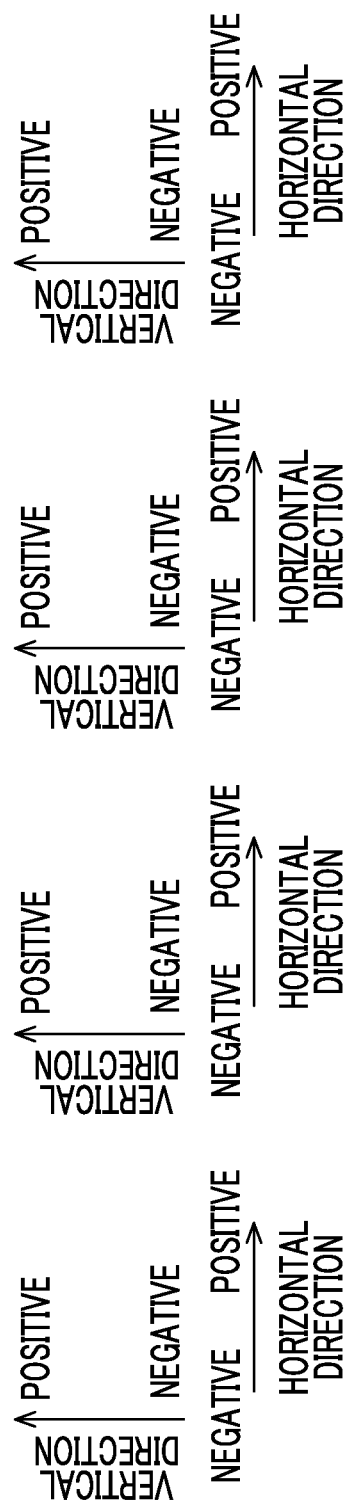

FIG. 12

| | G1 PIXEL DATA | G2 PIXEL DATA | G3 PIXEL DATA | G4 PIXEL DATA |
|---|---|---|---|---|
| RED ABNORMAL OBLIQUE INCIDENT LIGHT (VERTICAL DIRECTION POSITIVE→NEGATIVE) | LARGE | LARGE | SMALL | SMALL |
| RED ABNORMAL OBLIQUE INCIDENT LIGHT (VERTICAL DIRECTION NEGATIVE→POSITIVE) | SMALL | SMALL | LARGE | LARGE |
| RED ABNORMAL OBLIQUE INCIDENT LIGHT (HORIZONTAL DIRECTION POSITIVE→NEGATIVE) | LARGE | SMALL | LARGE | SMALL |
| RED ABNORMAL OBLIQUE INCIDENT LIGHT (HORIZONTAL DIRECTION NEGATIVE→POSITIVE) | SMALL | LARGE | SMALL | LARGE |

FIG. 20

| | G1 | G2 | G3 | G4 | G5 | G6 | G7 | G8 | R DETERMINATION TABLE | G DETERMINATION TABLE |
|---|---|---|---|---|---|---|---|---|---|---|
| PAT00 | 1 | 1 | 1 | 1 | 1 | 1 | 1 | 1 | NO GHOST | NO GHOST |
| PAT01 | 2 | 0 | 1 | 1 | 0 | 2 | 1 | 1 | GHOST FROM UPSIDE | - |
| PAT02 | 1 | 2 | 0 | 1 | 1 | 0 | 2 | 1 | GHOST FROM RIGHT SIDE | - |
| PAT03 | 1 | 1 | 2 | 0 | 1 | 1 | 0 | 2 | GHOST FROM DOWNSIDE | - |
| PAT04 | 0 | 1 | 1 | 2 | 2 | 1 | 1 | 0 | GHOST FROM LEFT SIDE | - |
| PAT05 | 2 | 1 | 0 | 1 | 2 | 1 | 0 | 1 | - | GHOST FROM LOWER RIGHT |
| PAT06 | 1 | 2 | 1 | 0 | 1 | 2 | 1 | 0 | - | GHOST FROM LOWER LEFT |
| PAT07 | 0 | 1 | 2 | 1 | 0 | 1 | 2 | 1 | - | GHOST FROM UPPER LEFT |
| PAT08 | 1 | 0 | 1 | 2 | 1 | 0 | 1 | 2 | - | GHOST FROM UPPER RIGHT |
| PAT09 | 2 | 1 | 0 | 1 | 0 | 1 | 2 | 1 | GHOST FROM UPPER RIGHT | - |
| PAT10 | 1 | 2 | 1 | 0 | 1 | 0 | 1 | 2 | GHOST FROM LOWER RIGHT | - |
| PAT11 | 0 | 1 | 2 | 1 | 2 | 1 | 0 | 1 | GHOST FROM LOWER LEFT | - |
| PAT12 | 1 | 0 | 1 | 2 | 1 | 2 | 1 | 0 | GHOST FROM UPPER LEFT | - |
| PAT13 | 0 | 0 | 2 | 2 | 0 | 0 | 2 | 2 | - | GHOST FROM UPSIDE |
| PAT14 | 2 | 0 | 0 | 2 | 2 | 0 | 0 | 2 | - | GHOST FROM RIGHT SIDE |
| PAT15 | 2 | 2 | 0 | 0 | 2 | 2 | 0 | 0 | - | GHOST FROM DOWNSIDE |
| PAT16 | 0 | 2 | 2 | 0 | 0 | 2 | 2 | 0 | - | GHOST FROM LEFT SIDE |
| PAT17 | 0 | 0 | 2 | 2 | 2 | 0 | 0 | 2 | GHOST FROM LOWER LEFT | - |
| PAT18 | 2 | 0 | 0 | 2 | 2 | 2 | 0 | 0 | GHOST FROM UPPER LEFT | - |
| PAT19 | 2 | 2 | 0 | 0 | 0 | 2 | 2 | 0 | GHOST FROM UPPER RIGHT | - |
| PAT20 | 0 | 2 | 2 | 0 | 0 | 0 | 2 | 2 | GHOST FROM LOWER RIGHT | - |
| PAT21 | 0 | 1 | 0 | 1 | 0 | 1 | 0 | 1 | NO GHOST | NO GHOST |
| PAT22 | 1 | 0 | 1 | 0 | 1 | 0 | 1 | 0 | NO GHOST | NO GHOST |
| PAT23 | 0 | 1 | 0 | 1 | 1 | 0 | 1 | 0 | NO GHOST | NO GHOST |
| PAT24 | 1 | 0 | 1 | 0 | 0 | 1 | 0 | 1 | NO GHOST | NO GHOST |
| PAT25 | 2 | 0 | 0 | 0 | 0 | 2 | 0 | 0 | STRONG GHOST FROM UPSIDE | - |
| PAT26 | 0 | 2 | 0 | 0 | 0 | 0 | 2 | 0 | STRONG GHOST FROM RIGHT SIDE | - |
| PAT27 | 0 | 0 | 2 | 0 | 0 | 0 | 0 | 2 | STRONG GHOST FROM DOWNSIDE | - |
| PAT28 | 0 | 0 | 0 | 2 | 2 | 0 | 0 | 0 | STRONG GHOST FROM LEFT SIDE | - |

0 : SMALL AVERAGE VALUE
1 : MEDIUM AVERAGE VALUE
2 : LARGE AVERAGE VALUE

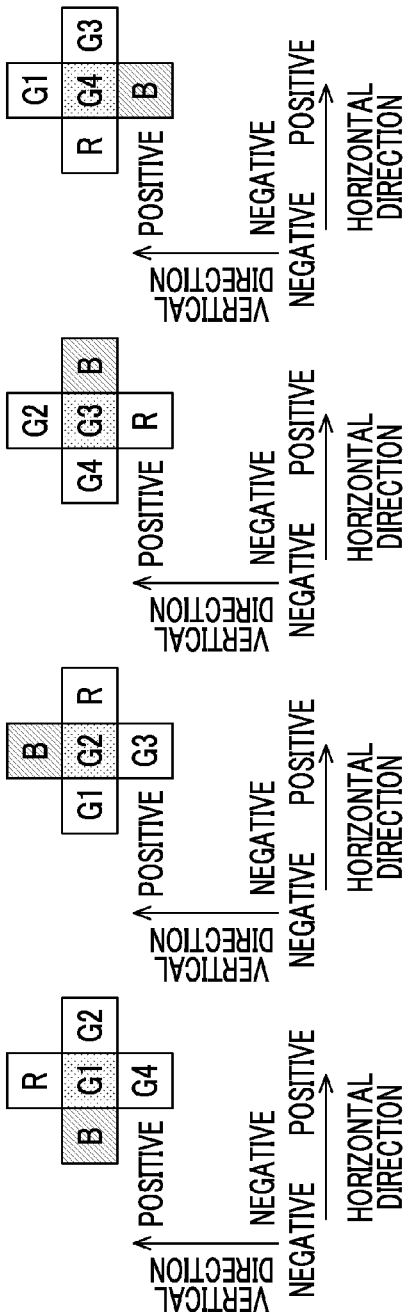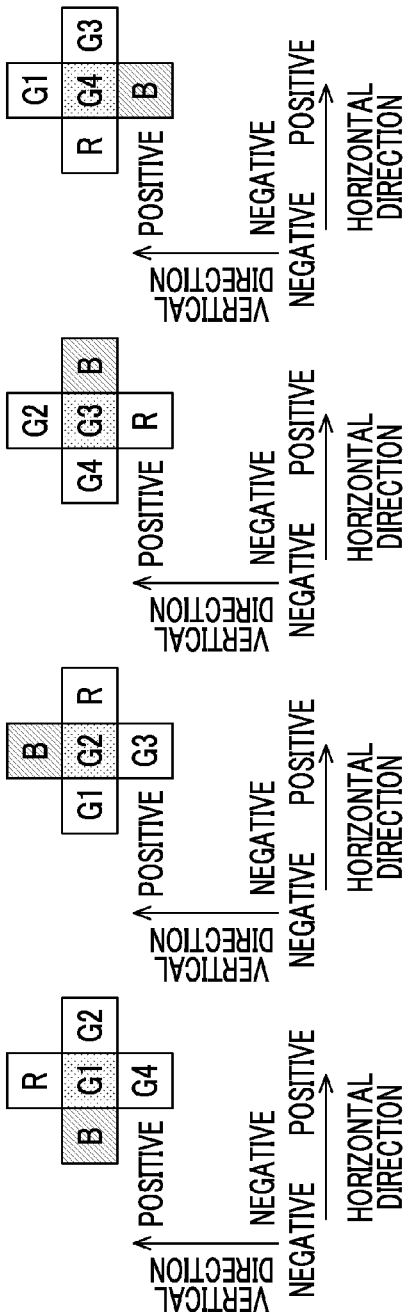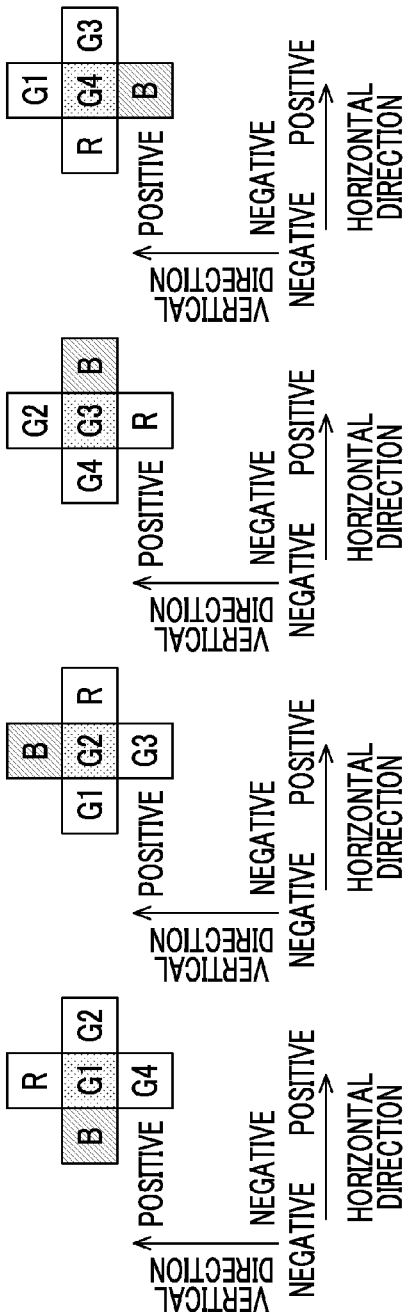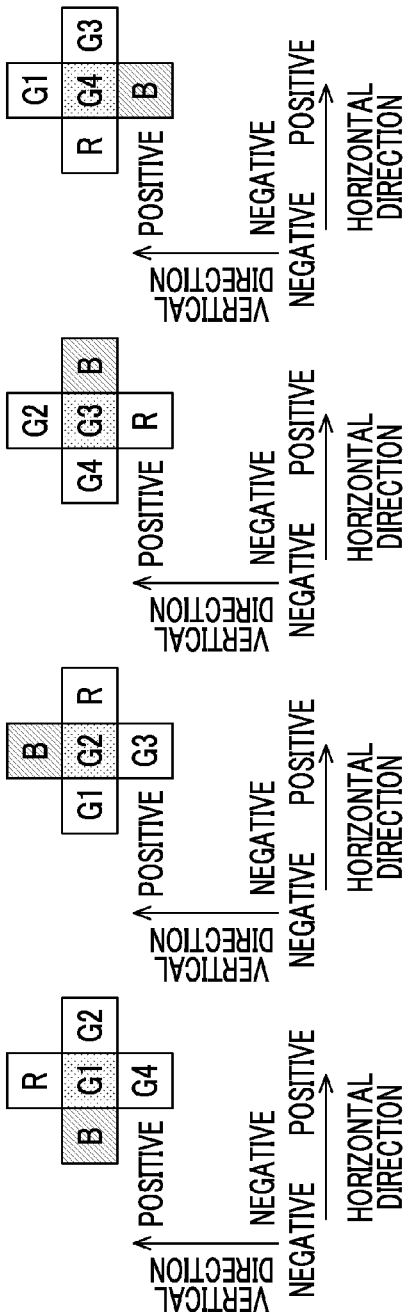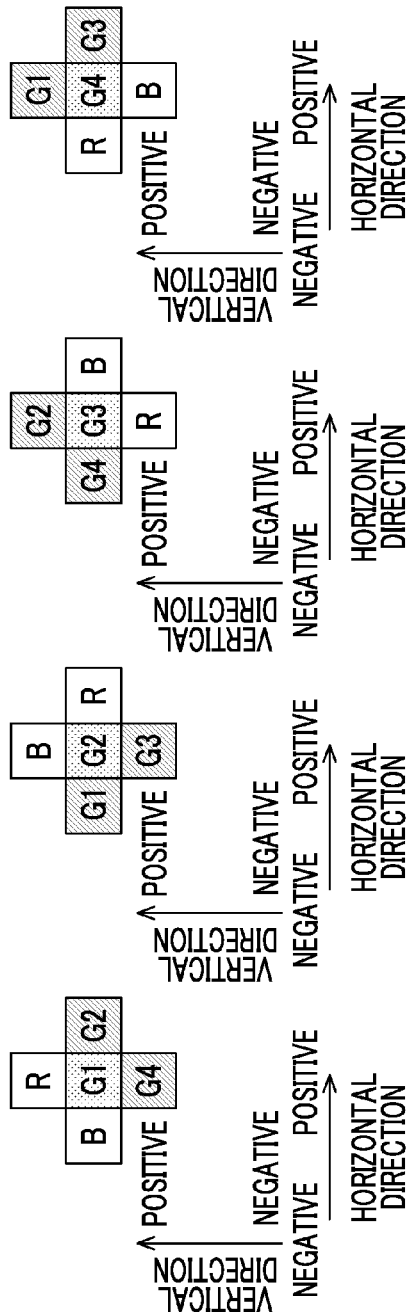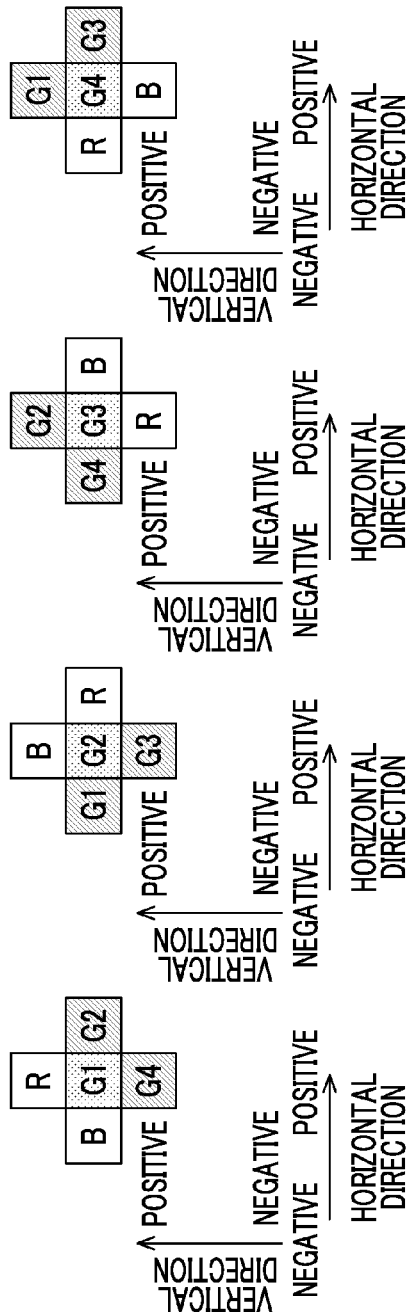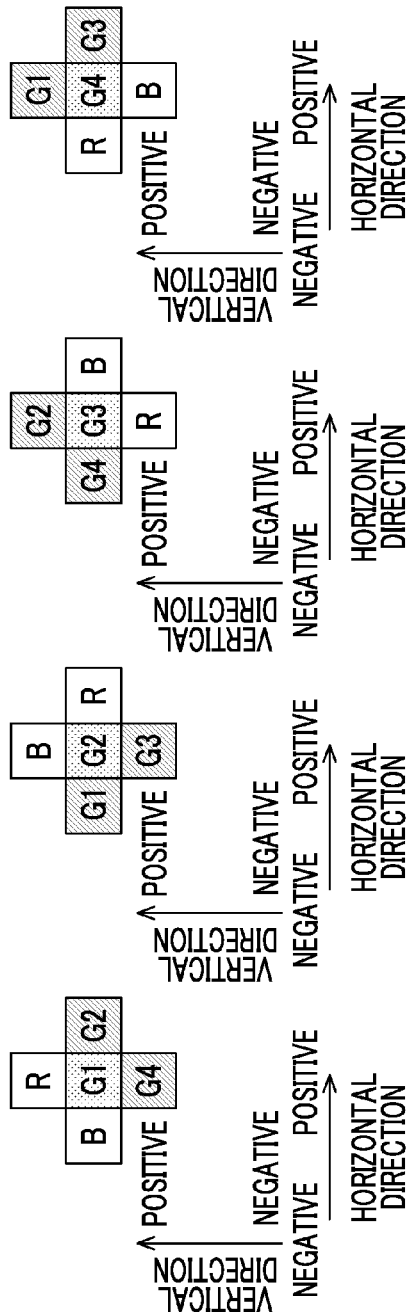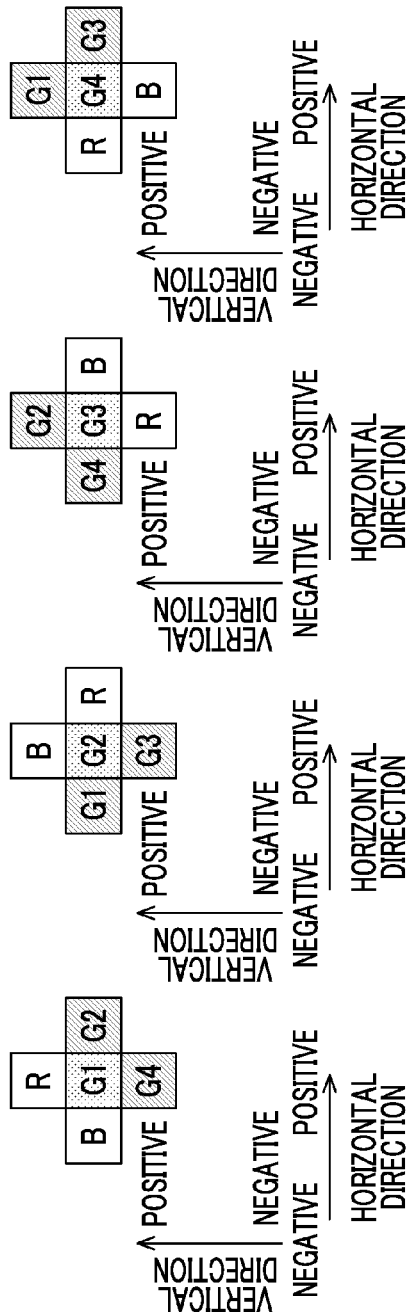

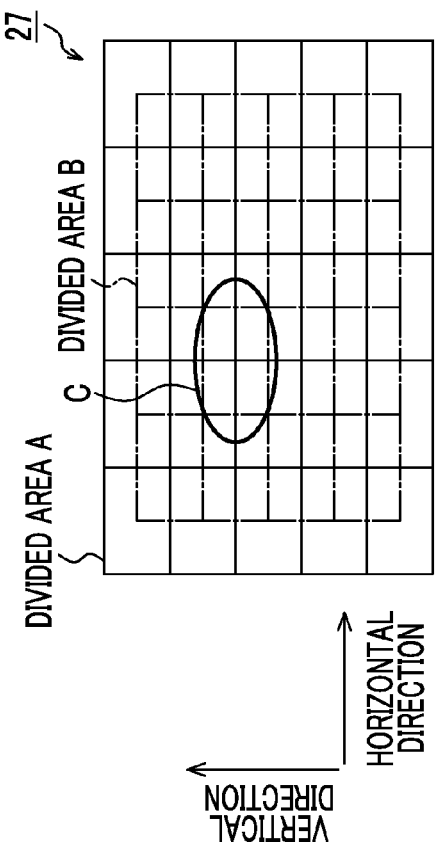

IMAGING DEVICE, IMAGE PROCESSING DEVICE, IMAGE PROCESSING METHOD AND PROGRAM

CROSS-REFERENCE TO RELATED APPLICATIONS

This application is a Continuation of PCT International Application No. PCT/JP2014/53817, filed on Feb. 18, 2014, which claims priority under 35 U.S.C. §119(a) to Japanese Patent Application No. 2013-043005, filed on Mar. 5, 2013. Each of the above application(s) is hereby expressly incorporated by reference, in its entirety, into the present application.

BACKGROUND OF THE INVENTION

1. Field of the Invention

The present invention relates to an imaging device, an image processing device, an image processing method, and a non-transitory computer readable medium. In particular, the present invention relates to a technique of detecting abnormal oblique incident light.

2. Description of the Related Art

Generally, in single-plate-type imaging elements having mosaic color filter arrays, color mixture is caused by light leakage from adjacent pixels. When an image is generated by performing digital signal processing on color signals of RGB colors which tend to be greatly affected by color mixture, color reproducibility (image quality) of the image is lowered, and it is difficult to accurately calculate a white balance (WB) gain for WB correction from the color signals of RGB colors which tend to be greatly affected by color mixture.

If light with strong intensity is incident into a lens when a subject image is captured by an imaging device such as a digital camera, light reflected from surfaces of a photography lens, microlenses, and the like is reflected along complex paths inside the lenses or inside the camera. As a result, the imaging element may receive light which travels at an undesired angle. As described above, abnormal oblique incident light, which is incident into the imaging element at the undesired angle, causes phenomena such as so-called ghosts and flares, and thus deteriorates image quality of a captured image.

In particular, if an incident angle of the abnormal oblique incident light is large, in some cases, pixels constituted of color filters onto which abnormal oblique incident light is incident may not correspond to pixels constituted of photodiodes in which abnormal oblique incident light is received. If color filters through which abnormal oblique incident light passes do not perfectly correspond to photodiodes in which abnormal oblique incident light is actually received, a color mixture phenomenon occurs. As a result, the phenomenon causes deterioration in color reproducibility of a captured image. The color mixture phenomenon tends to be caused by abnormal oblique incident light including particularly long-wavelength components (for example, a red light component).

As a method for reducing an effect of the color mixture, there is proposed a technique of detecting locations where ghosts and the like occur and correcting output differences (level differences) in pixel data between pixels. For example, JP2012-009919A discloses a technique of detecting whether or not there is a level difference by calculating an average pixel value of Gr/Gb for each predetermined area and counting comparative accumulated values such as a threshold value and a relative difference value, in a Bayer array.

Further, JP2005-333251A discloses a technique of detecting noise in units of MCU (8 lines×16 pixels) by using a reference pattern, in the Bayer array. According to the technique of JP2005-333251A, reference patterns 100P (5×5 pixels) for color noise determination are held, and color noise is detected on the basis of whether or not it matches with the reference patterns 100P.

Furthermore, JP2008-054206A discloses a technique of dividing an image area in units of blocks, specifying positions of blocks in which ghosts are detected, and performing ghost correction.

SUMMARY OF THE INVENTION

Most imaging elements conventionally used have comparatively simple color filter arrays. For example, in the Bayer array widely used, a total of four pixels of two pixels (horizontal direction)×two pixels (vertical direction) constituted of "an R pixel and a G pixel" and "a G pixel and a B pixel" which are disposed to be adjacent are repeatedly disposed in the horizontal direction and the vertical direction, thereby forming a color filter array.

In such an imaging element having a simple color filter array, the color mixture phenomenon is also comparatively simple. Hence, it is possible to reduce the effect of color mixture on image data through comparatively easy color mixture correction.

However, recently, imaging elements having comparatively complex color filter arrays are also used, and there may be multiple pixels for which types of pixels (color filters) adjacent thereto are different, even among pixels having color filters with the same color. For example, in the Bayer array, pixels (G pixels) having green color filters are classified into two types in accordance with types (color filter types) of adjacent pixel, but in the complex color filter array, the pixels are classified into many more types (for example, 10 or more types).

The effect of color mixture varies in accordance with the types of the adjacent pixel. Hence, also in pixels having color filters with the same color, it is preferable to perform color mixture correction according to the types of the adjacent pixel (color filter).

However, in an imaging element having a complex color filter array, the color mixture phenomenon becomes also complex. Thus, even in approximately same color pixels outputting the same or approximately original pixel data, due to the color mixture phenomenon, different pixel data according to the types of the color filter of the adjacent pixel is output from the approximate same color pixels.

In particular, when light (abnormal oblique incident light) at an incident angle, which is different from normal light, like ghost light is incident into the imaging element, an unnatural disparity (level difference in the same color) in the pixel data between approximate same color pixels is caused by leakage of ghost light passing through the color filters of the adjacent pixels. As the number of the types of the adjacent pixel increases even in the same color pixels, this level-difference phenomenon becomes complex. The complex color mixture phenomenon, which is caused by incidence of ghost light in the imaging element having the complex color filter array, cannot be sufficiently corrected through normal color mixture correction.

In image data which is output from such an imaging element having a complex color filter array, in order to reduce the effect of the color mixture phenomenon caused by abnormal oblique incident light such as ghost light, it is important to accurately detect presence or absence of incidence of abnormal oblique incident light, an incidence direction thereof, and the like.

The present invention has been made in consideration of the above-mentioned situation, and its object is to provide a technique of easily detecting the incidence direction and presence or absence of incidence of abnormal oblique incident light even when the imaging element has a complex color filter array.

According to an aspect of the present invention, there is provided an imaging device including: an imaging element that has a plurality of pixels arranged in a first direction and a second direction perpendicular to the first direction, where each of the plurality of pixels has a color filter and a photodiode which receives light transmitted through the color filter and outputs pixel data; and an abnormal oblique-incident-light detection unit detecting abnormal oblique incident light which is incident into the imaging element on the basis of the pixel data, in which the plurality of pixels includes at least four types of determination pixels for which patterns of color filters of pixels adjacent in a positive direction and a negative direction of the first direction and pixels adjacent in a positive direction and a negative direction of the second direction are different from one another, in which at least one of pixels, which are adjacent to each determination pixel in the positive direction and the negative direction of the first direction, and pixels, which are adjacent to the determination pixel in the positive direction and the negative direction of the second direction, is a first color pixel that has a color filter with a first color, in which among the pixels which are adjacent to each determination pixel in the positive direction and the negative direction of the first direction and the pixels which are adjacent to the determination pixel in the positive direction and the negative direction of the second direction, a pixel, which is opposed to the first color pixel with the determination pixel interposed therebetween, has a color filter other than the color filter with the first color, and in which the abnormal oblique-incident-light detection unit detects abnormal oblique incident light, which is incident into the imaging element, on the basis of average values of the respective pixel data pieces corresponding to the types of the determination pixels in an area which is an area within the imaging element and includes types of a plurality of the determination pixels.

According to the present aspect, on the basis of the average values of the respective pixel data pieces corresponding to the types of the determination pixels in the area of the imaging element, it is possible to detect abnormal oblique incident light which is incident into the imaging element. In particular, even when the imaging element has a complex color filter array, if the imaging element includes determination pixels that satisfy the above-mentioned condition, it is possible to easily detect the incidence direction and presence or absence of abnormal oblique incident light on the basis of the image data which is output from the imaging element.

The "abnormal oblique incident light" described herein means components of light, which is incident into pixels (photodiodes) at an angle different from normal incident light of a subject image, and components of light, which passes through color filters and is received by photodiodes, the color filters and the photodiodes not constituting the same pixels. Consequently, the abnormal oblique incident light described herein includes a light component which is a cause of phenomena such as so-called ghosts and flares.

The "area in the imaging element" is an optional area of the imaging element, and a part or the entirety of a pixel area of the imaging element can be set as the "area in the imaging element". In addition, the "area in the imaging element" described herein may be a predetermined area which is determined in advance, but is not limited to a fixed area and an area which has been set, and may be a variable area which is not determined in advance. For example, there may be an area, which is preferentially subjected to detection of abnormal oblique incident light, such as a planar area having a low contrast at which the level difference in the same color is remarkable or an area in which a face is detected. In this case, in accordance with the priority of the area, it can be considered that the "area in the imaging element" may be made to be variable.

It is preferable that the abnormal oblique-incident-light detection unit detects an incidence direction of the abnormal oblique incident light, which is incident into the imaging element, on the basis of the average values of the respective pixel data pieces corresponding to the types of the determination pixels in the area.

According to the present aspect, on the basis of the pixel data of the determination pixels, it is possible to detect the incidence direction of the abnormal oblique incident light.

It is preferable that the imaging device further includes storage unit storing a determination table in which information about incidence of the abnormal oblique incident light into the imaging element is associated with data patterns based on the average values of the respective pixel data pieces corresponding to the types of the determination pixels in the area, in which the abnormal oblique-incident-light detection unit detects the abnormal oblique incident light, which is incident into the imaging element, with reference to the determination table.

According to the present aspect, with reference to the determination table, it is possible to easily detect abnormal oblique incident light.

In addition, "the data patterns based on the average values of the respective pixel data pieces corresponding to the types of the determination pixels in the area" may be own data patterns of the average values of the respective pixel data pieces corresponding to the types of the determination pixels, and may be data patterns based on a different reference derived from the average values.

It is preferable that, in the determination table, the information about incidence of the abnormal oblique incident light into the imaging element is determined for each color type of the abnormal oblique incident light, and the abnormal oblique-incident-light detection unit detects a color type of the abnormal oblique incident light on the basis of the pixel data for each color type of the color filters in the area of the imaging element, and detects abnormal oblique incident light, which is incident into the imaging element, with reference to the determination table corresponding to the detected color type of the abnormal oblique incident light.

According to the present aspect, with reference to the determination table corresponding to the detected color type of the abnormal oblique incident light, it is possible to accurately detect abnormal oblique incident light as a detection target.

It is preferable that, in the determination table, when an average value of a sum of average values of the respective pixel data pieces corresponding to the at least four types of the determination pixels or a median of the average values of the respective pixel data pieces corresponding to the at least four types of the determination pixels is set as a reference, a data pattern, which indicates proportions of the respective pixel data pieces corresponding to the at least four types of the determination pixels, is associated with the information about incidence of the abnormal oblique incident light into the imaging element.

According to the present aspect, it is possible to easily and accurately acquire information about incidence of abnormal oblique incident light from the proportions of the respective pixel data pieces corresponding to the types of the determination pixels. As a result, it is possible to simplify a circuit or a memory necessary for detection of abnormal oblique incident light.

It is preferable that, in the determination table, ranks based on magnitudes of the average values of the respective pixel data pieces corresponding to the at least four types of the determination pixels are associated with the information about incidence of the abnormal oblique incident light into the imaging element, and the abnormal oblique-incident-light detection unit ranks the at least four types of the determination pixels on the basis of the average values of the respective pixel data pieces corresponding to the at least four types of the determination pixels in the area, and detects abnormal oblique incident light, which is incident into the imaging element, with reference to the determination table.

According to the present aspect, it is possible to easily and accurately acquire information about incidence of abnormal oblique incident light from the ranks based on magnitudes of the average values of the respective pixel data pieces corresponding to the types of the determination pixels. As a result, it is possible to simplify the circuit or the memory necessary for detection of abnormal oblique incident light.

It is preferable that the plurality of pixels includes at least pixels having first color type color filters, pixels having second color type color filters, and pixels having third color type color filters, and the abnormal oblique-incident-light detection unit determines the at least four types of the determination pixels by setting color filters having a color type corresponding to the detected color type of the abnormal oblique incident light as color filters with the first color among the first color type color filters, the second color type color filters, and the third color type color filters.

According to the present aspect, it is possible to appropriately set determination pixels among the pixels having the first color type color filters, the pixels having the second color type color filters, and the pixels having the third color type color filters. For example, when the constituent pixels of the imaging element has RGB (red, green, and blue) color filters, it is possible to detect at least any one of red abnormal oblique incident light, green abnormal oblique incident light, and blue abnormal oblique incident light.

It is preferable that the abnormal oblique-incident-light detection unit determines that abnormal oblique incident light is incident into the imaging element, the abnormal oblique incident light having a color type corresponding to color filters having a color type indicating a largest value, among a value ($0<X\le1$) of X times an average value of the pixel data of the pixels having the first color type color filters, a value ($0<Y\le1$) of Y times an average value of the pixel data of the pixels having the second color type color filters, and a value ($0<Z\le1$) of Z times an average value of the pixel data of the pixels having the third color type color filters, in the area of the imaging element.

According to the present aspect, by appropriately setting X, Y, and Z, it is possible to preferentially detect abnormal oblique incident light having a desired color type.

It is preferable that the imaging device further includes correction unit correcting the pixel data of pixels having the photodiodes, in which the abnormal oblique incident light is detected, on the basis of a detection result of the abnormal oblique-incident-light detection unit.

According to the present aspect, it is possible to correct the pixel data of the pixels having photodiodes in which abnormal oblique incident light is detected, and it is possible to effectively eliminate the effect of the color mixture caused by abnormal oblique incident light. For example, there may be an area in which a small amount of abnormal oblique incident light is incident (weak incidence). However, the area in which the small amount of abnormal oblique incident light is incident may not be detected due to capability of an actually used device (some of the effect of abnormal oblique incident light may remain on a captured image). Even this case may be included in an applicable range of the present aspect.

The correction method using the correction unit is not particularly limited, and it is possible to adopt an arbitrary correction method which is effective to reduce and eliminate the effect of color mixture caused by abnormal oblique incident light. For example, it is possible to adopt a correction method of eliminating an amount of the color mixture caused by abnormal oblique incident light from the corresponding pixel data, or it is possible to adopt a correction method of eliminating pixel data disparities (level differences in pixel data) between the approximate same color pixels caused by abnormal oblique incident light.

It is preferable that the area is an area including all of the plurality of pixels of the imaging element.

According to the present aspect, the area, which includes all the constituent pixels of the imaging element, is set as a single "area". Consequently, when the average values of the respective pixel data pieces corresponding to the types of the determination pixels are calculated, the average values of the pixel data can be calculated from multiple pieces of pixel data. Hence, the accuracy in detection of abnormal oblique incident light is improved.

It is preferable that the area is each of a plurality of divided areas which are obtained by dividing the imaging element into a plurality of areas.

According to the present aspect, each area of the plurality of divided areas is set as an "area". Hence, it is possible to detect abnormal oblique incident light in a limited area, and it is possible to specify pixel areas affected by abnormal oblique incident light in detail.

It is preferable that the plurality of divided areas includes all of the plurality of pixels of the imaging element.

According to the present aspect, all the constituent pixels of the imaging element are divided among the divided areas. Hence, detection of abnormal oblique incident light can be accurately performed on all the constituent pixels of the imaging element.

It is preferable that, in the imaging element, a plurality of first divided areas is set, and a plurality of second divided areas, which are divided in a way different from that of the first divided areas, is set, the plurality of first divided areas and the plurality of second divided areas at least partially overlap, the plurality of pixels includes pixels some of which are classified as some of the first divided areas and are classified as some of the second divided areas, and the abnormal oblique-incident-light detection unit detects abnormal oblique incident light, which is incident into each of the first divided areas, on the basis of the average values of the respective pixel data pieces corresponding to the types of the determination pixels in each of the first divided areas, detects abnormal oblique incident light, which is incident into each of the second divided areas, on the basis of the average values of the respective pixel data pieces corresponding to the types of the determination pixels in each of the second divided areas, and detects abnormal oblique incident light, which is incident into each of areas where the respective first divided areas overlap with the respective second divided areas, on the basis of a detection result of the abnormal oblique incident light which is incident into each of the first divided areas and a detection result of the abnormal oblique incident light which is incident into each of the second divided areas.

According to the present aspect, in the overlap areas between the first divided areas and the second divided areas, it is possible to accurately detect abnormal oblique incident light. Thus, it is possible to further accurately specify the areas in which the color mixture such as ghosts is caused by abnormal oblique incident light.

It is preferable that each of the second divided areas overlaps with the two or more first divided areas.

According to the present aspect, each of the overlap areas between the first divided areas and the second divided areas are more restricted than each of the first divided areas and second divided areas. Hence, it is possible to detect abnormal oblique incident light in more specific areas.

It is preferable that each of the first divided areas and each of the second divided areas have the same shape and size, and the first divided areas and the second divided areas are set such that each first divided area deviates by a half of a size of the first divided area in at least one of the first direction and the second direction.

According to the present aspect, the overlap areas between the first divided areas and the second divided areas can be regularly disposed. Thus, it is possible to specify the pixel areas affected by abnormal oblique incident light in detail throughout a wide range.

It is preferable that the plurality of pixels includes a plurality of basic pixel array groups which have predetermined color filter array patterns and are arranged in the first direction and the second direction, and each of the plurality of basic pixel array groups includes at least one set of the at least four types of the determination pixel.

According to the present aspect, the determination pixels are periodically arranged, and it is possible to accurately calculate the average values of the respective pixel data pieces corresponding to the types of the determination pixels. Particularly, when each basic pixel array group includes a plurality of sets of the determination pixels, by combining the plurality of sets of the determination pixels, it is possible to increase the accuracy in detection of abnormal oblique incident light.

It is preferable that the at least four types of the determination pixels include first determination pixels, second determination pixels, third determination pixels, and fourth determination pixels, the first color pixel is adjacent to each first determination pixel in the positive direction of the first direction, and the pixels having color filters other than the color filter with the first color are adjacent to the first determination pixel in the negative direction of the first direction, the positive direction of the second direction, and the negative direction of the second direction, the first color pixel is adjacent to each second determination pixel in the negative direction of the first direction, and the pixels having color filters other than the color filter with the first color are adjacent to the second determination pixel in the positive direction of the first direction, the positive direction of the second direction, and the negative direction of the second direction, the first color pixel is adjacent to each third determination pixel in the positive direction of the second direction, and the pixels having color filters other than the color filter with the first color are adjacent to the third determination pixel in the positive direction of the first direction, the negative direction of the first direction, and the negative direction of the second direction, and the first color pixel is adjacent to each fourth determination pixel in the negative direction of the second direction, and the pixels having color filters other than the color filter with the first color are adjacent to the fourth determination pixel in the positive direction of the first direction, the negative direction of the first direction, and the positive direction of the second direction.

According to the present aspect, by using the determination pixels, it is possible to detect abnormal oblique incident light on the basis of the pixel data.

It is preferable that the at least four types of the determination pixels include first determination pixels, second determination pixels, third determination pixels, and fourth determination pixels, the first color pixels are adjacent to each first determination pixel in the positive direction of the first direction and the positive direction of the second direction, and the pixels having color filters other than the color filters with the first color are adjacent to the first determination pixel in the negative direction of the first direction and the negative direction of the second direction, the first color pixels are adjacent to each second determination pixel in the negative direction of the first direction and the positive direction of the second direction, and the pixels having color filters other than the color filters with the first color are adjacent to the second determination pixel in the positive direction of the first direction and the negative direction of the second direction, the first color pixels are adjacent to each third determination pixel in the positive direction of the first direction and the negative direction of the second direction, and the pixels having color filters other than the color filters with the first color are adjacent to the third determination pixel in the negative direction of the first direction and the positive direction of the second direction, and the first color pixels are adjacent to each fourth determination pixel in the negative direction of the first direction and the negative direction of the second direction, and the pixels having color filters other than the color filters with the first color are adjacent to the fourth determination pixel in the positive direction of the first direction and the positive direction of the second direction.

According to the present aspect, by using the determination pixels, it is possible to detect abnormal oblique incident light on the basis of the pixel data.

It is preferable that each color filter with the first color is any one of a red filter, a transparent filter, and a white filter.

According to the present aspect, it is possible to detect abnormal oblique incident light including a long-wavelength component which tends to cause the color mixture phenomenon.

It is preferable that each of the basic pixel array groups includes two first sub-pixel-array groups and two second sub-pixel-array groups each of which has a pixel array of 3×3 pixels in the first direction and the second direction, the first sub-pixel-array groups are adjacent to the second sub-pixel-array groups in the first direction and the second direction, and the second sub-pixel-array groups are adjacent to the first sub-pixel-array groups in the first direction and the second direction, each first sub-pixel-array group includes second color pixels which are disposed at a center and four corners and have color filters with a second color, the first color pixels which are disposed to be adjacent to the pixel at the center in the positive direction and the negative direction of the first direction, and third color pixels which are disposed to be adjacent to the pixel at the center in the positive direction and the negative direction of the second direction and have color filters with a third color, each second sub-pixel-array group includes the second color pixels which are disposed at a center and four corners, the first color pixels which are disposed to be adjacent to the pixel at the center in the positive direction and the negative direction of the second direction, and the third color pixels which are disposed to be adjacent to the pixel at the center in the positive direction and the negative direction of the first direction, and the determination pixels are constituted of two pixels, which are disposed in one diagonal direction, among the pixels disposed at the four corners of the first sub-pixel-array groups and two pixels, which are disposed in the other diagonal direction, among the pixels disposed at the four corners of the second sub-pixel-array groups.

According to the present aspect, even when the imaging element has a complex color filter array, it is possible to detect abnormal oblique incident light on the basis of the pixel data of the determination pixels.

According to another aspect of the present invention, there is provided an image processing device including abnormal oblique-incident-light detection unit detecting abnormal oblique incident light which is incident into an imaging element that has a plurality of pixels arranged in a first direction and a second direction perpendicular to the first direction, where each of the plurality of pixels has a color filter and a photodiode which receives light transmitted through the color filter and outputs pixel data, the plurality of pixels includes at least four types of determination pixels for which patterns of color filters of pixels adjacent in a positive direction and a negative direction of the first direction and pixels adjacent in a positive direction and a negative direction of the second direction are different from one another, at least one of pixels, which are adjacent to each determination pixel in the positive direction and the negative direction of the first direction, and pixels, which are adjacent to the determination pixel in the positive direction and the negative direction of the second direction, is a first color pixel that has a color filter with a first color, among the pixels which are adjacent to each determination pixel in the positive direction and the negative direction of the first direction and the pixels which are adjacent to the determination pixel in the positive direction and the negative direction of the second direction, a pixel, which is opposed to the first color pixel with the determination pixel interposed therebetween, has a color filter other than the color filter with the first color, and the abnormal oblique-incident-light detection unit detects abnormal oblique incident light, which is incident into the imaging element, on the basis of average values of the respective pixel data pieces corresponding to the types of the determination pixels in an area which is an area within the imaging element and includes types of a plurality of the determination pixels.

According to a further aspect of the present invention, there is provided an image processing method including detecting abnormal oblique incident light which is incident into an imaging element that has a plurality of pixels arranged in a first direction and a second direction perpendicular to the first direction, where each of the plurality of pixels has a color filter and a photodiode which receives light transmitted through the color filter and outputs pixel data, in which the plurality of pixels includes at least four types of determination pixels for which patterns of color filters of pixels adjacent in a positive direction and a negative direction of the first direction and pixels adjacent in a positive direction and a negative direction of the second direction are different from one another, in which at least one of pixels, which are adjacent to each determination pixel in the positive direction and the negative direction of the first direction, and pixels, which are adjacent to the determination pixel in the positive direction and the negative direction of the second direction, is a first color pixel that has a color filter with a first color, in which among the pixels which are adjacent to each determination pixel in the positive direction and the negative direction of the first direction and the pixels which are adjacent to the determination pixel in the positive direction and the negative direction of the second direction, a pixel, which is opposed to the first color pixel with the determination pixel interposed therebetween, has a color filter other than the color filter with the first color, and in which in the detecting of the abnormal oblique incident light, abnormal oblique incident light, which is incident into the imaging element, is detected on the basis of average values of the respective pixel data pieces corresponding to the types of the determination pixels in an area which is an area within the imaging element and includes types of a plurality of the determination pixels.

According to a still further aspect of the present invention, there is provided a non-transitory computer readable medium storing a program for causing a computer to execute detecting abnormal oblique incident light which is incident into an imaging element that has a plurality of pixels arranged in a first direction and a second direction perpendicular to the first direction, where each of the plurality of pixels has a color filter and a photodiode which receives light transmitted through the color filter and outputs pixel data, in which the plurality of pixels includes at least four types of determination pixels for which patterns of color filters of pixels adjacent in a positive direction and a negative direction of the first direction and pixels adjacent in a positive direction and a negative direction of the second direction are different from one another, in which at least one of pixels, which are adjacent to each determination pixel in the positive direction and the negative direction of the first direction, and pixels, which are adjacent to the determination pixel in the positive direction and the negative direction of the second direction, is a first color pixel that has a color filter with a first color, in which among the pixels which are adjacent to each determination pixel in the positive direction and the negative direction of the first direction and the pixels which are adjacent to the determination pixel in the positive direction and the negative direction of the second direction, a pixel, which is opposed to the first color pixel with the determination pixel interposed therebetween, has a color filter other than the color filter with the first color, and in which abnormal oblique incident light, which is incident into the imaging element, is detected on the basis of average values of the respective pixel data pieces corresponding to the types of the determination pixels in an area which is an area within the imaging element and includes types of a plurality of the determination pixels.

According to the aspects of the present invention, on the basis of the average values of the respective pixel data pieces corresponding to the types of the determination pixels in the area of the imaging element, it is possible to easily detect abnormal oblique incident light which is incident into the imaging element.

BRIEF DESCRIPTION OF THE DRAWINGS

FIGS. 2A and 2B are plan views illustrating an example of color filters (pixels) of an imaging element, where FIG. 2A shows a situation in which a total of four basic array patterns are arranged, and FIG. 2B is an enlarged view of the basic array pattern.

FIG. 4A shows an example in which a G pixel, an R pixel, and a G pixel are disposed to be adjacent, and FIG. 4B shows an example in which a G pixel, a B pixel, and a G pixel are disposed to be adjacent.

FIGS. 8A to 8D are diagrams illustrating examples of basic principles of methods of detecting abnormal oblique incident light, where FIGS. 8A to 8D show various arrangement patterns of G and R pixels.

FIG. 9 is a table illustrating a relationship between red abnormal oblique incident light and pixel data outputs of G pixels (determination pixels) having various arrangement patterns shown in FIGS. 8A to 8D.

FIGS. 11A to 11D are diagrams illustrating different examples of basic principles of methods of detecting abnormal oblique incident light, where FIGS. 11A to 11D show various arrangement patterns of G and R pixels.

FIG. 12 is a table illustrating a relationship between red abnormal oblique incident light and pixel data outputs of G pixels (determination pixels) having various arrangement patterns shown in FIG. 11.

FIG. 20 is an example of a determination table used in detection of abnormal oblique incident light which is incident into the imaging element of FIGS. 2A and 2B.

FIGS. 22A to 22D are diagrams illustrating examples of determination pixels used in detection of blue abnormal oblique incident light, and FIG. 22E to FIG. 22H are diagrams illustrating examples of determination pixels used in detection of green abnormal oblique incident light.

FIGS. 23A to 23C are diagrams illustrating examples in which the constituent pixels of the imaging element are divided between divided areas A and B overlapping with each other, where FIG. 23A is a plan view of the imaging element illustrating a situation in which the divided areas A and B are applied, FIG. 23B shows an example of area division of the divided areas A, and FIG. 23C shows an example of area division of the divided areas B.

DESCRIPTION OF THE PREFERRED EMBODIMENTS

Referring to drawings, embodiments of the present invention will be described.

Figure 1:
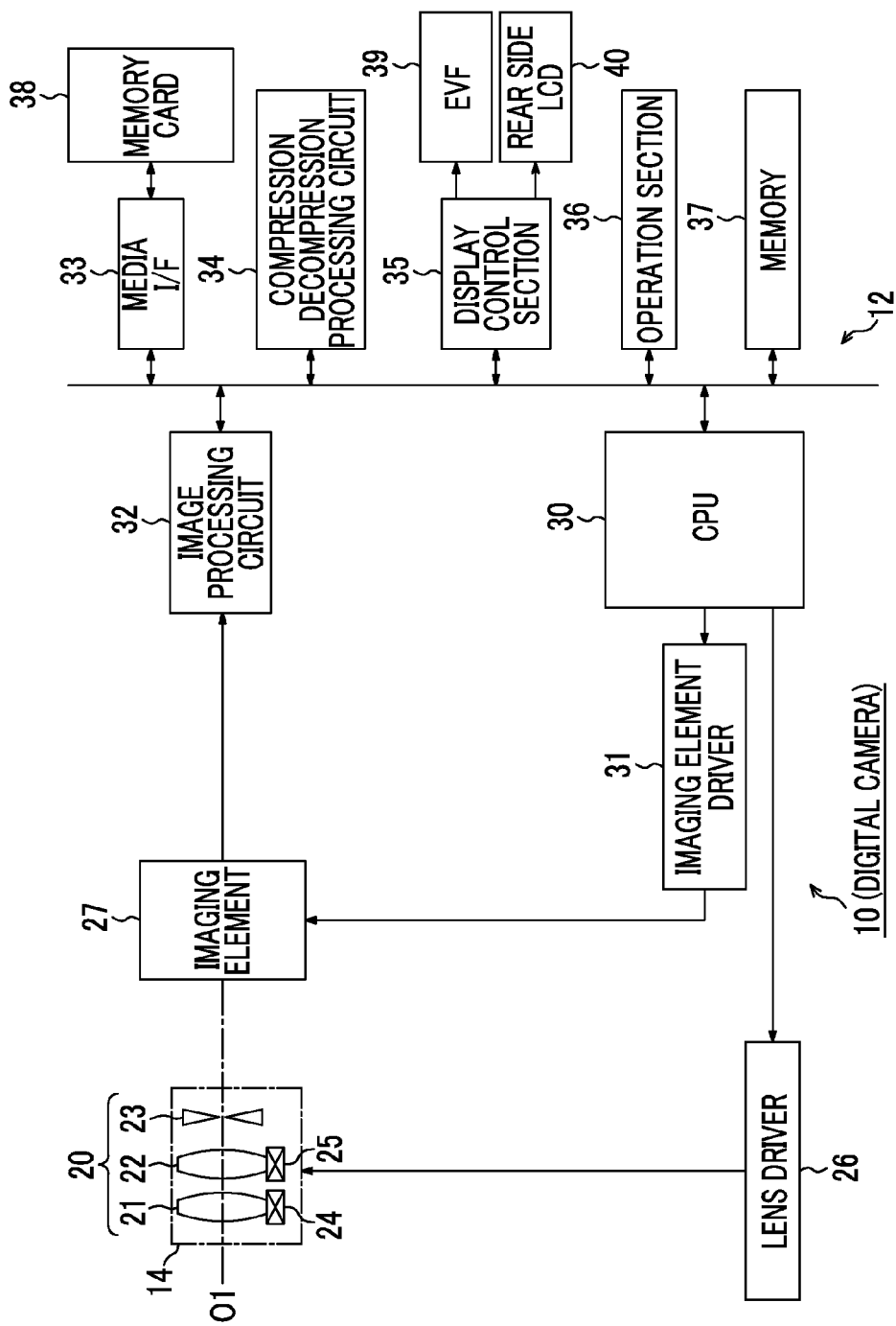
FIG. 1 is a block diagram illustrating one configuration example of a digital camera.

FIG. 1 is a block diagram illustrating one configuration example of a digital camera 10.

In the present example, in the configuration shown in FIG. 1, a description will be given of an example in which the respective sections other than a lens unit 14 and a lens driver 26 are provided in a camera main body 12. However, as necessary, the respective sections may be provided in the lens unit 14.

The digital camera (imaging device) 10 includes a camera main body 12, and a lens unit 14 which is mounted onto the front side of the camera main body 12 so as to be replaceable.

The lens unit 14 includes a photography optical system 20, and the photography optical system 20 includes a zoom lens 21, a focus lens 22, a mechanical shutter 23, and the like.

The zoom lens 21 and the focus lens 22 are respectively driven by a zoom mechanism 24 and a focus mechanism 25 so as to be movable along an optical axis 01 of the photography optical system 20. The zoom mechanism 24 and the focus mechanism 25 are formed of gears, motors, and the like.

The mechanical shutter 23 has a movable portion (not shown in the drawings) that is movable between a close position, at which light of a subject is prevented from being incident into the imaging element 27, and an open position at which the incidence of the light of the subject is permitted. By moving the movable portion to the open position or the close position, an optical path from the photography optical system 20 to the imaging element 27 is opened or closed. Further, the mechanical shutter 23 includes an aperture stop that controls a light amount of the light of the subject incident into the imaging element 27. The mechanical shutter 23, the zoom mechanism 24 and the focus mechanism 25 are driven and controlled by a CPU 30 with the aid of a lens driver 26.

The CPU 30, which is provided in the camera main body 12, integrally controls the respective sections of the digital camera 10 by sequentially executing various programs and various kinds of data which are read from a memory 37, on the basis of a control signal sent from an operation section 36. A RAM area of the memory 37 functions as a work memory for causing the CPU 30 to execute processing or a temporary storage of various kinds of data.

The operation section 36 includes buttons, keys, a touch panel, and the like which are operated by a user. For example, the operation section 36 may include a power supply switch, a shutter button, a focus mode switch lever, a focus ring, a mode switch button, a cross selection key, an execution key, a back button, and the like which are provided in the camera main body 12 and are operated by a user.

The imaging element 27 converts the light of the subject, which passes through the photography optical system 20 and the mechanical shutter 23, into an electrical output signal, and outputs the signal. The imaging element 27 has a single-plate-type pixel array in which multiple pixels are arranged in a horizontal direction (first direction) and a vertical direction (second direction) which is perpendicular to the horizontal direction, and may employ an arbitrary type such as a charge coupled device (CCD) or a complementary metal oxide semiconductor (CMOS). Hereinafter, a description will be given of an example in which a plurality of pixels constituting the imaging element 27 includes a CMOS.

The pixels constituting the imaging element 27 will be described later in detail. However, the pixels have microlenses for improving light collection efficiency, RGB color filters, and photodiodes (photoelectric conversion elements) which receive light transmitted through the microlenses and color filters and output pixel data.

An imaging element driver 31 drives and controls the imaging element 27 under control of the CPU 30, and outputs an imaging signal (image data) to an image processing circuit (image processing device) 32 from the pixels of the imaging element 27.

The image processing circuit 32 performs various kinds of image processing such as gray-level conversion, white balance correction, and y correction processing on the received imaging signal (image data), thereby generating captured image data. The image processing circuit 32 will be described later in detail. However, the image processing circuit 32 has a color mixture determination correction section that detects abnormal oblique incident light such as ghost light and performs correction processing.

When the shutter button is pressed down by a user, a compression decompression processing circuit 34 performs compression processing on the captured image data which is stored in the VRAM area of the memory 37. It should be noted that, in a RAW data acquisition mode, the compression processing does not have to be performed by the compression decompression processing circuit 34. Further, the compression decompression processing circuit 34 performs compression decompression processing on the compressed image data which is obtained from a memory card 38 through a media interface 33. The media interface 33 performs recording, reading, and the like of the captured image data on the memory card 38.

In a photography mode, a display control section 35 controls at least one of an EVF (electric viewfinder) 39 and a rear side LCD (rear side liquid crystal) 40 such that it displays a through-the-lens image (live view image) which is generated by the image processing circuit 32. Further, in an image reproduction mode, the display control section 35 outputs the captured image data, which is decompressed by the compression decompression processing circuit 34, to the rear side LCD 40 (and/or EVF 39).

In the digital camera 10 (camera main body 12), a processing circuit and the like other than the above-mentioned components may be provided. For example, an AF detection circuit for auto focus and an AE detection circuit for automatic exposure adjustment may be provided. The CPU 30 executes AF processing by driving the focus lens 22 through the lens driver 26 and the focus mechanism 25 on the basis of a detection result of the AF detection circuit, and executes AE processing by driving the mechanical shutter 23 through the lens driver 26 on the basis of a detection result of the AE detection circuit.

<Color Filter Array>

FIGS. 2A and 2B are plan views illustrating an example of color filters (pixels) of the imaging element 27, where FIG. 2A shows a situation in which a total of four basic array patterns (basic pixel array groups) P having predetermined color filter array patterns are arranged in the horizontal direction and the vertical direction, and FIG. 2B is an enlarged view of one of the basic array patterns P. In FIGS. 2A and 2B, "R" indicates a red filter (first color type color filter; R pixel), "G" (including G1 to G20) indicates a green filter (second color type color filter; G pixel), and "B" indicates a blue filter (third color type color filter; B pixel).

The color filters of the imaging element 27 of the present example have basic array patterns P each of which is a square array pattern corresponding to M×N (6×6) pixels. The plurality of basic array patterns P is repeatedly arranged in the horizontal direction and the vertical direction. With such a configuration, the plurality of pixels of the imaging element 27 is formed. Consequently, when image processing of RGB mosaic image data (RAW data) read from the imaging element 27 is intended to be performed, the processing can be performed in accordance with the repeated patterns which are based on the basic array patterns P.

In each basic array pattern P, first sub-arrays (first sub-pixel-array groups) and second sub-arrays (second sub-pixel-array groups) are configured to be arranged alternately in the horizontal and vertical directions. Each first sub-array has a pixel array of 3 pixels (horizontal direction)×3 pixels (vertical direction) shown in FIG. 2B. Each second sub-array has a pixel array of 3 pixels (horizontal direction)×3 pixels (vertical direction) shown in FIG. 2B. Consequently, the first sub-arrays are adjacent to the second sub-arrays in the horizontal direction and the vertical direction, and the second sub-arrays are adjacent to the first sub-arrays in the horizontal and vertical directions.

The first sub-array includes G pixels which are disposed at the center and the four corners, R pixels which are adjacent to the G pixel at the center in a positive direction and a negative direction (left and right directions in FIGS. 2A and 2B) of the horizontal direction, and B pixels which are disposed to be adjacent to the G pixel at the center in a positive direction and a negative direction (up and down directions in FIGS. 2A and 2B) of the vertical direction. On the other hand, the second sub-array includes G pixels which are disposed at the center and the four corners, R pixels which are adjacent to the G pixel at the center in a positive direction and a negative direction (up and down directions in FIGS. 2A and 2B) of the vertical direction, and B pixels which are disposed to be adjacent to the G pixel at the center in a positive direction and a negative direction (left and right directions in FIGS. 2A and 2B) of the horizontal direction. Consequently, relationships of positions of the R filters and the B filters are reversed between the first sub-array and the second sub-array, but arrangement of the G filters is the same.

The G filters at the four corners in the first sub-arrays and the second sub-arrays constitute a G filter group having a square array corresponding to 2 pixels (horizontal direction)×2 pixels (vertical direction) since the first sub-arrays and the second sub-arrays are alternately arranged in the horizontal direction and the vertical direction. That is, the G pixel group having a square array is constituted of two pixels, which are disposed in one diagonal direction, among the pixels disposed at the four corners of the first sub-arrays and two pixels, which are disposed in the other diagonal direction, among the pixels disposed at the four corners of the second sub-arrays. It should be noted that the G pixels included in the G pixel group having a square array can be used as "determination pixels for detecting abnormal oblique incident light" to be described later.

In this color filter array, generally one or more G filters, which correspond to a color (a G color in the present example) most contributing to a luminance signal, are arranged in each line of horizontal, vertical, diagonally right up, and diagonally left up directions of the color filter array. According to the color filter array, the G filters corresponding to luminance pixels are arranged in each line of the horizontal, vertical, and diagonal directions of the color filter array. Hence, accuracy in reproducibility of demosaic processing in a high-frequency area is improved regardless of a direction of high-frequency waves.

In addition, for example, when a unit color filter (unit pixel) is a square, diagonally right up and diagonally right down directions are directions at angles of 45° to the horizontal direction and the vertical direction. Further, when a unit color filter is a rectangle, diagonally right up and diagonally right down directions are diagonal directions of the rectangle. In accordance with lengths of long and short sides of the rectangle, it is possible to change angles in the diagonally right up and diagonally right down directions relative to the horizontal and vertical directions.

In the color filter array shown in FIGS. 2A and 2B, one or more filters of either the R filters or the B filters, which correspond to two or more different colors (R and B in the present example) other than the G color, are disposed in each line of the horizontal and vertical directions of each basic array pattern P. As described above, the R and B filters are arranged in each line of the horizontal and vertical directions of the color filter array. Thereby, it is possible to reduce occurrence of false colors (color moire), and it is possible to remove an optical lowpass filter for preventing false colors from occurring. It should be noted that, even in a case where the optical lowpass filter is disposed, when the color filter array of the present example is employed, by using a weak function which cuts off a high-frequency component for preventing false colors from occurring, loss in resolution may be prevented.

Further, in each basic array pattern P, the number of R pixels, the number of G pixels, and the number of B pixels corresponding to the R filters, the G filters, and the B filters are respectively 8 pixels, 20 pixels (refer to "G1" to "G20" of FIG. 2B), and 8 pixels. That is, a proportion of the number of R pixels, the number of G pixels, and the number of B pixels is set as 2:5:2, where a proportion of the number of G pixels most contributing to the luminance signal is higher than a proportion of the number of R and B pixels. As described above, the proportion of the number of G pixels is set to be different from the proportion of the number of R and B pixels, and particularly the proportion of the number of G pixels most contributing to the luminance signal is set to be larger than the proportion of the number of R and B pixels.

Thereby, it is possible to minimize aliasing in synchronization processing (demosaic processing), and it is also possible to improve high frequency reproducibility.

Hereinafter, the color filter array (pixel array) shown in FIGS. 2A and 2B are referred to as an "X-Trans (registered trademark)".

<Image Processing>

Figure 3:
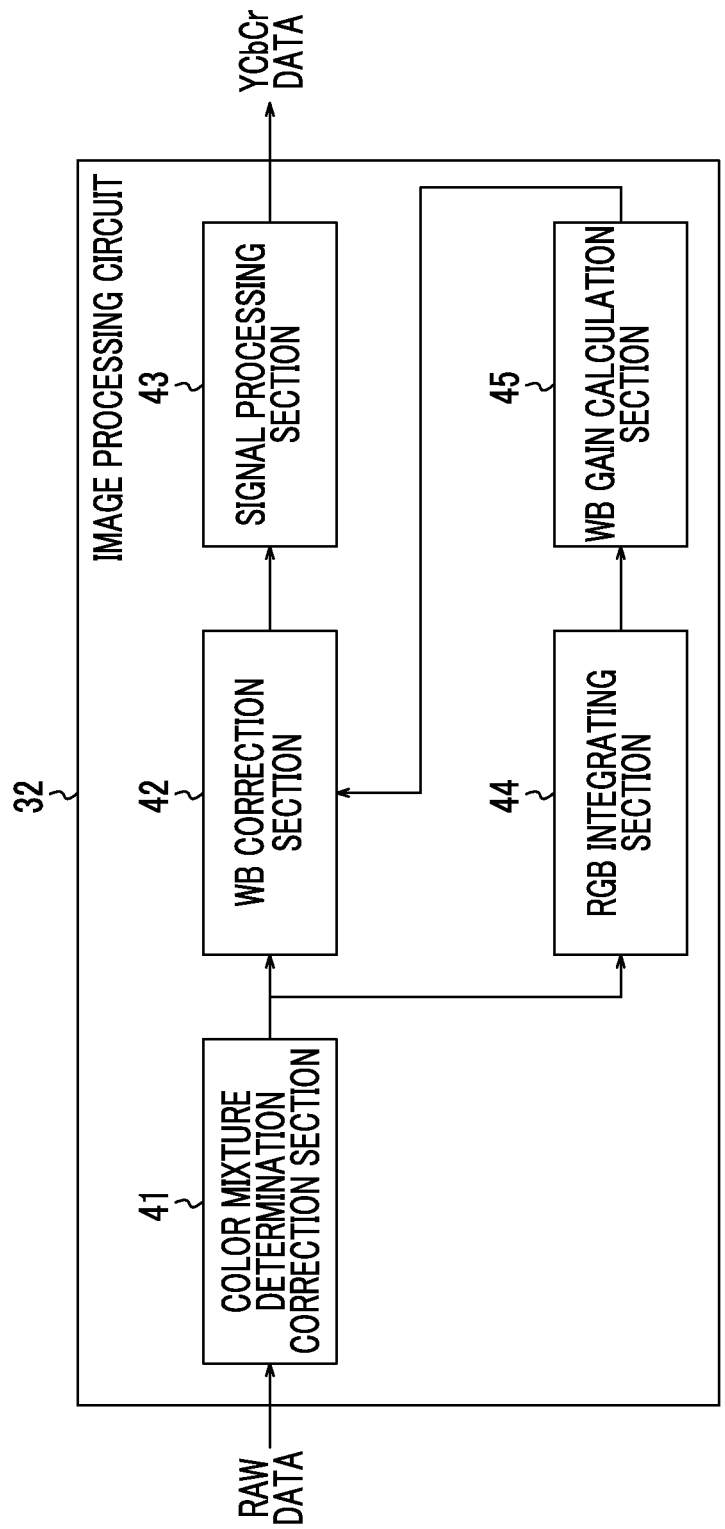
FIG. 3 is a functional block diagram of an image processing circuit.

FIG. 3 is a functional block diagram of the image processing circuit 32 (refer to FIG. 1).

The image processing circuit 32 includes: a color mixture determination correction section 41; a white balance correction section (WB correction section) 42; a signal processing section 43 that performs gamma correction, demosaic processing, and signal processing such as RGB/YC conversion; an RGB integrating section 44; and a white balance gain calculation section (WB gain calculation section) 45.

The mosaic image data (RAW data: RGB color signals) is input to the image processing circuit 32. The mosaic image data may be input directly from the imaging element 27 to the image processing circuit 32. Further, the mosaic image data, which is output from the imaging element 27, may be temporarily stored in the memory (the memory 37 of FIG. 1 and the like), and the mosaic image data may be input from the memory to the image processing circuit 32.

The mosaic image data, which is input to the image processing circuit 32, is input to the color mixture determination correction section 41. The color mixture determination correction section 41 detects abnormal oblique incident light on the basis of the input mosaic image data, and performs pixel data correction for reducing or eliminating the effect (the level differences in pixel data) of the color mixture phenomenon caused by abnormal oblique incident light.

The color signals of the pixels of the mosaic image, which is subjected to the pixel data correction by the color mixture determination correction section 41, are input to the WB correction section 42 and the RGB integrating section 44.

The RGB integrating section 44 calculates averages of integrated values of the respective RGB color signals for each of the divided areas which are obtained by dividing one screen into 8×8 parts, 16×16 parts, or the like, and calculates color information from proportions (R/G and B/G) of the averages of the integrated values of RGB. For example, in the case of dividing one screen into 8×8, 64 divided areas, the RGB integrating section 44 calculates 64 pieces of the color information (R/G and B/G).

The WB gain calculation section 45 calculates a WB gain on the basis of the color information (R/G and B/G) for each divided area which is input from the RGB integrating section 44. Specifically, the WB gain calculation section 45 calculates a barycentric position in distribution on a color space of coordinates on R/G and B/G axes based on the color information about each of the 64 divided areas, and estimates a color temperature of environmental light from the color information which is indicated by the barycentric position. In addition, instead of the color temperature, a type of a light source at the time of photography may be estimated (refer to JP2007-53499A), and the color temperature may be estimated from the estimated type of the light source. The type of the light source having the color information indicated by the barycentric position includes, for example, blue sky, shade, shining, fluorescent lamps (daylight color, daylight white, white, warm white), tungsten, low tungsten, and the like.

In the WB gain calculation section 45, the WB gain of each of RGB or RB for performing appropriate white balance correction is provided (stored and held) in advance in accordance with the color temperature or the light source type of the environmental light. The WB gain calculation section 45 reads the WB gain of each of corresponding RGB or RB on the basis of the color temperature or the light source type of the estimated environmental light, and outputs the read WB gain to the WB correction section 42.

The WB correction section 42 multiplies each of the color signals of R, C and B, which is input from the color mixture determination correction section 41, by the WB gain of each color which is input from the WB gain calculation section 45, thereby performing white balance correction.

The color signals of R, G and B, which are output from the WB correction section 42, are input to the signal processing section 43. The signal processing section 43 performs gamma correction, synchronization processing (demosaic processing), and signal processing, and outputs a luminance signal Y and color difference signals Cr and Cb subjected to the signal processing. The synchronization processing is processing that synchronously converts color signals of R, G and B by interpolating spatial deviation between the color signals of R, C and B according to the color filter array of the imaging element 27. The signal processing is processing such as RGB/YC conversion that converts the color signals of R, C and B subjected to demosaic processing into the luminance signal Y and the color difference signals Cr and Cb. In addition, when a RAW data output mode is selected by a user, the abovementioned demosaic processing and RGB/YC conversion processing may be skipped such that the RAW data (mosaic image data) is output from the image processing circuit 32.

The luminance data Y and the color difference data Cr and Cb, which are output from the image processing circuit 32, are subjected to compression processing, and are thereafter recorded in an internal memory (memory 37) or an external memory (memory card 38).

<Color Mixture Phenomenon Caused by Abnormal Oblique Incident Light>

Figure 4A:
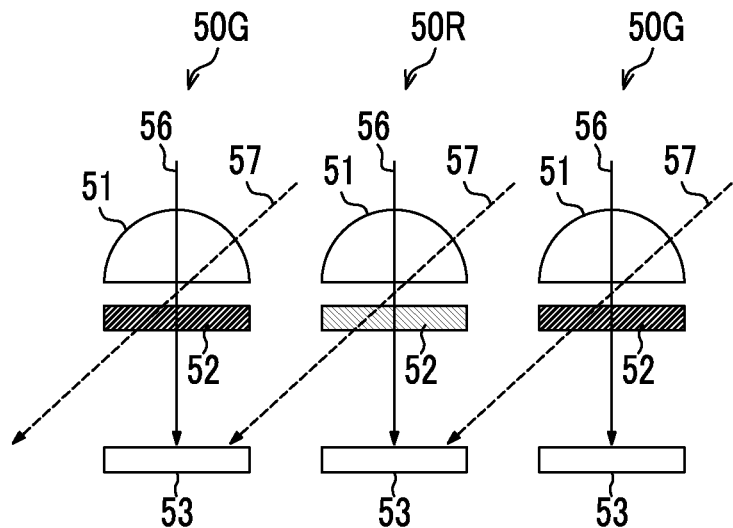
FIGS. 4A and 4B are schematic sectional views illustrating a mechanism of a color mixture phenomenon caused by abnormal oblique incident light, where
Figure 4B:
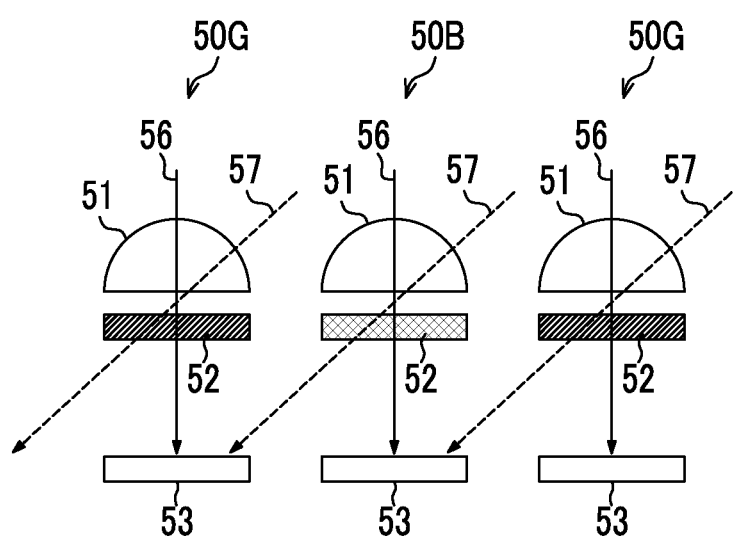

FIGS. 4A and 4B are schematic sectional views illustrating a mechanism of the color mixture phenomenon caused by abnormal oblique incident light (ghost light and the like), where FIG. 4A shows an example in which a G pixel, an R pixel, and a G pixel are disposed to be adjacent, and FIG. 4B shows an example in which a G pixel, a B pixel, and a G pixel are disposed to be adjacent.

A plurality of pixels 50 constituting the imaging element 27 of the present example includes G (green) pixels 50G having green color filters; R (red) pixels 50R having red color filters; and B (blue) pixels (third color pixels) 50B having blue color filters. A degree of contribution of the G pixel 50G to the luminance signal is higher than those of the R pixel 50R and the B pixel 50B. For example, the luminance data (luminance signal) Y can be obtained from the following expression.

$Y(\text{luminance data}) = (0.3 \times R \text{ pixel data} + 0.6 \times G \text{ pixel data} + 0.1 \times B \text{ pixel data})$ Each of G pixel 50C R pixel 50R, and B pixel 50B includes a microlens 51, a color filter 52, and a photodiode 53 which are sequentially provided in a travel direction of light of a subject, and outputs pixel data corresponding to an amount of light received in the photodiode 53. Normal light 56 constituting the light of the subject is collected by the microlenses 51, passes through the color filters 52, and is incident onto the photodiodes 53. The color filters 52, through which the normal light 56 passes, substantially correspond to the photodiodes 53 in which the normal light 56 is received.

Meanwhile, abnormal oblique incident light 57 enters into each pixel at an angle different from the normal light 56, and the abnormal oblique incident light 57, which passes through the color filter 52 of a certain pixel, is received by the photodiode 53 of a pixel adjacent thereto. As described above, the color filter 52, through which the abnormal oblique incident light 57 passes, does not perfectly correspond to the photodiode 53 in which the abnormal oblique incident light 57 is received. In addition, the photodiode 53, in which the abnormal oblique incident light 57 is received, outputs pixel data corresponding to amounts of not only the received normal light 56 but also the received abnormal oblique incident light 57. Accordingly, the pixel data, which is output from the photodiode 53 in which the abnormal oblique incident light 57 is received, increases more than the pixel data which is output from the photodiode 53 in which the abnormal oblique incident light 57 is not received. Hence, level differences in pixel data occur between the same color pixels.

Figure 5:
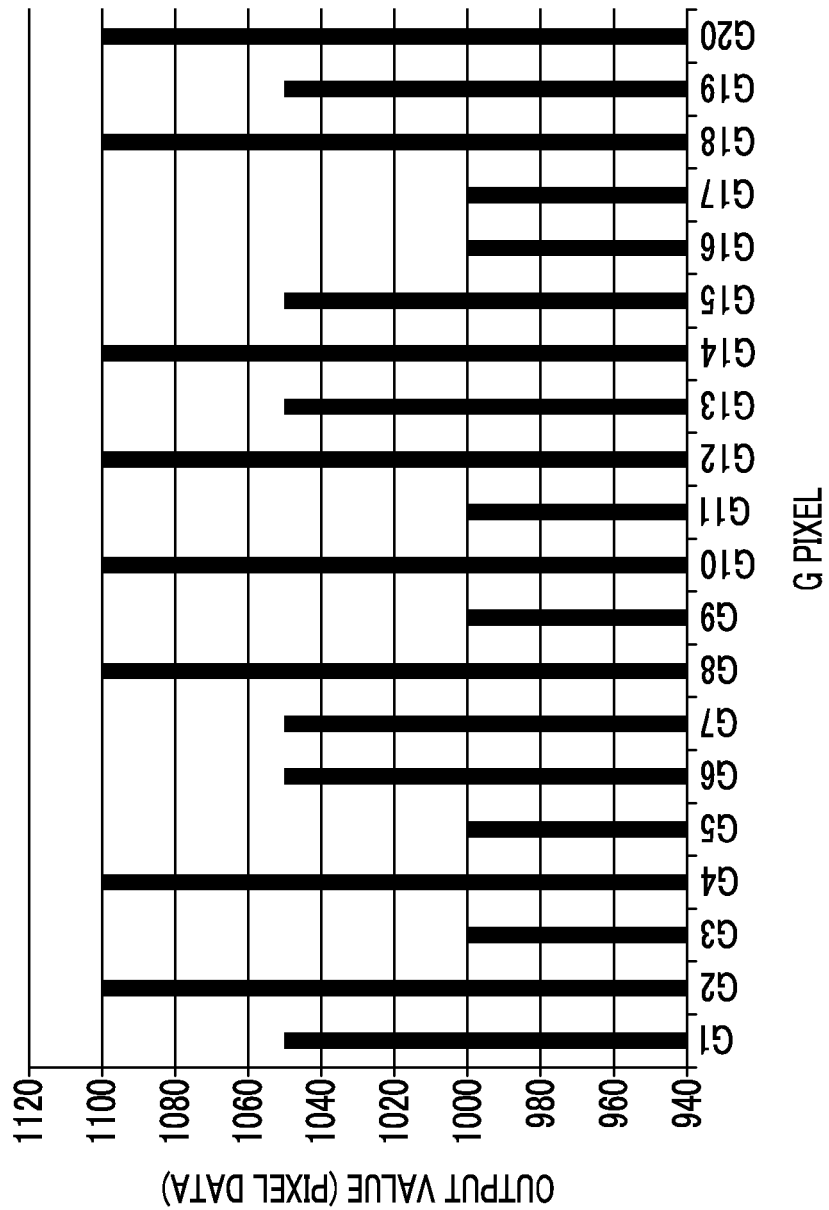
FIG. 5 is a graph illustrating an example of pixel data which is output from G pixels included in the basic array pattern when abnormal oblique incident light is incident into the imaging element of FIGS. 2A and 2B.

FIG. 5 is a graph illustrating an example of the pixel data which is output from the G pixels (G1 to G20) included in the basic array pattern P when abnormal oblique incident light is incident into the imaging element 27 of FIGS. 2A and 2B. The G pixels included in the basic array pattern P are disposed to be extremely close. Hence, originally most of pieces of the pixel data having equivalent values or approximate values are output. However, when abnormal oblique incident light is incident, differences (level differences in pixel data) in the output pixel data occur between the same color pixels (between G1 to G20 shown in FIG. 5).

The differences are caused since the amounts of received abnormal oblique incident light are different due to the color type of the adjacent pixel even between the same color pixels. That is, the amount of the received abnormal oblique incident light increases by an amount of abnormal oblique incident light which is transmitted through the color filter constituting the adjacent pixel. Hence, differences in output pixel data are caused in accordance with the type (pattern) of the adjacent pixel even between the same color pixels. Consequently, the incidence direction and presence or absence of incidence of the abnormal oblique incident light are accurately specified, and the pixels having the effect of color mixture caused by abnormal oblique incident light are appropriately specified. Thereby, it is possible to appropriately correct color mixture and accurately acquire the pixel data.

Figure 6:
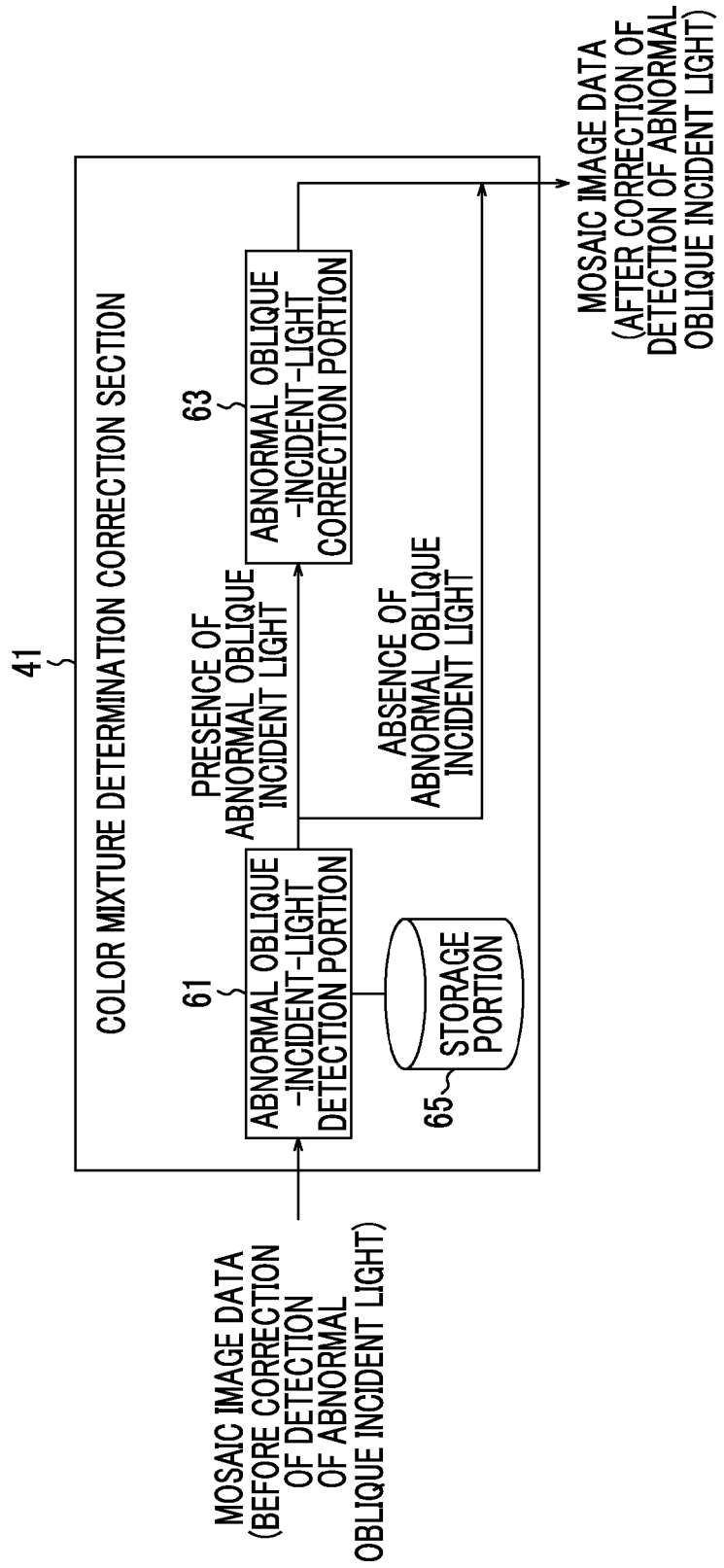
FIG. 6 is a block diagram illustrating a functional configuration of a color mixture determination correction section relating to detection of abnormal oblique incident light.

FIG. 6 is a block diagram illustrating a functional configuration of the color mixture determination correction section 41 of FIG. 3 relating to detection of abnormal oblique incident light.

The color mixture determination correction section 41 has an abnormal oblique-incident-light detection portion (abnormal oblique-incident-light detection unit) 61 that detects abnormal oblique incident light, and an abnormal oblique-incident-light correction portion (correction unit) 63 that corrects the mosaic image data on the basis of a detection result of the abnormal oblique-incident-light detection portion 61. The abnormal oblique-incident-light detection portion 61 is provided with a storage portion (storage unit) 65 that stores and holds various kinds of data used in the detection of abnormal oblique incident light.

The abnormal oblique-incident-light detection portion 61 detects abnormal oblique incident light, which is incident into the imaging element 27, on the basis of the mosaic image data (RAW data) which is input to the color mixture determination correction section 41. The abnormal oblique-incident-light detection portion 61 of the present example analyzes the pixel data (output values) of the determination pixels to be described later on the basis of the mosaic image data, thereby detecting the intensity, the incidence direction, and presence or absence of incidence of abnormal oblique incident light.

The abnormal oblique-incident-light correction portion 63 corrects the pixel data of the pixels 50 having the photodiodes 53 within the area in which abnormal oblique incident light is detected, on the basis of the detection result of the abnormal oblique-incident-light detection portion 61. That is, the abnormal oblique-incident-light correction portion 63 determines the pixels 50 having the photodiodes 53 in which the abnormal oblique incident light 57 is detected among the plurality of pixels 50 of the imaging element 27, on the basis of the incidence direction of abnormal oblique incident light detected by the abnormal oblique-incident-light detection portion 61, and corrects the pixel data of the determined pixels 50. In addition, if abnormal oblique incident light is not detected by the abnormal oblique-incident-light detection portion 61, correction processing in the abnormal oblique-incident-light correction portion 63 is skipped.

A specific method of correcting the pixel data in the abnormal oblique-incident-light correction portion 63 is not particularly limited, and it is possible to correct the pixel data of the pixels (correction target pixels) into which the abnormal oblique incident light 57 is incident, in accordance with an arbitrary method. For example, when there are a correction target pixel and ambient pixels (for example, pixels included in an area of the basic array pattern P including the correction target pixel) thereof, a representative value, which is derived from the pixel data of the correction target pixel and the pixels with the same color, is replaced with that of the pixel data of the correction target pixel, whereby it is possible to correct the pixel data. The representative value may be an average value or a weighted average value of the pixel data of the correction target pixel and the ambient pixels, and may be a median or a mode value of the pixel data of the correction target pixel and the ambient pixels. Alternatively, the representative value may be pixel data of a pixel which has the same color as the correction target pixel and is least affected by abnormal oblique incident light in the basic array pattern P.

Further, the abnormal oblique-incident-light correction portion 63 is able to correct the pixel data of the pixel (correction target pixel) into which the abnormal oblique incident light 57 is incident, by applying a predetermined filter to the correction target pixel. The predetermined filter used in the abnormal oblique-incident light correction portion 63 is not particularly limited. For example, a filter (median filter), which minimizes the level differences in the pixel data between the correction target pixel and the ambient same color pixels, may be employed.

Figure 7:
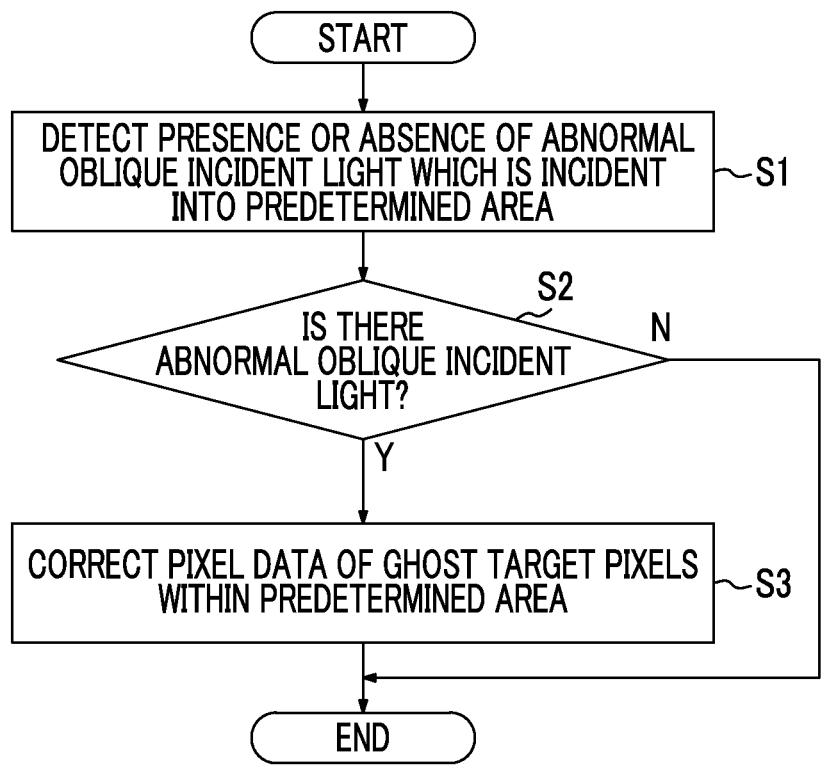
FIG. 7 shows an example of a flowchart relating to color mixture correction and detection of abnormal oblique incident light.
Figures 10A, 10B, 10C, 10D:
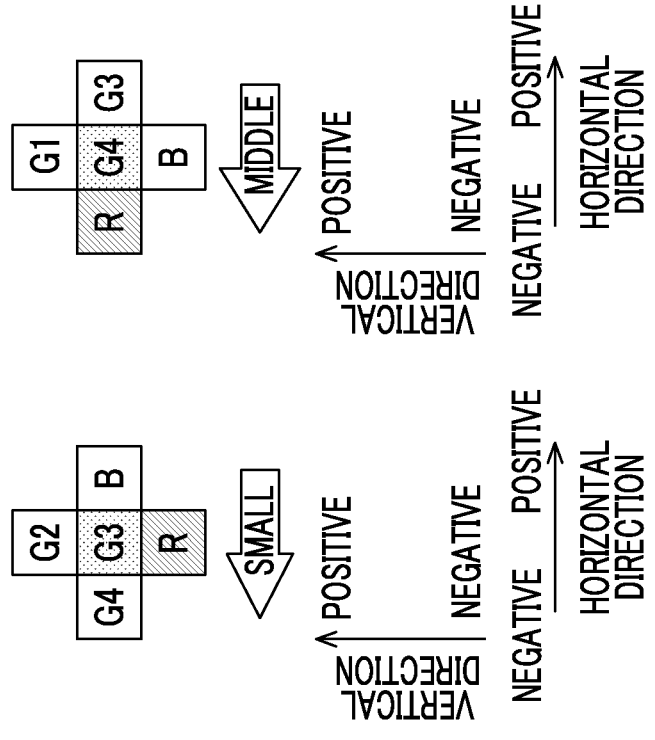
FIGS. 10A to 10D show diagrams illustrating magnitudes of the effects of red abnormal oblique incident light of the determination pixels in a case where red abnormal oblique incident light is incident from the positive direction side of the horizontal direction toward the negative direction side thereof.

FIG. 7 shows an example of a flowchart relating to color mixture correction and detection of abnormal oblique incident light.

In the image processing method shown in FIG. 7, first, the intensity, the incidence direction, and presence or absence of abnormal oblique incident light in the area of the imaging element 27 is detected (S1: abnormal oblique-incident-light detection step of FIG. 7). If incidence of abnormal oblique incident light is detected (Y in S2), the pixels 50 having photodiodes 53, in which abnormal oblique incident light is detected among a plurality of pixels within the area, are determined on the basis of the incidence direction of the detected abnormal oblique incident light, and the pixel data of the determined pixels 50 is corrected (S3). In contrast, if abnormal oblique incident light is not detected (N in S2), correction processing in the abnormal oblique-incident-light correction portion 63 is skipped.

A specific method of correcting color mixture and a specific method of detecting abnormal oblique incident light in the abnormal oblique-incident-light detection portion 61 and the abnormal oblique-incident-light correction portion 63 are determined on the basis of the pixel array (color filter array) of the colors of the imaging element 27. Hereinafter, referring to an example of an array of color filters in the imaging element 27, a specific method of detecting abnormal oblique incident light will be described.

<Detection of Abnormal Oblique Incident Light>

FIGS. 8A to 8D are diagrams illustrating examples of basic principles of methods of detecting abnormal oblique incident light, where FIGS. 8A to 8D show various arrangement patterns of G and R pixels. In FIGS. 8A to 8D, G1 to G4 respectively indicate the G pixels, R indicates the R pixel, and A indicates a pixel other than the R pixel (the G pixel or the B pixel in the pixel array shown in FIGS. 2A and 2B).

In the present example, a description will be given of a case of using the G pixel (second color pixel) having the G filter (color filter with the second color) as the determination pixel and detecting whether or not abnormal oblique incident light (red abnormal oblique incident light) passing through the R filter (color filter with the first color) of the R pixel (first color pixel) is incident. In addition, also in a case where a pixel other than the G pixel receives abnormal oblique incident light passing through a color filter other than the R filter, the mechanism is the same.

The imaging element 27 has at least four types of the determination pixels (same color pixels) G1 to G4 for which color filter patterns of pixels adjacent thereto in the positive and negative directions of the horizontal direction and pixels adjacent thereto in the positive and negative directions of the vertical direction are different from one another. At least one of pixels, which are adjacent to each of the determination pixels G1 to G4 in the positive and negative directions of the horizontal direction, and pixels, which are adjacent to the determination pixel in the positive and negative directions of the vertical direction, has an R filter.

In the examples shown in FIGS. 8A to 8D, the following pixels are used as the determination pixels: "the pixel G1 (third determination pixel) to which the R pixel is adjacent in the positive direction of the vertical direction, and the pixels having color filters other than the R filter are adjacent in the positive direction of the horizontal direction, the negative direction of the horizontal direction, and the negative direction of the vertical direction"; "the pixel G2 (first determination pixel) to which the R pixel is adjacent in the positive direction of the horizontal direction, and the pixels having color filters other than the R filter are adjacent in the negative direction of the horizontal direction, the positive direction of the vertical direction, and the negative direction of the vertical direction"; "the pixel G3 (fourth determination pixel) to which the R pixel is adjacent in the negative direction of the vertical direction, and the pixels having color filters other than the R filter are adjacent in the positive direction of the horizontal direction, the negative direction of the horizontal direction, and the positive direction of the vertical direction"; and "the pixel G4 (second determination pixel) to which the R pixel is adjacent in the negative direction of the horizontal direction, and the pixels having color filters other than the R filter are adjacent in the positive direction of the horizontal direction, the positive direction of the vertical direction, and the negative direction of the vertical direction.

In addition, among the pixels which are adjacent to each of the determination pixels G1 to G4 in the positive direction and the negative direction of the horizontal direction and the pixels which are adjacent thereto in the positive direction and the negative direction of the vertical direction, a pixel, which is opposed to the R pixel with each of the determination pixels G1 to G4 interposed therebetween, has a color filter other than the R filter.

If these determination pixels G1 to G4 are disposed to be close (for example, disposed in the basic array pattern P), depending on whether or not abnormal oblique incident light is present, the characteristics of the output values of the determination pixels G1 to G4 change. That is, if abnormal oblique incident light is not incident into the determination pixels G1 to G4, the pixel data pieces (output values) of the determination pixels G1 to G4 are highly likely to be equivalent or approximate. However, if red abnormal oblique incident light is incident into the determination pixels G1 to G4, in accordance with an incidence direction of the red abnormal oblique incident light, the pixel data of the determination pixels G1 to G4 changes.

For example, if there is red abnormal oblique incident light that travels from the positive direction side of the vertical direction toward the negative direction side thereof, the pixel data of the determination pixel G1 (refer to FIG. 8A) becomes greater than the pixel data of the other determination pixels G2 to G4 (refer to FIG. 9). Likewise, if there is red abnormal oblique incident light that travels from the positive direction side of the horizontal direction toward the negative direction side thereof, the pixel data of the determination pixel G2 (refer to FIG. 8B) becomes relatively greater than the others. If there is red abnormal oblique incident light that travels from the negative direction side of the vertical direction toward the positive direction side thereof, the pixel data of the determination pixel G3 (refer to FIG. 8C) becomes relatively greater than the others. If there is red abnormal oblique incident light that travels from the negative direction side of the horizontal direction toward the positive direction side thereof, the pixel data of the determination pixel G4 (refer to FIG. 8D) becomes relatively greater than the others.

As shown in FIG. 9, the abnormal oblique-incident-light detection portion 61 is able to detect the intensity, the incidence direction, and presence or absence of abnormal oblique incident light on the basis of a relationship of magnitudes of the pixel data of the determination pixels G1 to G4. Hereinafter, the intensity, the incidence direction, and presence or absence of abnormal oblique incident light are referred to as "conditions of abnormal oblique incident light".

In addition, the above mentioned example of FIG. 9 (and an example of FIG. 12 to be described later) shows only a relationship of relative magnitudes of the pixel data of the determination pixels G1 to G4. However, a specific relationship of magnitudes of the pixel data of the determination pixels G1 to G4 is affected by the color type of the adjacent pixel on the incidence side of abnormal oblique incident light.

FIGS. 10A to 10D show diagrams illustrating magnitudes of the effects of red abnormal oblique incident light of the determination pixels G1 to G4 in a case where red abnormal oblique incident light is incident from the positive direction side of the horizontal direction toward the negative direction side thereof. "Large", "middle", and "small" noted in the arrows under the diagrams of FIGS. 10A to 10D indicate the magnitudes of the effects of the red abnormal oblique incident light.

As the color filter characteristics, the B and G filters do not perfectly cut off red light, and actually pass a part of the red light. In particular, a transmittance of red light to the G filter is lower than a transmittance of red light to the R filter, and is higher than a transmittance of red light to the B filter. Consequently, if red abnormal oblique incident light is incident from the positive direction side of the horizontal direction toward the negative direction side thereof, "the determination pixel G2 (refer to FIG. 10B) to which the R pixel is adjacent in the positive direction of the horizontal direction" is most affected, "the determination pixels G1 (refer to FIG. 10A) and G4 (refer to FIG. 10D) to which the G pixel is adjacent in the positive direction of the horizontal direction" is somewhat affected, and "the determination pixel G3 (refer to FIG. 10C) to which the B pixel is adjacent in the positive direction of the horizontal direction" is least affected.

In addition, in image data of a subject image, in a case where there are originally pixel data differences between the determination pixels G1 to G4 in the basic array pattern P (for example, if there are various shapes or edges (image borderline portions) of the subject image), even if there is no abnormal oblique incident light, the pixel data, of which values are greatly different, is output from the determination pixels G1 to G4. However, if there is no abnormal oblique incident light, the average values of "the pixel data (various-type pixel data for determination) of the types of the determination pixels G1 to G4", which are included in an area (for example, an area including approximately 100 or more basic array patterns P) of the imaging element 27, converge to an average value of all the same color pixels (G pixels) regardless of the subject image, and the average values are statistically approximate to one another. On the other hand, in the area in which abnormal oblique incident light is incident, regarding the average value of all the same color pixels, a degree of the effect of abnormal oblique incident light is measured as a level difference.

Accordingly, in view of characteristics of the output values of the determination pixels G1 to G4, the abnormal oblique-incident-light detection portion 61 detects conditions of abnormal oblique incident light incident into the imaging element 27, on the basis of the average values of the respective pixel data pieces corresponding to the types of the determination pixels G1 to G4 in the area of the imaging element 27.

FIGS. 11A to 11D are diagrams illustrating different examples of basic principles of methods of detecting abnormal oblique incident light, where FIGS. 11A to 11D show various arrangement patterns of G and R pixels. In FIGS. 11A to 11D, G1 to G4 indicate each of the G pixels, R indicates the R pixel, and A indicates a pixel other than the R pixel.

Two of pixels, which are adjacent to each of the determination pixels G1 to G4 of the present example in the positive and negative directions of the horizontal direction, and pixels, which are adjacent to the determination pixel in the positive and negative directions of the vertical direction, have the R filters. That is, as the determination pixel, the following pixel may be used: "the pixel G1 (first determination pixel) to which the R pixels are adjacent in the positive direction of the horizontal direction and the positive direction of the vertical direction, and the pixels having color filters other than the R filters are adjacent in the negative direction of the horizontal direction and the negative direction of the vertical direction"; "the pixel G2 (second determination pixel) to which the R pixels are adjacent in the negative direction of the horizontal direction and the positive direction of the vertical direction, and the pixels having color filters other than the R filters are adjacent in the positive direction of the horizontal direction and the negative direction of the vertical direction"; "the pixel G3 (third determination pixel) to which the R pixels are adjacent in the positive direction of the horizontal direction and the negative direction of the vertical direction, and the pixels having color filters other than the R filters are adjacent in the negative direction of the horizontal direction and the positive direction of the vertical direction"; and "the pixel G4 (fourth determination pixel) to which the R pixels are adjacent in the negative direction of the horizontal direction and the negative direction of the vertical direction, and the pixels having color filters other than the R filters are adjacent in the positive direction of the horizontal direction and the positive direction of the vertical direction".

In the determination pixels G1 to G4 shown in FIGS. 11A to 11D, if there is red abnormal oblique incident light that travels from the positive direction side of the vertical direction toward the negative direction side thereof, the pixel data of the determination pixel G1 (refer to FIG. 11A) and the determination pixel G2 (refer to FIG. 11B) becomes greater than the pixel data of the other determination pixels G3 and G4 (refer to FIG. 12). Likewise, if there is red abnormal oblique incident light that travels from the positive direction side of the horizontal direction toward the negative direction side thereof, the pixel data of the determination pixel G1 (refer to FIG. 11A) and the determination pixel G3 (refer to FIG. 11C) becomes relatively greater than the others. If there is red abnormal oblique incident light that travels from the negative direction side of the vertical direction toward the positive direction side thereof, the pixel data of the determination pixel G3 (refer to FIG. 11C) and the determination pixel G4 (refer to FIG. 11D) becomes relatively greater than the others. If there is red abnormal oblique incident light that travels from the negative direction side of the horizontal direction toward the positive direction side thereof, the pixel data of the determination pixel G2 (refer to FIG. 11B) and the determination pixel G4 (refer to FIG. 11D) becomes relatively greater than the others.

As described above, even in the determination pixels G1 to G4 to which the plurality of R pixels (pixels corresponding to the color type of the abnormal oblique incident light as a detection target) are adjacent, it is possible to detect the conditions of abnormal oblique incident light on the basis of the relationship of the pixel data of the determination pixels G1 to G4.

Next, a description will be given of a specific example of the method of detecting abnormal oblique incident light which is incident into the imaging element 27 (X-Trans array) of FIGS. 2A and 2B. In addition, the present example will describe an exemplary case of detecting whether or not red abnormal oblique incident light is incident.

Figure 13:
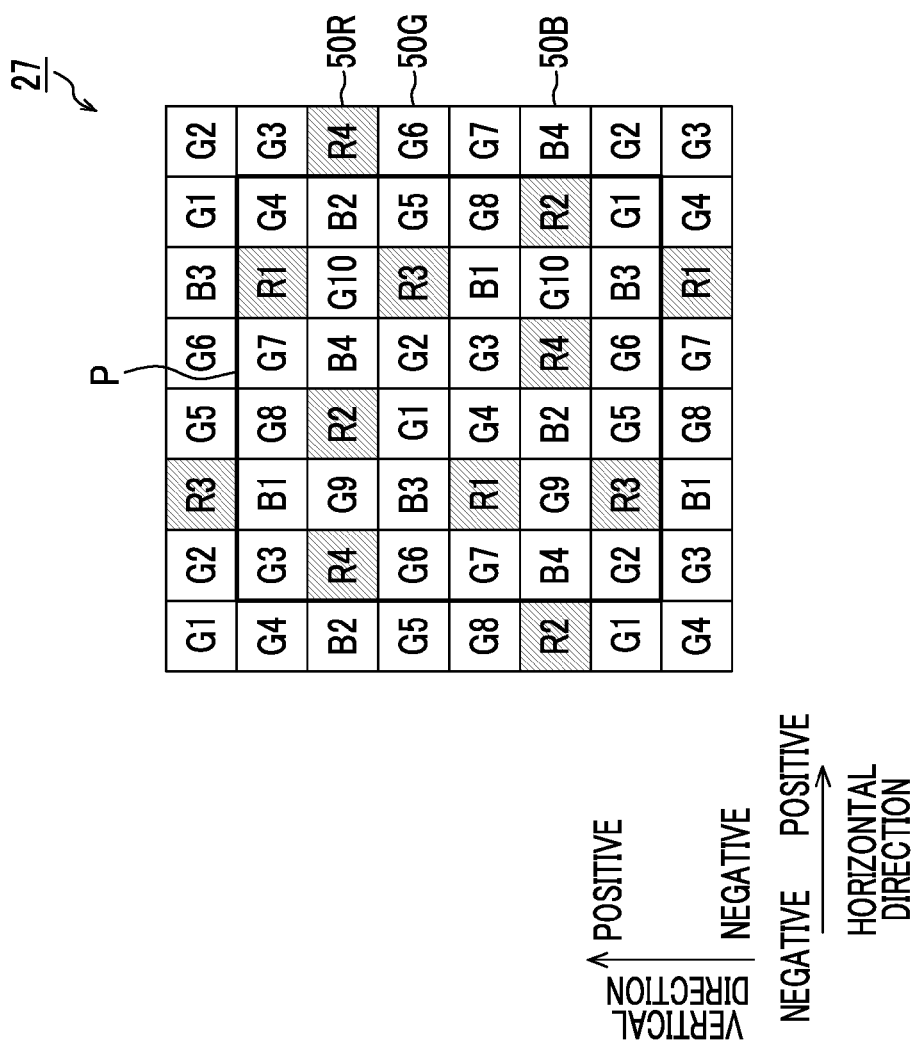
FIG. 13 shows a plan view of the basic array pattern of FIGS. 2A and 2B in which an arrangement pattern of G and R pixels is highlighted.

FIG. 13 shows a plan view of the basic array pattern P of FIGS. 2A and 2B in which an arrangement pattern of G and R pixels is highlighted.

G pixels 50G included in the imaging element 27 of the present example include 10 types of G pixels (G1 to G10) for which color filter patterns of pixels adjacent thereto in the positive and negative directions of the horizontal direction and pixels adjacent thereto in the positive and negative directions of the vertical direction are different from one another.

In FIG. 13, the R pixels are disposed to be adjacent to the G1 pixels in the positive direction of the vertical direction, the R pixels are disposed to be adjacent to the G2 pixels in the positive direction of the horizontal direction, the R pixels are disposed to be adjacent to the G3 pixels in the negative direction of the vertical direction, and the R pixels are disposed to be adjacent to the G4 pixels in the negative direction of the horizontal direction. Further, the R pixels are disposed to be adjacent to the G5 pixels in the negative direction of the horizontal direction, the R pixels are disposed to be adjacent to the G6 pixels in the positive direction of the vertical direction, the R pixels are disposed to be adjacent to the G7 pixels in the positive direction of the horizontal direction, and the R pixels are disposed to be adjacent to the G8 pixels in the negative direction of the vertical direction. "The G1 pixels and the G6 pixels", "the G2 pixels and the G7 pixels", "the G3 pixels and the G8 pixels" and "the G4 pixels and the G5 pixels" each are commonly disposed to be adjacent to the R pixels. However, arrangement patterns of the color filters of adjacent pixels other than the R pixels are different therebetween.

Further, the types of the G pixels in the present example include not only the G1 to G8 pixels but also "the G9 pixels to which the R pixels are adjacent in both the positive direction and the negative direction of the horizontal direction and the B pixel are adjacent in both the positive direction and the negative direction of the vertical direction" and "the G10 pixels to which the B pixels are adjacent in both the positive direction and the negative direction of the horizontal direction and the R pixel are adjacent in both the positive direction and the negative direction of the vertical direction".

As described above, examples of conditions of the determination pixel include: "a condition where the color filter patterns of pixels adjacent to the determination pixel in the positive and negative directions of the horizontal direction and pixels adjacent thereto in the positive and negative directions of the vertical direction are different from one another"; "a condition where at least one of the pixels which are adjacent to the determination pixel in the positive and negative directions of the horizontal direction and the pixels which are adjacent thereto in the positive and negative directions of the vertical direction, has the R filter (the color filter corresponding to the color type of abnormal oblique incident light as a detection target)"; and "a condition where among the pixels which are adjacent to each determination pixel in the positive and negative directions of the horizontal direction and the pixels which are adjacent thereto in the positive and negative directions of the vertical direction, a pixel, which is opposed to the R pixel with the determination pixel interposed therebetween, has a color filter other than R filter". The G1 to G4 pixels shown in FIG. 13 satisfy such conditions, and are thus appropriately used as the determination pixels of the present example.

In addition, for example, the G5 to G8 pixels also satisfy the conditions, and can be therefore used as the determination pixels, instead of G1 to G4 pixels or in combination with the G1 to G4 pixels. That is, each basic array pattern P of the imaging element 27 of the present example includes two sets of the determination pixels, and not only the "G1 to G4 pixels" but also the "G5 to G8 pixels" can be used as the determination pixels. Consequently, it is also possible to improve the accuracy in detection by combining a detection result of the conditions of abnormal oblique incident light detected by the sets of the determination pixels of the "G5 to G8 pixels" with a detection result of the conditions of abnormal oblique incident light detected by the sets of the determination pixels of the "G1 to G4 pixels".

Further, the B1 to B4 pixels shown in FIG. 13 also satisfy the conditions, and can be therefore used as the determination pixels, instead of G1 to G8 pixels or in combination with the G1 to G8 pixels. Likewise, in detection of abnormal oblique incident light with a color type other than that of red abnormal oblique incident light, it is also possible to use a pixel other than the G pixel as the determination pixel. For example, the R1 to R4 pixels shown in FIG. 13 satisfy the conditions relative to the B pixels, and can be therefore used as the determination pixels for detection of blue abnormal oblique incident light.

The abnormal oblique-incident-light detection portion 61 uses the G1 to G4 pixels among the G pixels shown in FIG. 13 as the determination pixels so as to detect the conditions of abnormal oblique incident light in the area of the imaging element 27 on the basis of the average values of the respective pixel data pieces corresponding to the types of the G1 to G4 pixels in the area of the imaging element 27.

Figure 14:
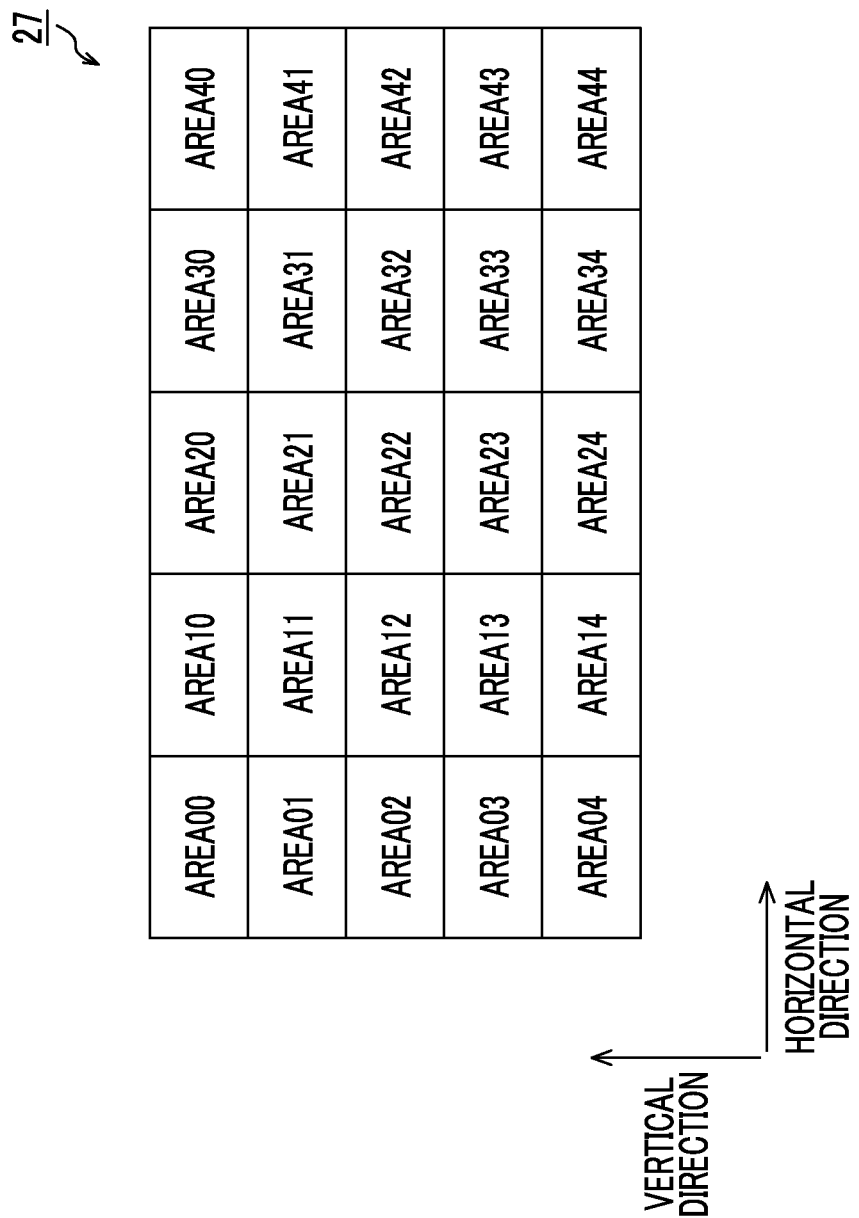
FIG. 14 is a schematic diagram illustrating an example of area division of the imaging element.

FIG. 14 is a schematic diagram illustrating an example of area division of the imaging element 27. In FIG. 14, the imaging element 27 is divided by "5 divisions in the horizontal direction" and "5 divisions in the vertical direction" (a total of 25 divisions). For example, if the number of pixels of the imaging element 27 is 4900 pixels (horizontal direction)× 3265 pixels (vertical direction), each of the divided areas (areas 00 to 44) shown in FIG. 14 is constituted of a number of 980 pixels (horizontal direction)×653 pixels (vertical direction).

The abnormal oblique-incident-light detection portion 61 calculates an average value of the pixel data (output values) of the G1 pixels, an average value of the pixel data of the G2 pixels, an average value of the pixel data of the G3 pixels, and an average value of the pixel data of the G4 pixels which are included in the area, for each area, and is thus able to detect the conditions of red abnormal oblique incident light in each area on the basis of the relationship of magnitudes of the average values (refer to FIGS. 8 and 9). As described above, according to the example shown in FIG. 14, locations, at which color mixture caused by abnormal oblique incident light such as ghost light, can be specified at an accuracy based on 25 divisions.

Next, a specific example of the method of detecting abnormal oblique incident light in the abnormal oblique-incident-light detection portion 61 will be described.

<Example 1 of Detection of Abnormal Oblique Incident Light>

Figure 15:
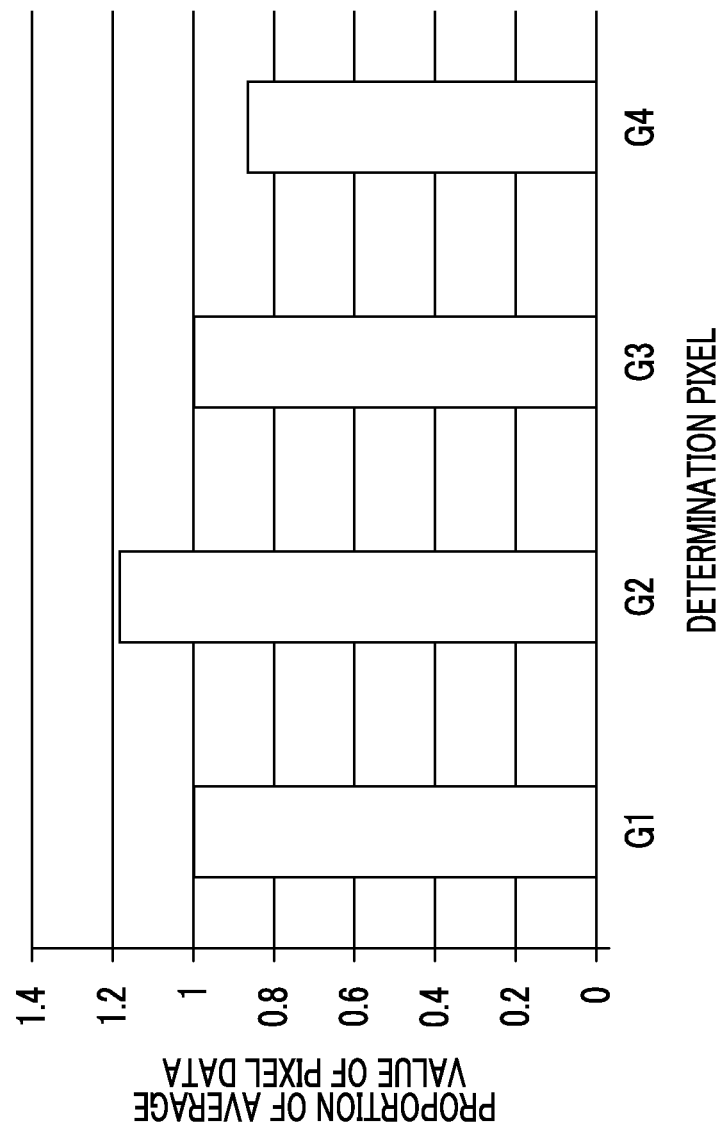
FIG. 15 is a graph illustrating an example of a method of detecting an intensity, an incidence direction, and presence or absence of red abnormal oblique incident light using the pixel data of the determination pixels.

FIG. 15 is a diagram illustrating an example of a method of detecting the conditions of red abnormal oblique incident light using the pixel data of the determination pixels G1 to G4. In FIG. 15, the horizontal axis indicates the determination pixels G1 to G4, and the vertical axis indicates proportions of the average values of the pixel data of the determination pixels G1 to G4. Regarding the vertical axis of FIG. 15, all the average values of the pixel data of the determination pixels G1 to G4 in the areas of the imaging element 27 are set as "pixel data average values", and "1" in the vertical axis indicates that the average values of the respective pixel data pieces corresponding to the types of the determination pixels are equal to the pixel data average value.

In the example shown in FIG. 15, the average values of the respective pixel data pieces corresponding to the types of the determination pixels G1 and G3 are equal to the pixel data average value, the average value of the pixel data corresponding to the type of the determination pixel G2 are greater than the pixel data average value, and the average value of the pixel data corresponding to the type of the determination pixel G4 is less than the pixel data average value. Consequently, in a case where red abnormal oblique incident light is incident into the area and the pixel data of the determination pixels G1 to G4 in this area is as shown in the example of FIG. 15, it can be determined that, in this area, red abnormal oblique incident light is incident "from the positive direction side of the horizontal direction toward the negative direction side thereof" (refer to FIGS. 8 and 9).

As described above, according to the present example, it is possible to detect the conditions of abnormal oblique incident light on the basis of the pixel data values of the determination pixels in the area, particularly on the basis of the proportion of "the average value of the pixel data values of the types of the determination pixels" to "the average values of the pixel data values of all the determination pixels".

In addition, the abnormal oblique-incident-light detection portion 61 is able to detect abnormal oblique incident light, which is incident into the imaging element 27, on the basis of the average values with reference to a determination table which is stored in a storage portion 65 (refer to FIG. 6). For example, in the determination table, "the data patterns of the average values (such as the proportion) of the respective pixel data pieces corresponding to the types of the determination pixels" are associated with "the intensity, the incidence direction, and presence or absence of abnormal oblique incident light (the conditions of abnormal oblique incident light)". Then, the abnormal oblique-incident-light detection portion 61 is able to acquire "the conditions of abnormal oblique incident light" from "the data patterns of the average values of the respective pixel data pieces corresponding to the types of the determination pixels" which are actually acquired, with reference to the determination table. It is not always necessary to perform precise cross-checking of "the average values of the respective pixel data pieces corresponding to the types of the determination pixels" on the determination table. If a pattern thereof is similar to the pattern of "the average values of the respective pixel data pieces corresponding to the types of the determination pixels" prescribed in the determination table, "the corresponding conditions of abnormal oblique incident light" prescribed in the determination table may be acquired.

<Example 2 of Detection of Abnormal Oblique Incident Light>

Figure 16:
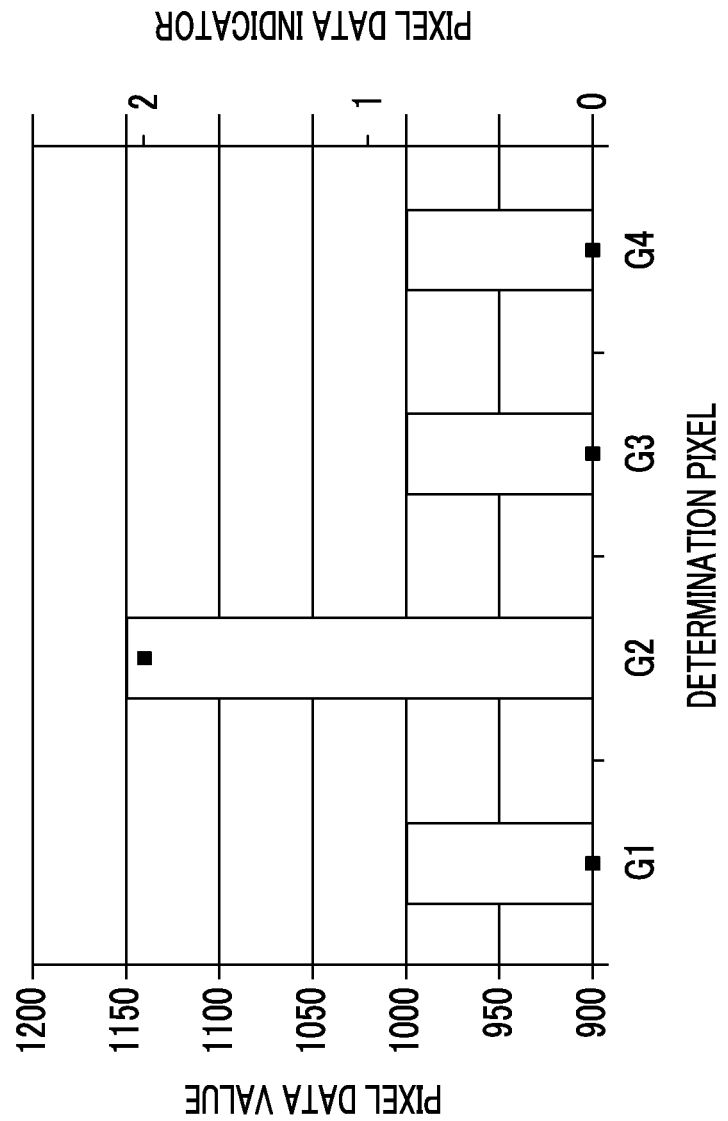
FIG. 16 is a graph illustrating another example of a method of detecting the intensity, the incidence direction, and presence or absence of red abnormal oblique incident light using the pixel data of the determination pixels.

FIG. 16 is a diagram illustrating another example of the method of detecting the conditions of red abnormal oblique incident light using the pixel data of the determination pixels G1 to G4. In FIG. 16, the horizontal axis indicates the determination pixels G1 to G4, and the vertical axes indicate the pixel data values (left side vertical axis) and pixel data indicators (right side vertical axis) of the determination pixels G1 to G4.

Regarding a relationship between "the determination pixels and the pixel data values", in FIG. 16, the average values of the respective pixel data pieces corresponding to the types of the G1 to G4 pixels in the area of the imaging element 27 are noted as "pixel data values".

Further, regarding a relationship between "the determination pixels and the pixel data indicators", in FIG. 16, any one of "0", "1", and "2" can be assigned as the pixel data indicator to each of the determination pixels, in accordance with the magnitudes of the average values of the respective pixel data pieces corresponding to the types of the G1 to G4 pixels in the area of the imaging element 27. For example, if the average value of the pixel data is large, "2" is assigned. If the average value of the pixel data is small, "0" is assigned. If the average value of the pixel data is in the middle between both values, "1" is assigned. It should be noted that, as the pixel data indicators, numerical values in an arbitrary range can be used, and not only the numerical values in the range of "0" to "2" but also for example "−2" to "+2" (−2, −1, 0, +1, and +2) may be used as the pixel data indicators.

The assignment of the pixel data indicators can be performed in an arbitrary method. For example, the following method may be adopted. If "the average value of the pixel data corresponding to each type of the determination pixels in the area" is in a range of ±5% of "the average value (average value of the sum of the average values of the respective pixel data pieces corresponding to the types of the determination pixels) of the pixel data of all the determination pixels G1 to G4 in the area of the imaging element 27", "1" is assigned. If "the average value of the pixel data corresponding to each type of the determination pixels in the area" is greater than the range, "2" is assigned. If "the average value of the pixel data corresponding to each type of the determination pixels in the area" is smaller than the range, "0" is assigned. Further, the pixel data indicator may be assigned to each determination pixel with reference to "a median of the average values of the respective pixel data pieces corresponding to the types of the determination pixels in the area", instead of the above-mentioned "average value of the sum of the average values of the respective pixel data pieces corresponding to the types of the determination pixels in the area".

In the example show in FIG. 16, the pixel data indicator of "0" is assigned to the determination pixels G1, G3, and G4, and the pixel data indicator of "2" is assigned to the determination pixel G2.

Then, the abnormal oblique-incident-light detection portion 61 detects abnormal oblique incident light, which is incident into the imaging element 27, with reference to the determination table. This determination table is stored in the storage portion 65 (refer to FIG. 6), and is read from the storage portion 65 by the abnormal oblique-incident-light detection portion 61. In the determination table, information about incidence of abnormal oblique incident light incident into the imaging element 27 is associated with patterns based on the average values of the respective pixel data pieces corresponding to the types of the determination pixels G1 to G4 in the area. More specifically, in the determination table, "the intensity, the incidence direction, and presence or absence of abnormal oblique incident light incident into the area" are associated with the data patterns of "the pixel data indicators indicating the proportions of the respective pixel data pieces corresponding to the types of the determination pixels G1 to G4" based on "the average value of the sum of the average values of the respective pixel data pieces corresponding to the types of the determination pixels G1 to G4". It should be noted that a specific example of the determination table of the present example will be described later (refer to FIG. 20).

For each area of the imaging element 27, the abnormal oblique-incident-light detection portion 61 calculates "the average values of the respective pixel data pieces corresponding to the types of the determination pixels G1 to G4" and "the average value of the sum of the average values of the respective pixel data pieces corresponding to the types of the determination pixels G1 to G4", and calculates the pixel data indicators of the determination pixels G1 to G4 from the calculation results. Then, the abnormal oblique-incident-light detection portion 61 cross-checks the data pattern of the pixel data indicators calculated as described above with the determination table which is read from the storage portion 65, and acquires corresponding information about incidence of abnormal oblique incident light (the intensity, the incidence direction, and presence or absence of abnormal oblique incident light).

<Example 3 of Detection of Abnormal Oblique Incident Light>

Figure 17:
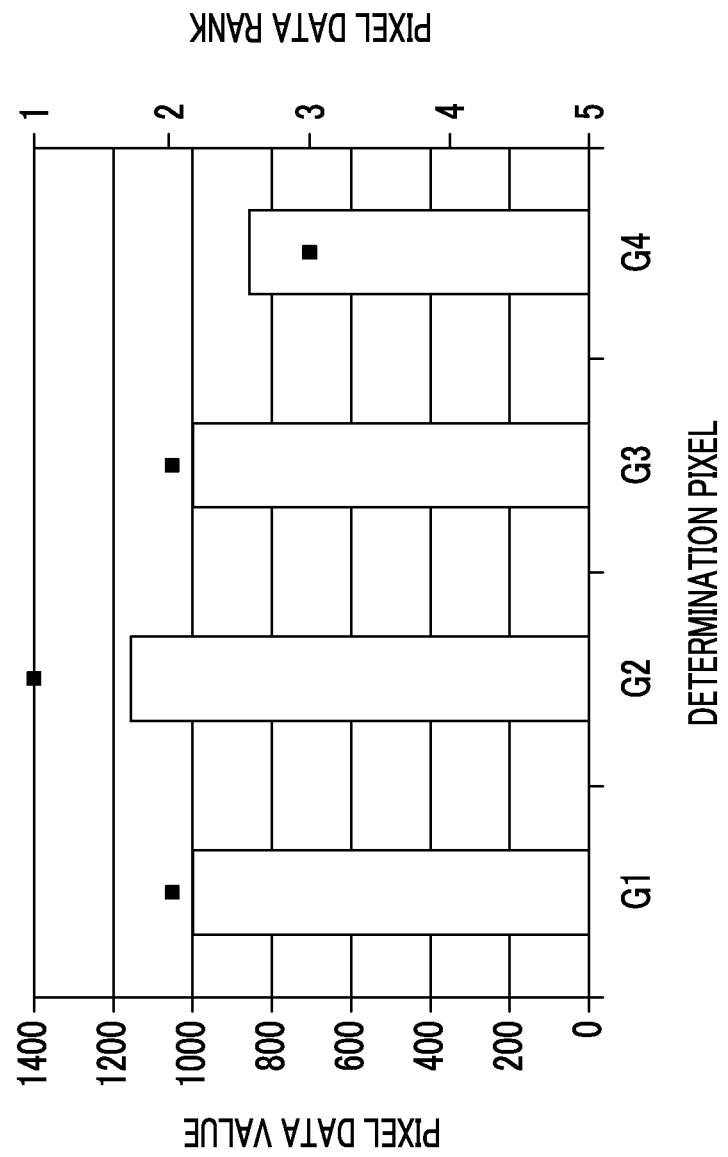
FIG. 17 is a graph illustrating another example of a method of detecting the intensity, the incidence direction, and presence or absence of red abnormal oblique incident light using the pixel data of the determination pixels.

FIG. 17 is a diagram illustrating another example of the method of detecting the conditions of red abnormal oblique incident light using the pixel data of the determination pixels G1 to G4. In FIG. 17, the horizontal axis indicates the determination pixels G1 to G4, and the vertical axes indicate the pixel data values (left side vertical axis) and pixel data ranks (right side vertical axis) of the determination pixels G1 to G4.

Regarding a relationship between "the determination pixels and the pixel data values", in FIG. 17, the average values of the respective pixel data pieces corresponding to the types of the G1 to G4 pixels in the area of the imaging element 27 are noted as "pixel data values".

Further, regarding a relationship between "the determination pixels and the pixel data ranks", in FIG. 17, the ranks based on the magnitudes of the average values of the respective pixel data pieces corresponding to the types of the determination pixels in the area of the imaging element 27 are assigned to the respective determination pixels.

In the example shown in FIG. 17, the pixel data rank of "1" is assigned to the determination pixel G2, the pixel data rank of "2" is assigned to the determination pixels G1 and G3, and the pixel data rank of "3" is assigned to the determination pixel G4.

The abnormal oblique-incident-light detection portion 61 of the present example detects abnormal oblique incident light, which is incident into the imaging element 27, with reference to a determination table which is stored in a storage portion 65 (refer to FIG. 6). In this determination table, the ranks based on magnitudes of the average values of the respective pixel data pieces corresponding to the types of the determination pixels are associated with the information about incidence of abnormal oblique incident light incident into the imaging element 27.

For each area of the imaging element 27, the abnormal oblique-incident-light detection portion 61 calculates "the average values of the respective pixel data pieces corresponding to the types of the determination pixels G1 to G4", and assigns the ranks (pixel data ranks) to the determination pixels G1 to G4 on the basis of magnitudes of the calculated values. At this time, the abnormal oblique-incident-light detection portion 61 may perform the assignment of the pixel data ranks after sorting "the average values of the respective pixel data pieces corresponding to the types of the determination pixels G1 to G4" in accordance with the magnitudes thereof. Then, the abnormal oblique-incident-light detection portion 61 cross-checks the data pattern of the calculated pixel data ranks with the determination table which is read from the storage portion 65, and acquires corresponding information about incidence of abnormal oblique incident light (the intensity, the incidence direction, and presence or absence of abnormal oblique incident light).

Next, a functional configuration of the abnormal oblique-incident-light detection portion 61 will be described.

Figure 18:
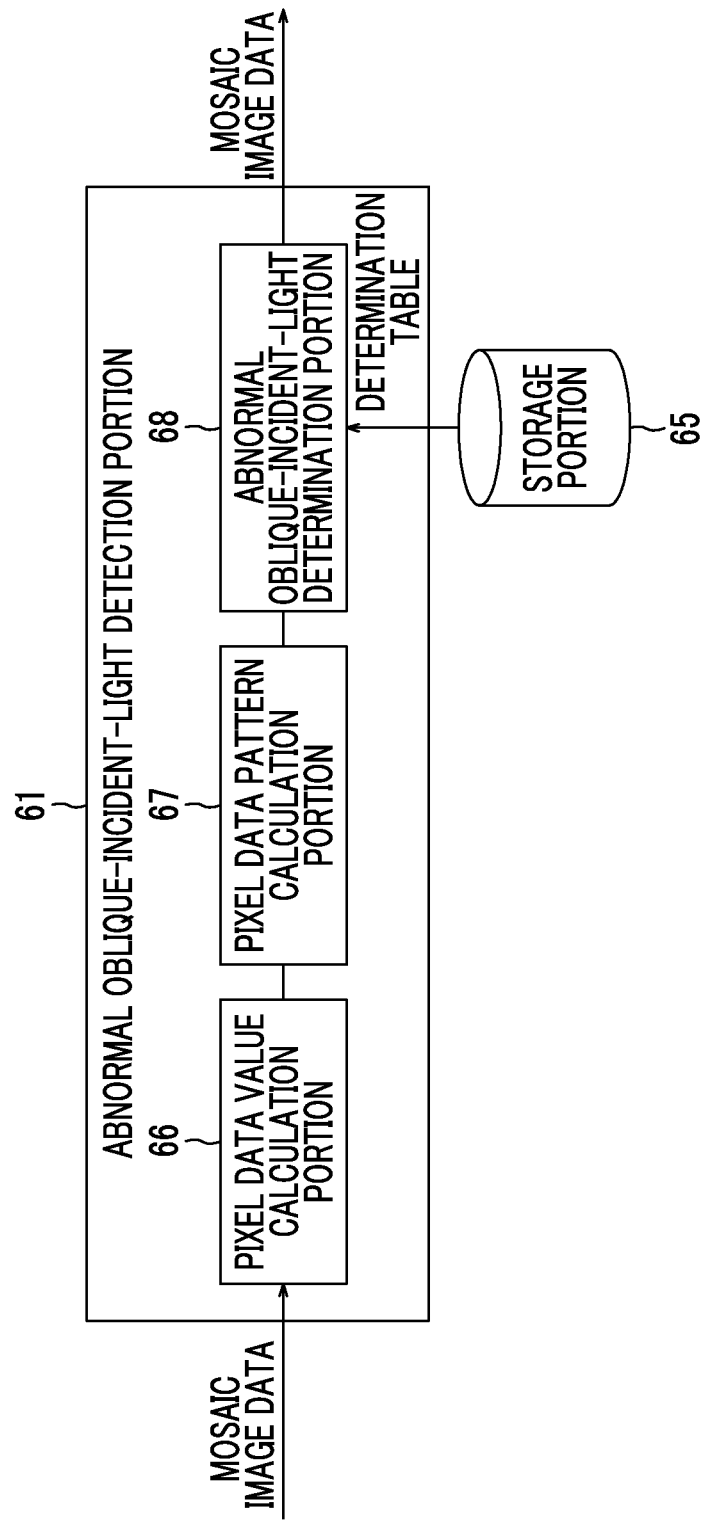
FIG. 18 is a block diagram illustrating an example of a functional configuration of an abnormal oblique-incident-light detection portion.

FIG. 18 is a block diagram illustrating an example of a functional configuration of an abnormal oblique-incident-light detection portion 61. The abnormal oblique-incident-light detection portion 61 has a pixel data value calculation portion 66, a pixel data pattern calculation portion 67, and an abnormal oblique-incident-light determination portion 68.

The pixel data value calculation portion 66 determines the determination pixels to be used in detection of abnormal oblique incident light on the basis of the input mosaic image data (RAW data), and calculates the average values of the respective pixel data pieces corresponding to the types of the determined determination pixels for each divided area (refer to FIG. 14) of the imaging element 27.

The pixel data pattern calculation portion 67 calculates the data pattern of the respective pixel data pieces corresponding to the types of the determination pixels for each divided area of the imaging element 27. For example, in a case of adopting the above-mentioned "Example 1 of detection of abnormal oblique incident light (refer to FIG. 15)", the pixel data pattern calculation portion 67 calculates and acquires "the proportions of the average values of the pixel data values of the determination pixels". Further, in a case of adopting the above-mentioned "Example 2 of detection of abnormal oblique incident light (refer to FIG. 16)", the pixel data pattern calculation portion 67 calculates and acquires the relationship between "the determination pixels and the pixel data indicators". Furthermore, in a case of adopting the above-mentioned "Example 3 of detection of abnormal oblique incident light (refer to FIG. 17)", the pixel data pattern calculation portion 67 calculates and acquires the relationship between "the determination pixels and the pixel data ranks".

The abnormal oblique-incident-light determination portion 68 detects abnormal oblique incident light, which is incident into the imaging element 27, on the basis of "the data patterns of the respective pixel data pieces corresponding to the types of the determination pixels" calculated by the pixel data pattern calculation portion 67 with reference to the determination table which is stored in the storage portion 65. For example, in the case of adopting the above-mentioned "Example 1 of detection of abnormal oblique incident light (refer to FIG. 15)", "the proportions of the average values of the pixel data values of the determination pixels" and the information about the conditions of abnormal oblique incident light are prescribed in the determination table. The abnormal oblique-incident-light determination portion 68 cross-checks "the proportions of the average values of the pixel data values of the determination pixels", which are calculated and acquired by the pixel data pattern calculation portion 67, with the determination table, and acquires the information about the conditions of abnormal oblique incident light. Further, in the case of adopting the above-mentioned "Example 2 of detection of abnormal oblique incident light (refer to FIG. 16)", the relationship between "the determination pixels and the pixel data indicators" and the information about the conditions of abnormal oblique incident light are prescribed in the determination table. The abnormal oblique-incident-light determination portion 68 cross-checks the relationship between "the determination pixels and the pixel data indicators", which are calculated and acquired by the pixel data pattern calculation portion 67, with the determination table, and acquires the information about the conditions of abnormal oblique incident light. Furthermore, in the case of adopting the above-mentioned "Example 3 of detection of abnormal oblique incident light (refer to FIG. 17)", the relationship between "the determination pixels and the pixel data ranks" and the information about the conditions of abnormal oblique incident light are prescribed in the determination table. The abnormal oblique-incident-light determination portion 68 cross-checks the relationship between "the determination pixels and the pixel data ranks", which are calculated and acquired by the pixel data pattern calculation portion 67, with the determination table, and acquires the information about the conditions of abnormal oblique incident light.

As described above, by using the determination table that prescribes the output patterns of the pixel data of the determination pixels G1 to G4 and the conditions of abnormal oblique incident light, it is possible to easily detect abnormal oblique incident light.

<Determination of Color Type of Abnormal Oblique Incident Light>

In the above-mentioned example, mostly "red abnormal oblique incident light passing through the R filter of the adjacent R pixel" was described. However, the above-mentioned method of detecting abnormal oblique incident light is applicable to abnormal oblique incident light with a wavelength corresponding to a color other than a red (R) color.

Figure 19:
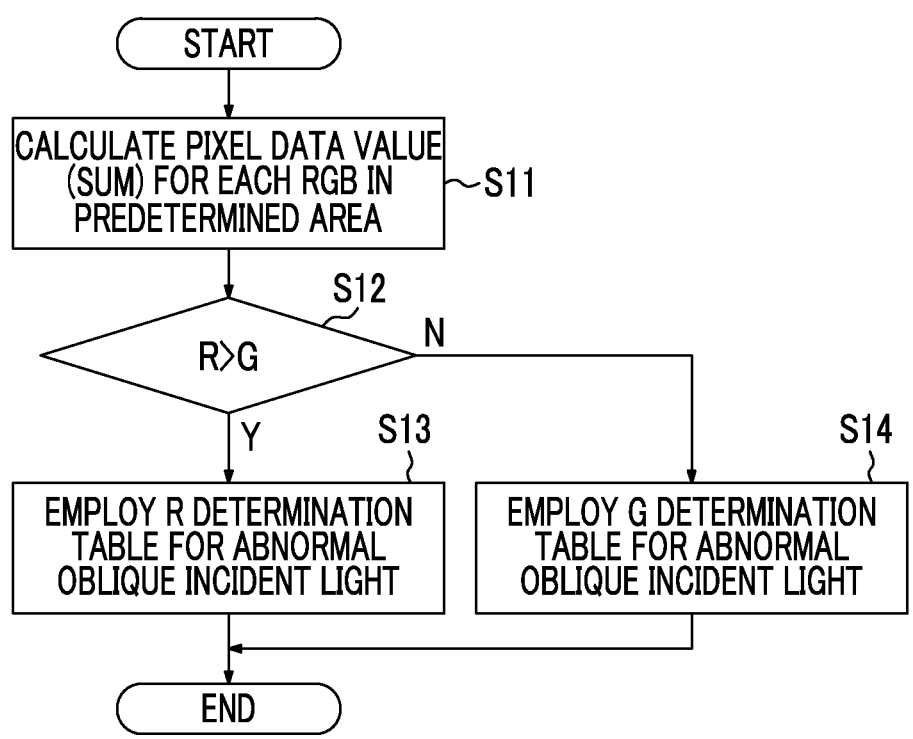
FIG. 19 is a flowchart illustrating an example of determination of a color type of abnormal oblique incident light.

FIG. 19 is a flowchart illustrating an example of determination of the color type of abnormal oblique incident light. In the present example, a description will be given of an example in which the abnormal oblique-incident-light detection portion 61 (pixel data value calculation portion 66) determines which abnormal oblique incident light of red (R) abnormal oblique incident light and green (G) abnormal oblique incident light is incident into the area of the imaging element 27. However, in a similar manner, it is also possible to perform the determination on abnormal oblique incident light (for example, blue (B) abnormal oblique incident light) with a different color.

First, for each area of the imaging element 27, the pixel data value calculation portion 66 calculates the sum of the respective pixel data pieces (pixel data pieces before white balance correction) of R, C and B pixels in the area (S11 in FIG. 19).

Then, the pixel data value calculation portion 66 determines which one of "the sum of the pixel data of the R pixels" and "the sum of the pixel data of the G pixels" in the area is greater (S12). If the sum of the pixel data of the R pixels is greater than the sum of the pixel data of the G pixels (Y in S12), it is determined that red abnormal oblique incident light is likely to be incident into this area, and an R determination table for abnormal oblique incident light is employed (S13). In contrast, if the sum of the pixel data of the R pixels is not greater than the sum of the pixel data of the G pixels (N in S12), it is determined that green abnormal oblique incident light is likely to be incident into this area, and a G determination table for abnormal oblique incident light is employed (S14).

The pixel data value calculation portion 66 determines the determination pixels corresponding to the determined color type of abnormal oblique incident light. Then, the abnormal oblique-incident-light determination portion 68 reads the employed determination table from the storage portion 65, and detects the conditions of abnormal oblique incident light.

In the determination table, "the information about incidence of abnormal oblique incident light which is incident into the imaging element" is determined for each color type of abnormal oblique incident light. Here, the information is associated with "the data patterns based on the average values of the respective pixel data pieces corresponding to the types of the determination pixels" in the area. For example, if "red abnormal oblique incident light" and "green abnormal oblique incident light" are assumed as abnormal oblique incident light as described in the present example, the following two determination tables are stored in the storage portion 65: a determination table about "the data patterns based on the average values of the respective pixel data pieces corresponding to the types of the determination pixels for red abnormal oblique incident light in the area"; and a determination table about "the data patterns based on the average values of the respective pixel data pieces corresponding to the types of the determination pixels for green abnormal oblique incident light in the area".

FIG. 20 is a diagram illustrating an example of a determination table used in detection of abnormal oblique incident light which is incident into the imaging element 27 (X-Trans array) of FIGS. 2A and 2B. In FIG. 20, the following determination tables are collectively shown: the determination table (refer to the "R determination table" of FIG. 20) about "the patterns based on the average values of the respective pixel data pieces corresponding to the types of the determination pixels for red abnormal oblique incident light in the area"; and the determination table (refer to the "G determination table" of FIG. 20) about "the patterns based on the average values of the respective pixel data pieces corresponding to the types of the determination pixels for green abnormal oblique incident light in the area".

In FIG. 20, "PAT00" to "PAT28" respectively indicates examples of typical output patterns of the determination pixels. If there is an output pattern other than "PAT00" to "PAT28", it is determined that "there is no abnormal oblique incident light". Further, "G1" to "G8" of FIG. 20 correspond to the G pixels shown in FIG. 13. Further, in FIG. 20, the output data of G1 to G8 pixels is indicated by the pixel data indicators (refer to FIG. 16), the pixel data indicators of "0" (the average pixel data in the area is small), "1" (the average pixel data in the area is medium), and "2" (the average pixel data in the area is large) are used. "–" of FIG. 20 indicates a case where it is difficult for the data to be used as a determination result for detection of corresponding abnormal oblique incident light. If the determination result is "–", the same processing as that in the case of no incidence of abnormal oblique incident light ("no ghost") is performed. Hence, it may be determined that abnormal oblique incident light is not incident ("no ghost").

In FIG. 20, incidence of abnormal oblique incident light is simply referred to as a "ghost", and incidence of strong abnormal oblique incident light, which has an intensity stronger than that of normal light, is referred to as a "strong ghost". "Upside and downside" in FIG. 20 mean "the positive direction side and the negative direction side in the vertical direction", and "the right side and the left side" in FIG. 20 mean "the positive direction side and the negative direction side in the horizontal direction". For example, "ghost from upside" means that "abnormal oblique incident light is incident from the positive direction side of the vertical direction toward the negative direction side", and "ghost from right side" means that "abnormal oblique incident light is incident from the positive direction side of the horizontal direction to the negative direction side".

In the results of FIG. 20, for example, the incidence direction of red abnormal oblique incident light is the horizontal direction or the vertical direction ("up", "down", "left", or "right" direction), the effect caused by "pixels diagonally adjacent to" the determination pixels is small, and the effect on the pixel data indicator is small (pixel data indicator=0), but the effect caused by the R pixels adjacent thereto in the horizontal and vertical directions (up, down, left, and right directions) is extremely large (pixel data indicator=2). Further, in this case, the effect, which is caused by the G pixels adjacent in the horizontal and vertical directions (up, down, left, and right directions), is large (pixel data indicator=1), but the effect caused by the adjacent B pixels is small (pixel data indicator=0).

In the results of FIG. 20, the incidence direction of red abnormal oblique incident light may be diagonal relative to the horizontal and vertical directions (hereinafter simply referred to as "the incidence direction is diagonal", and specifically, the direction indicates the "upper right", "lower right", "upper left", or "lower left" direction of FIG. 20). In this case, the effect caused by "pixels diagonally adjacent to" the determination pixels is small, and the effect on the pixel data indicator is small (pixel data indicator=0), but the effect caused by the G pixels adjacent thereto in the horizontal and vertical directions (up, down, left, and right directions) is medium, and the effect caused by the R pixels adjacent thereto in the horizontal and vertical directions (up, down, left, and right directions) is large. Further, if the incidence direction of red abnormal oblique incident light is oblique, due to the incidence direction, a degree of the effect caused by the G pixels adjacent to two pixels in the horizontal and vertical directions (up, down, left, and right directions) is substantially equal to a degree of the effect caused by the R pixels adjacent to one pixel in the horizontal and vertical directions (up, down, left, and right directions). Consequently, for example, if red abnormal oblique incident light is incident from the upper right, among the determination pixels, the G1 pixels are most affected by color mixture caused by red abnormal oblique incident light (pixel data indicator=2), the G2 pixels and the G4 pixels are substantially equally affected by color mixture caused by red abnormal oblique incident light (pixel data indicator=1), and the G3 pixels are least affected by color mixture caused by red abnormal oblique incident light (pixel data indicator=0). "The G1 pixels are adjacent to the R pixels on the positive direction side (upper side) of the vertical direction and are adjacent to the G pixels on the positive direction side (right side) of the horizontal direction)". "The G2 pixels are adjacent to the R pixels on the positive direction side (right side) of the horizontal direction (but are not adjacent to the R and G pixels on the positive direction side (upper side) of the vertical direction". "The G4 pixels are adjacent to the G pixels on the positive direction side (upper side) of the vertical direction and the positive direction side of the horizontal direction (right side)". "The G3 pixels are adjacent to the G pixels on the positive direction side (upper side) of the vertical direction (but are not adjacent to the R and G pixels on the positive direction side (right side) of the horizontal direction)". Hence, for example, if the pattern indicated by "PAT09" of FIG. 20 is detected, it can be determined that red abnormal oblique incident light (such as a ghost) is incident from the upper right.

In the result of FIG. 20, the incidence direction of green abnormal oblique incident light may be diagonal (the "upper right", "lower right", "upper left", or "lower left" direction of FIG. 20). In this case, the effect caused by "pixels diagonally adjacent to" the determination pixels is small, and the effect on the pixel data indicator is small (pixel data indicator=0), but the effect caused by the G pixels adjacent thereto in the horizontal and vertical directions (up, down, left, and right directions) is medium to large.

In addition, it is possible to detect the conditions of abnormal oblique incident light on the basis of the output patterns of at least one set of a set of the determination pixels of "G1 to G4 pixels" and a set of the determination pixels of "G5 to G8 pixels".

The abnormal oblique-incident-light detection portion 61 (the pixel data value calculation portion 66, the pixel data pattern calculation portion 67, and the abnormal oblique-incident-light determination portion 68) determines the color type of abnormal oblique incident light on the basis of the respective pixel data pieces corresponding to the color types of the color filters in the area of the imaging element, and detects the conditions of abnormal oblique incident light which is incident into the imaging element 27, with reference to the determination table (FIG. 20) corresponding to the determined color type of abnormal oblique incident light.

In the description of the above-mentioned example shown in FIG. 19, the corresponding type of abnormal oblique incident light is specified from two types of abnormal oblique incident light (red abnormal oblique incident light and green abnormal oblique incident light). However, the corresponding type of abnormal oblique incident light may be specified from three or more types of abnormal oblique incident light.

Figure 21:
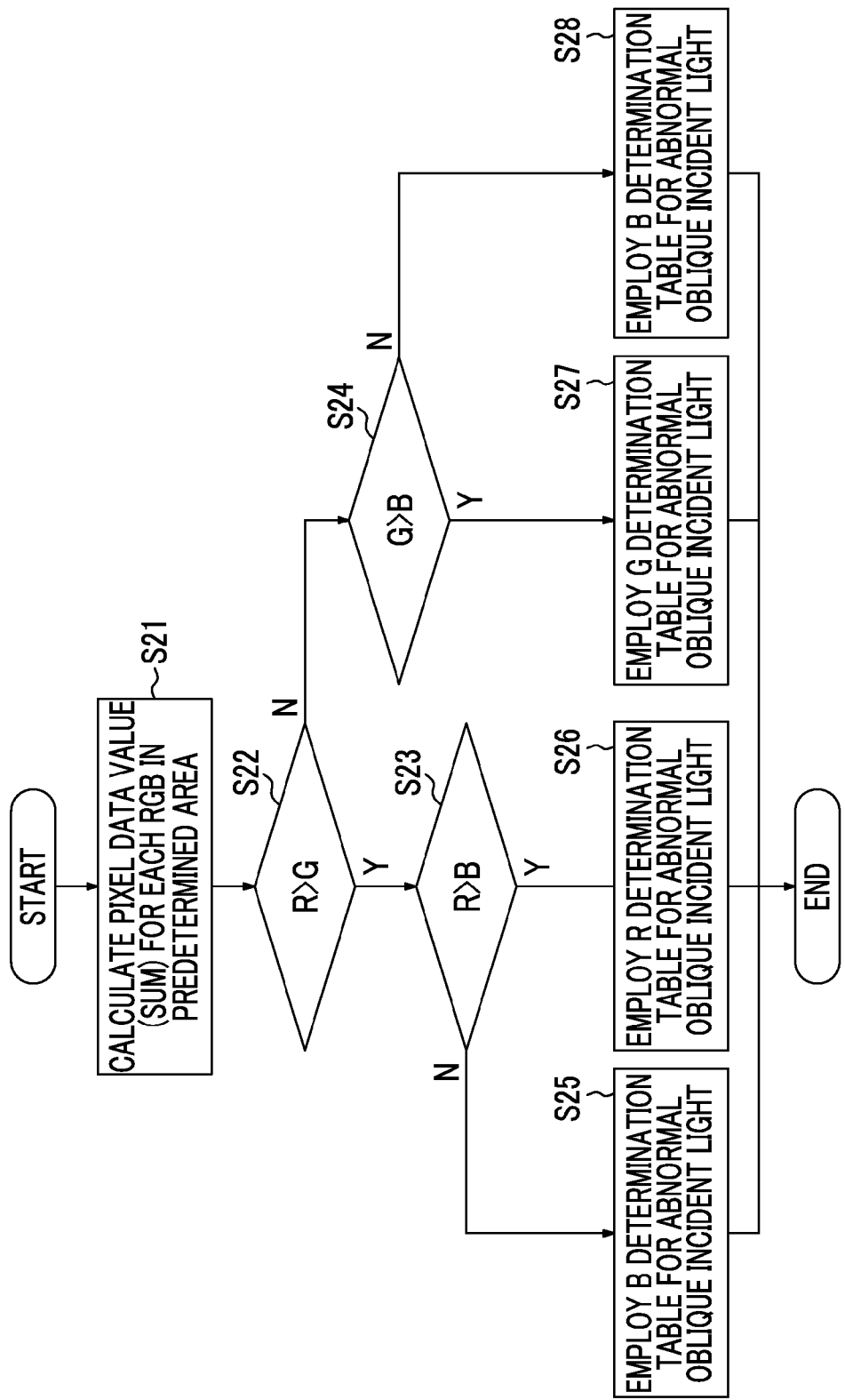
FIG. 21 is a flowchart illustrating another example of determination of the color type of abnormal oblique incident light.

FIG. 21 is a flowchart illustrating another example of determination of the color type of abnormal oblique incident light. In the present example, a description will be given of an example in which the pixel data value calculation portion 66 specifies the corresponding type of abnormal oblique incident light among red abnormal oblique incident light, green abnormal oblique incident light, and blue abnormal oblique incident light.

First, for each area of the imaging element 27, the pixel data value calculation portion 66 calculates the sum of the respective pixel data pieces (pixel data pieces before white balance correction) of R, C and B pixels in the area (S21 in FIG. 21).

Then, the pixel data value calculation portion 66 determines which one of "the sum of the pixel data of the R pixels" and "the sum of the pixel data of the G pixels" in the area is greater (S22). If the sum of the pixel data of the R pixels is greater than the sum of the pixel data of the G pixels (Y in S22), the pixel data value calculation portion 66 determines which one of "the sum of the pixel data of the R pixels" and "the sum of the pixel data of the B pixels" in the area is greater (S23). If the sum of the pixel data of the R pixels is not greater than the sum of the pixel data of the B pixels (N in S23), it is determined that blue abnormal oblique incident light is likely to be incident into this area, and the determination table for blue abnormal oblique incident light is employed (S25). In contrast, if the sum of the pixel data of the R pixels is greater than the sum of the pixel data of the B pixels (Y in S23), it is determined that red abnormal oblique incident light is likely to be incident into this area, and the determination table for red abnormal oblique incident light is employed (S26).

If the sum of the pixel data of the R pixels is not greater than the sum of the pixel data of the G pixels (N in S22), the pixel data value calculation portion 66 determines which one of "the sum of the pixel data of the G pixels" and "the sum of the pixel data of the B pixels" in the area is greater (S24). If the sum of the pixel data of the G pixels is greater than the sum of the pixel data of the B pixels (Y in S24), it is determined that green abnormal oblique incident light is likely to be incident into this area, and the determination table for green abnormal oblique incident light is employed (S27). In contrast, if the sum of the pixel data of the G pixels is not greater than the sum of the pixel data of the B pixels (N in S24), it is determined that blue abnormal oblique incident light is likely to be incident into this area, and the determination table for blue abnormal oblique incident light is employed (S28).

As described above, among three or more types of abnormal oblique incident light, the corresponding type of abnormal oblique incident light can be specified. Although the color type of abnormal oblique incident light is not particularly limited, the phenomenon of color mixture caused by abnormal oblique incident light occurs since the color filters passing the light and the photodiodes receiving the light do not correspond to each other. Accordingly, in order to determine the color type of abnormal oblique incident light, it is preferable to determine possibilities of incidence of abnormal oblique incident light with a plurality of colors corresponding to the colors of the color filters used in the imaging element 27. Here, the light deeply enters into the photodiodes (silicon) by an amount (degree) of a long-wavelength component, and tends to cause the color mixture phenomenon. Hence, by determining the possibility of incidence of abnormal oblique incident light with a color corresponding to a color of the color filter passing the long-wavelength component among the color filters used in the imaging element 27, it becomes easy to further reduce the color mixture phenomenon. For example, if the imaging element 27 includes the RGB filters, by determining the possibility of incidence of abnormal oblique incident light corresponding to R (red), it becomes easy to further reduce the color mixture phenomenon.

In addition, in the above-mentioned example, the color type of abnormal oblique incident light is determined in accordance with only comparison of "the sum of the pixel data of the R pixels in the area", "the sum of the pixel data of the G pixels in the area", and "the sum of the pixel data of the B pixels in the area", but a different condition may be added.

For example, in the example shown in FIG. 19 (the example in which the color type of abnormal oblique incident light is specified from two color types), "the sum of the pixel data of the pixels relating to one color type (for example, R) in the area" may be equal to or greater than a value x times "the sum of the pixel data of the pixels relating to the other color type (for example, G) in the area" (here, $0<x\le1$, for example, x=0.6). In this case, the abnormal oblique-incident-light detection portion 61 (pixel data value calculation portion 66) may determine that there is a possibility that abnormal oblique incident light (for example, red abnormal oblique incident light) corresponding to one color type (R) is incident into the area.

Further, in the example shown in FIG. 21 (the example in which the color type of abnormal oblique incident light is specified from three color types), the abnormal oblique-incident-light detection portion 61 (pixel data value calculation portion 66) is able to determine that abnormal oblique incident light with a color type is incident into the imaging element. The color type corresponds to color filters with a color type indicating a largest value among a value X times the average value of the pixel data of the R pixels ($0<X\le1$), a value Y times the average value of the pixel data of the G pixels ($0<Y\le1$), and a value Z times the average value of the pixel data of the B pixels ($0<Z\le1$), in the area of the imaging element 27.

The values of "x", "X", "Y", and "Z" are appropriately determined, but may be determined in accordance with the priority of the color type of abnormal oblique incident light as a detection target. Color mixture tends to be caused by an amount (degree) of the long-wavelength component, and tends to cause the level differences in pixel data between the same color pixels. Hence, for example, the values of "x", "X", "Y", and "Z" may be determined such that abnormal oblique incident light having the color type of the long-wavelength side is preferentially detected.

In addition, the abnormal oblique-incident-light detection portion 61 (pixel data value calculation portion 66) selects the above-mentioned determination pixels such that the color filters with the color type corresponding to the determined and detected color type of abnormal oblique incident light, which is likely to be incident, among the color types of the color filters included in the imaging element 27 are set as the color filters of the pixels adjacent to the determination pixels.

As described above, according to the present embodiment, it is possible to easily detect abnormal oblique incident light such as ghost light on the basis of the pixel data of the determination pixels, and it is possible to effectively perform correction processing (color mixture correction processing) of restoring image quality which is deteriorated by the abnormal oblique incident light.

In particular, if the imaging element 27 has the above-mentioned X-Trans array (refer to FIGS. 2A and 2B and 13), the same determination pixels G1 to G4 are used to be able to detect each of red abnormal oblique incident light, green abnormal oblique incident light, and blue abnormal oblique incident light.

As shown in FIGS. 22A to 22D, the G1 to G4 pixels satisfy the following conditions: "a condition where the color filter patterns of pixels adjacent to the determination pixel in the positive and negative directions of the horizontal direction and pixels adjacent thereto in the positive and negative directions of the vertical direction are different from one another"; "a condition where at least one of the pixels which are adjacent to the determination pixel in the positive and negative directions of the horizontal direction and the pixels which are adjacent thereto in the positive and negative directions of the vertical direction, has the B filter (the color filter corresponding to abnormal oblique incident light as a detection target)"; and "a condition where among the pixels which are adjacent to each determination pixel in the positive and negative directions of the horizontal direction and the pixels which are adjacent thereto in the positive and negative directions of the vertical direction, a pixel, which is opposed to the B pixel with the determination pixel interposed therebetween, has a color filter other than B filter". Consequently, the G1 to G4 pixels are used as the determination pixels so as to be able to detect the conditions of blue abnormal oblique incident light.

Further, as shown in FIGS. 22E to 22H, the G1 to G4 pixels satisfy the following conditions: "a condition where the color filter patterns of pixels adjacent to the determination pixel in the positive and negative directions of the horizontal direction and pixels adjacent thereto in the positive and negative directions of the vertical direction are different from one another"; "a condition where at least one of the pixels which are adjacent to the determination pixel in the positive and negative directions of the horizontal direction and the pixels which are adjacent thereto in the positive and negative directions of the vertical direction, has the G filter (the color filter corresponding to abnormal oblique incident light as a detection target)"; and "a condition where among the pixels which are adjacent to each determination pixel in the positive and negative directions of the horizontal direction and the pixels which are adjacent thereto in the positive and negative directions of the vertical direction, a pixel, which is opposed to the G pixel with the determination pixel interposed therebetween, has a color filter other than a G filter". Consequently, the G1 to G4 pixels are used as the determination pixels so as to be able to detect the conditions of green abnormal oblique incident light.

<Modification Example of Divided Areas>

In the above-mentioned embodiment, each of the plurality of divided areas (25 areas) shown in FIG. 14 is set as an area which is a target of detection of abnormal oblique incident light. The arrangement of divided areas is not necessarily limited to 25 areas, but constituent pixels of the imaging element 27 may be divided into a number of areas which is greater than 25 or less than 25. Further, an area including all the pixels 50 of the imaging element 27 as a detection target of abnormal oblique incident light may be set as one area (single area). If the constituent pixels of the imaging element 27 are divided into a plurality of areas, a size of each area may be the same for all the divided areas, or may be different.

In the example of the above-mentioned embodiment, the plurality of divided areas shown in FIG. 14 includes all the pixels of the imaging element 27. However, the areas as detection targets of abnormal oblique incident light may include only some pixels of the imaging element 27.

A shape of each divided area of the imaging element 27 is not limited to the example (rectangular divided area) shown in FIG. 14, but the shape of the divided area may be set as an arbitrary shape such as a polygon of triangular, hexagonal, or octagonal shape.

A plurality of divided areas overlapping with each other may be applied to the imaging element 27. FIGS. 23A to 23C are diagrams illustrating examples in which the constituent pixels of the imaging element 27 are divided into divided areas A (first divided areas) and divided areas B (second divided areas) overlapping with each other. FIG. 23A is a plan view of the imaging element 27 illustrating a situation in which the divided areas A and B are applied, FIG. 23B shows an example of area division of the divided areas A, and FIG. 23C shows an example of area division of the divided areas B.

In the imaging element 27 shown in FIG. 23A, the plurality of divided areas A is set, the plurality of divided areas B which are divided in a way different from that of the divided areas A is set, and the divided areas A and the divided areas B at least partially overlap. The divided areas A are based on the division method the same as that of the example of area division shown in FIG. 14, and the constituent pixels of the imaging element 27 are divided into "5 divisions in the horizontal direction" and "5 divisions in the vertical direction" (a total of 25 divisions) (refer to "area A00" to "area A44" of FIG. 23B). In contrast, the divided areas B are divided by "4 divisions in the horizontal direction" and "4 divisions in the vertical direction" (a total of 16 divisions) (refer to "area B00" to "area B33" of FIG. 23C), and each divided area B has a shape and a size the same as that of each divided area A.

These divided areas A and B overlap such that the centers thereof are at the same position, and the center (center of the "area A22" of FIG. 23B) of the divided areas A overlaps with the center (the center on the boundaries between the "area B11", the "area B12", the "area B21", and the "area B22" of FIG. 23C) of the divided areas B. Accordingly, the divided areas A and B are set to deviate from each other by a half of the size of each area of the divided areas A and B in at least one (both directions in the present example) of the horizontal and vertical directions. Thereby, each area of the divided areas B overlaps with two or more areas of the divided areas A. Specifically, each area of the divided areas B partially overlaps with four areas of the divided areas A.

Figure 24:
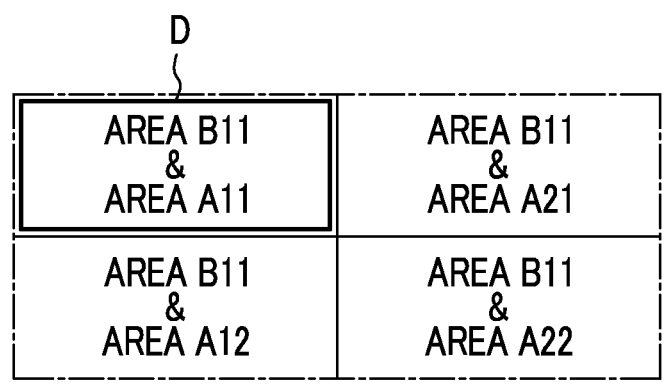
FIG. 24 is an enlarged view of a "C" part (areas B11) shown in FIG. 23A.

For example, the area B11 of the divided areas B overlaps with the area A11, the area A12, the area A21, and the area A22 of the divided areas A (refer to "C" of FIG. 23A and FIG. 24). As described above, the imaging element 27 includes pixels which are divided into any area of the divided areas A and are simultaneously divided into any area of the divided areas B. For example, the pixels divided into the area B11 of the divided areas B are divided into any of the area A11, the area A12, the area A21, and the area A22 of the divided areas A.

The abnormal oblique-incident-light detection portion 61 detects abnormal oblique incident light, which is incident into each area of the divided areas A, on the basis of "the average values of the respective pixel data pieces corresponding to the types of the determination pixels" in each area of the divided areas A. Further, the abnormal oblique-incident-light detection portion 61 detects abnormal oblique incident light, which is incident into each area of the divided areas B, on the basis of "the average values of the respective pixel data pieces corresponding to the types of the determination pixels" in each area of the divided areas B. Then, the abnormal oblique-incident-light detection portion 61 detects abnormal oblique incident light which is incident into areas where each area of the divided areas A overlaps with each area of the divided areas B, on the basis of the detection result of abnormal oblique incident light which is incident into each area of the divided areas A and the detection result of abnormal oblique incident light which is incident into each area of the divided areas B.

For example, if abnormal oblique incident light incident in the same direction in the areas A11 and B11 is detected while abnormal oblique incident light is not detected in the area A12, the area A21, and the area A22, it can be determined that the phenomenon of color mixture caused by abnormal oblique incident light occurs only in the area of the area B11 overlapping with the area A11 (refer to "D" of FIG. 24). Likewise, if incidence of weak abnormal oblique incident light (comparatively weak abnormal oblique incident light) incident into the area A00 and the area B00 is detected while abnormal oblique incident light is not detected in the area A10, the area A11, and the area A01, it can be determined that the phenomenon of color mixture caused by abnormal oblique incident light occurs only in the area of the area B00 overlapping with the area A00. As described above, by applying the plurality of divided areas overlapping with each other to the constituent pixels of the imaging element 27, it is possible to further restrictively specify areas in which color mixture caused by abnormal oblique incident light occurs.

As described above, by applying the plurality of divided areas overlapping with each other to the imaging element 27, it is possible to effectively restrict areas affected by color mixture caused by abnormal oblique incident light. As a result, the accuracy in detection of abnormal oblique incident light is improved.

<Modification Example of Color Filters>

In the above-mentioned embodiments, a description will be given of the example in which the imaging element 27 has a color filter array of the X-Trans array (refer to FIGS. 2A, 2B, and 13), but the imaging element 27 may have a different color filter array.

Figure 25:
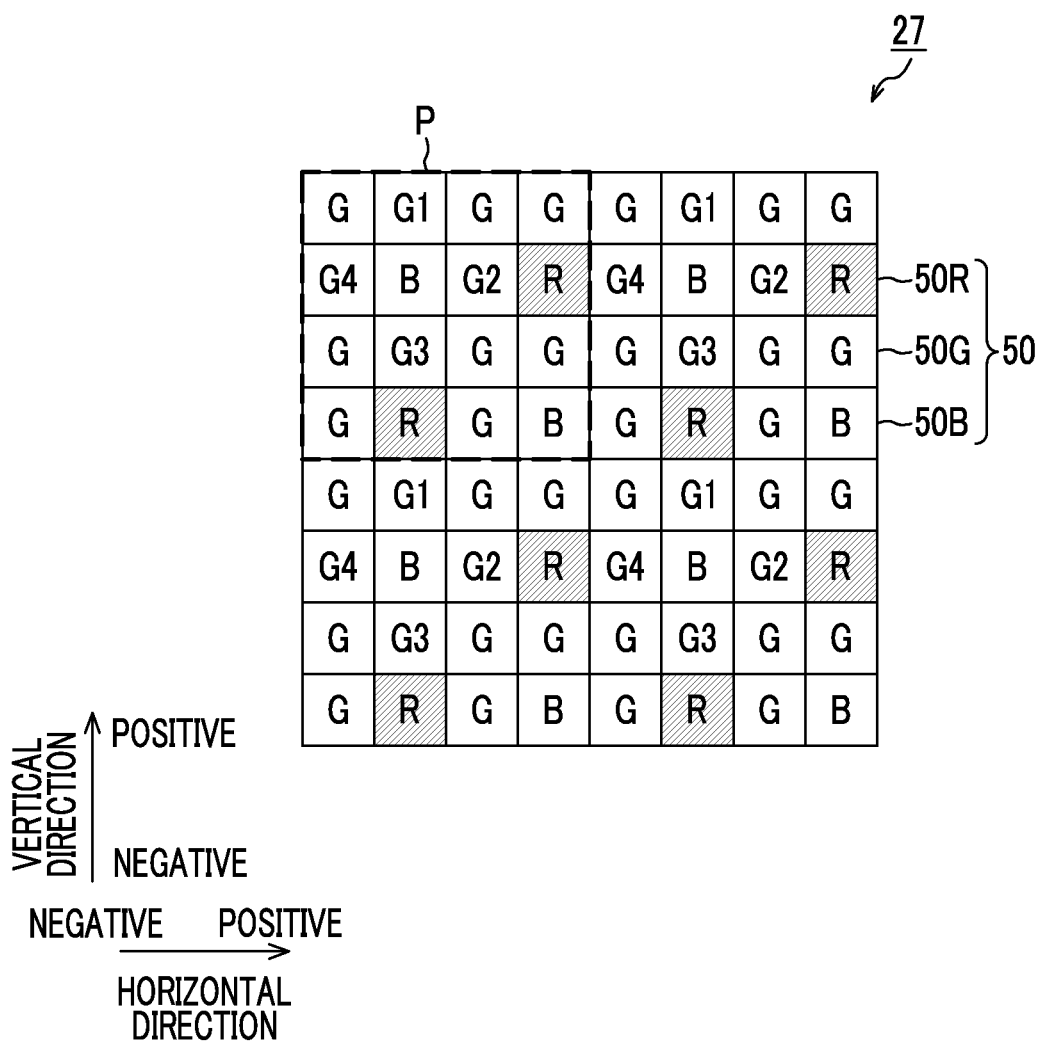
FIG. 25 is a plan view of the imaging element illustrating an example of a different color filter array.

FIG. 25 is a plan view of the imaging element 27 illustrating an example of the different color filter array. In the present example, the basic array pattern P is formed by 4 pixels (horizontal direction)×4 pixels (vertical direction). In each basic array pattern P, in order from the positive direction side of the vertical direction, four rows are arranged: a row in which "G, G, G, and G pixels" are arranged in the horizontal direction; a row in which "G, B, G, and R pixels" are arranged in the horizontal direction; a row in which "G, G, G, and G pixels" are arranged in the horizontal direction; and a row in which "G, R, G, and B pixels" are arranged in the horizontal direction. This basic array pattern P also includes at least four types of the same color pixel (the G pixels in the example shown in FIG. 25) that satisfy the conditions of the above-mentioned determination pixel. Hence, by using the same color pixels as the determination pixels, it is possible to accurately detect abnormal oblique incident light. FIG. 25 shows an example of the determination pixels G1 to G4 which can be used in detection of red abnormal oblique incident light. However, there are other pixels satisfying the conditions of the above-mentioned determination pixel, and the other pixels may be used as the determination pixels.

Figure 26:
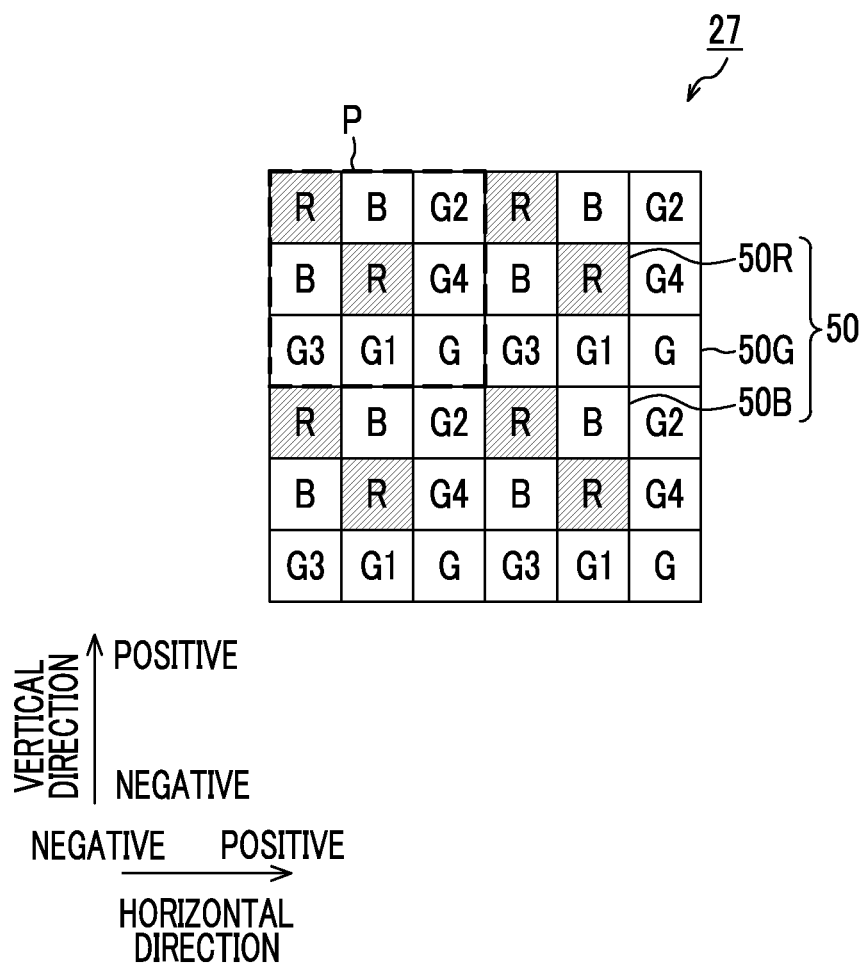
FIG. 26 is a plan view of the imaging element illustrating an example of a different color filter array.

FIG. 26 is a plan view of the imaging element 27 illustrating an example of the different color filter array. In the present example, the basic array pattern P is formed by 3 pixels (horizontal direction)×3 pixels (vertical direction). In each basic array pattern P, in order from the positive direction side of the vertical direction, three rows are arranged: a row in which "R, B, and G pixels" are arranged in the horizontal direction; a row in which "B, R, and G pixels" are arranged in the horizontal direction; and a row in which "G, G, and G pixels" are arranged in the horizontal direction. This basic array pattern P also includes at least four types of the same color pixel (the G pixels in the example shown in FIG. 26) that satisfy the conditions of the above-mentioned determination pixel. Hence, by using the same color pixels as the determination pixels, it is possible to detect abnormal oblique incident light. FIG. 26 shows an example of the determination pixels G1 to G4 which can be used in detection of red abnormal oblique incident light.

Figure 27:
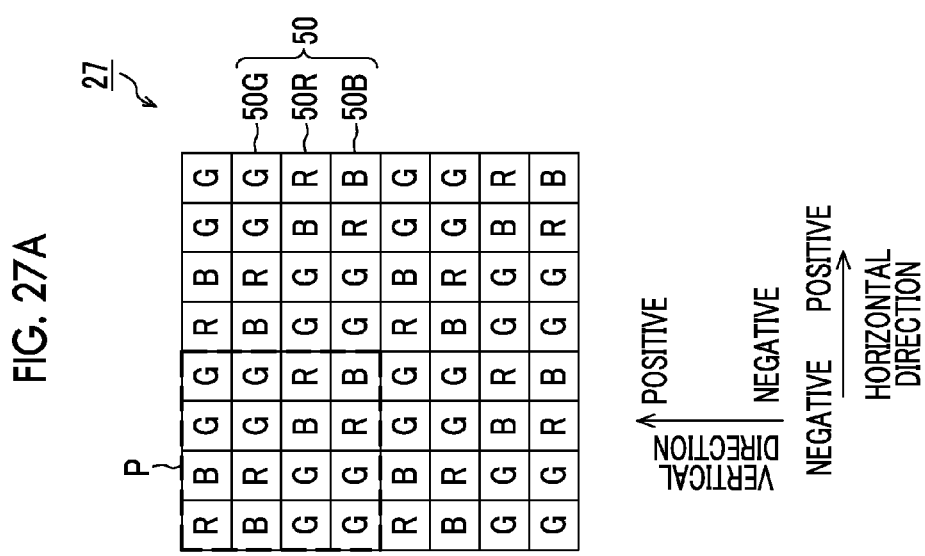
FIGS. 27A to 27D are plan views of the imaging element illustrating other examples of the color filter arrays.

FIGS. 27A to 27D are plan views of the imaging element 27 illustrating other examples of the color filter arrays. FIG. 27A shows a state where four basic array patterns P are arranged. FIG. 27B shows an example of the determination pixels G1 to G4 which can be used in detection of red abnormal oblique incident light. FIG. 27C shows an example of the determination pixels G1 to G4 which can be used in detection of green abnormal oblique incident light. FIG. 27D shows an example of the determination pixels G1 to G4 which can be used in detection of blue abnormal oblique incident light. In the present example, the basic array pattern P is formed by 4 pixels (horizontal direction)×4 pixels (vertical direction). In each basic array pattern P, in order from the positive direction side of the vertical direction, four rows are arranged: a row in which "R, B, G, and G pixels" are arranged in the horizontal direction; a row in which "B, R, G, and G pixels" are arranged in the horizontal direction; a row in which "G, G, B, and R pixels" are arranged in the horizontal direction; and a row in which "G, G, R, and B pixels" are arranged in the horizontal direction. This basic array pattern P also includes at least four types of the same color pixel that satisfy the conditions of the above-mentioned determination pixel. Hence, by using the same color pixels as the determination pixels, it is possible to detect abnormal oblique incident light. In particular, in the color filter array of the present example, the same pixels (G1 to G4 pixels) can be used as "determination pixels for detection of red abnormal oblique incident light" (refer to FIG. 27B), "determination pixels for green abnormal oblique incident light" (refer to FIG. 27C), and "determination pixels for detection of blue abnormal oblique incident light" (refer to FIG. 27D). In addition, there are not only G1 to G4 shown in FIGS. 27A to 27D but also different pixels satisfying the conditions of the above-mentioned determination pixel, and the different pixels may be used as the determination pixels.

Figure 28:
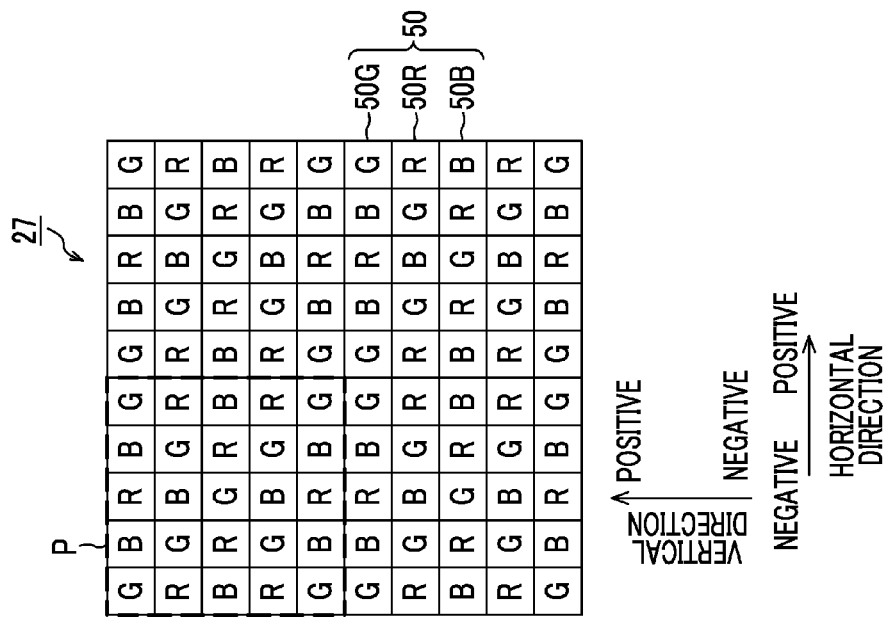
FIGS. 28A to 28D are plan views of the imaging element illustrating other examples of the color filter arrays.

FIGS. 28A to 28D are plan views of the imaging element 27 illustrating other examples of the color filter arrays. FIG. 28A shows a state where four basic array patterns P are arranged. FIG. 28B shows an example of the determination pixels G1 to G4 which can be used in detection of red abnormal oblique incident light. FIG. 28C shows an example of the determination pixels R1 to R4 which can be used in detection of green abnormal oblique incident light. FIG. 28D shows an example of the determination pixels G1 to G4 which can be used in detection of blue abnormal oblique incident light. In the present example, the basic array pattern P is formed by 5 pixels (horizontal direction)×5 pixels (vertical direction). In each basic array pattern P, in order from the positive direction side of the vertical direction, five rows are arranged: a row in which "G, B, R, B, and G pixels" are arranged in the horizontal direction; a row in which "R, G, B, G, and R pixels" are arranged in the horizontal direction; a row in which "B, R, G, R, and B pixels" are arranged in the horizontal direction; a row in which "R, G, B, G and R pixels" are arranged in the horizontal direction; and a row in which "G, B, R, B, and G pixels" are arranged in the horizontal direction. This basic array pattern P also includes at least four types of the same color pixel (the G/R pixels in the example shown in FIGS. 28A to 28D) that satisfy the conditions of the above-mentioned determination pixel. Hence, by using the same color pixels as the determination pixels, it is possible to detect abnormal oblique incident light. In addition, there are not only G1 to G4 and R1 to R4 shown in FIGS. 28A to 28D but also different pixels satisfying the conditions of the above-mentioned determination pixel, and the different pixels may be used as the determination pixels.

<Another Modification Example>

In the above-mentioned embodiments, mainly detection and correction of "color mixture caused by incidence of abnormal oblique incident light" has been described. The color mixture determination correction section 41 (refer to FIG. 3) may correct "color mixture regardless of abnormal oblique incident light". That is, in the imaging element 27 such as a CMOS, the pixel data outputs may be affected by the adjacent pixels, due to a basic structure such as a pixel common amplifier or a color array pattern of adjacent pixels, regardless of whether or not abnormal oblique incident light is incident. The pixel data correction for reducing and eliminating the effect of "color mixture caused by the adjacent pixels regardless of abnormal oblique incident light" may be performed. As the color mixture correction, for example, "a rate of color mixture caused by the adjacent pixels" based on the basic structure or the color array pattern of the adjacent pixels is calculated in advance, an amount of color mixture is calculated from the sum of products of the pixel data which is actually output from the adjacent pixels and "the rate of color mixture caused by the adjacent pixels", and the amount of color mixture is reduced from the pixel data of the correction target pixels, whereby it is possible to acquire original pixel data of the correction target pixels.

The array direction of the color filter array (the pixel array of the imaging element) is particularly not limited, and may be a direction at an arbitrary angle to the horizontal and vertical directions. For example, the color filter array may be a so-called "honeycomb-like array" in which a plurality of pixels (color filters) two dimensionally arranged in the horizontal and vertical directions is rotated by 45 degrees. Further, a color filter with a color other than RGB may be used. For example, the color filter may employ a filter that passes any of light with red wavelength region, light with blue wavelength region, and light with green wavelength region, a transparent filter having a comparatively high light transmittance (for example, a light transmittance equal to or greater than 70%) in the wavelength region, or a so-called white filter having a transmittance lower than that of the transparent filter. In this case, any of a red filter, a transparent filter, and a white filter may be a color filter (color filter with the first color) with a color corresponding to abnormal oblique incident light. Further, either a blue filter or a green filter may be a color filter with a color corresponding to abnormal oblique incident light. The imaging element 27 may include pixels having color filters with a color other than red, green, blue, transparent, and white colors.

It should be noted that the above-mentioned digital camera 10 is an example, and the present invention is applicable to other configurations. Each functional configuration can be appropriately implemented by arbitrary hardware, software, or a combination of both of them. Consequently, for example, the present invention is also applicable to a program for causing a computer to execute a processing sequence in the above-mentioned devices and processing sections (such as the abnormal oblique-incident-light detection portion 61 and the abnormal oblique-incident-light correction portion 63).

In the above-mentioned embodiments, an aspect in which the image processing circuit 32 (such as the color mixture determination correction section 41) is provided in the digital camera 10 has been described. However, the image processing circuit 32 (such as the color mixture determination correction section 41) may be provided in other devices such as a computer.

For example, when image data is processed in a computer, an image processing section provided in the computer may perform color mixture correction and detection of abnormal oblique incident light mentioned above. If a server has the image processing section (color mixture determination correction section), for example, the image data may be transmitted from the digital camera or the computer to the server, the image processing section of the server may perform color mixture correction and detection of abnormal oblique incident light mentioned above on the image data, and the image data subjected to the color mixture correction is transmitted and provided to a transmission destination.

The aspect according to the present invention is not limited to a digital camera, a computer, and a server. The aspect is applicable to not only cameras having an imaging function as a main function but also mobile devices having functions (a calling function, a communication function, and other computer functions) other than an imaging function in addition to the imaging function. Examples of such mobile devices include a mobile phone having a camera function, a smartphone, a personal digital assistant (PDA), and a portable game machine. Hereinafter, an example of a smartphone, to which the present invention is applicable, will be described.

<Configuration of Smartphone>

Figure 29:
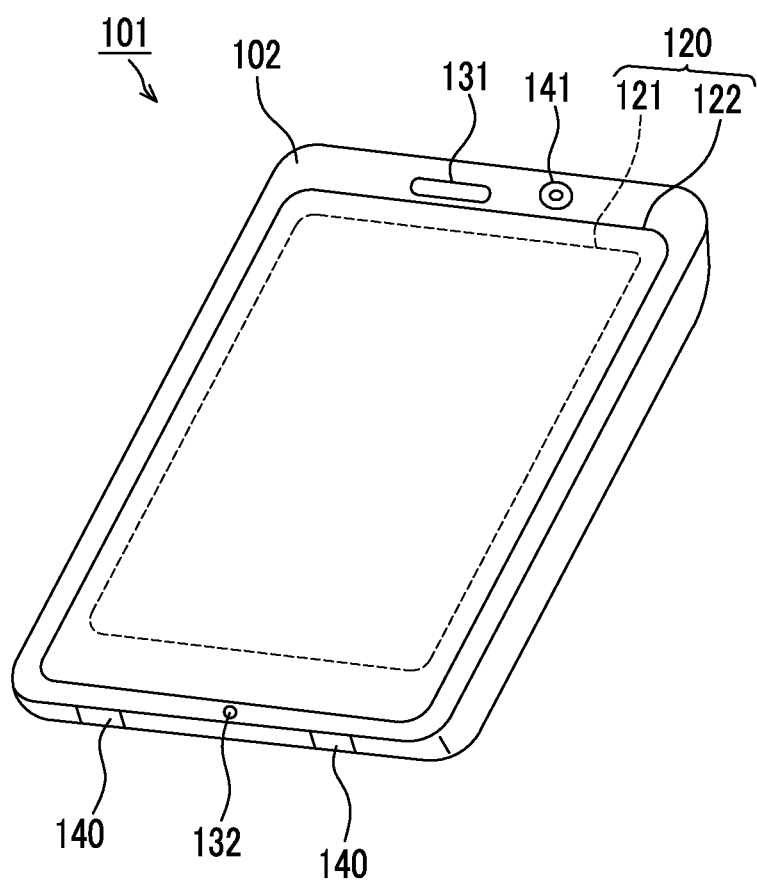
FIG. 29 is an appearance diagram illustrating a smartphone.

FIG. 29 shows an appearance of a smartphone 101 as the imaging device according to the embodiment of the present invention. The smartphone 101 shown in FIG. 29 includes: a casing 102 that has a flat plate shape; a display panel 121 as a display section on one side of the casing 102; and a display input section 120 into which an operation panel 122 as an input section is integrated. The casing 102 includes a speaker 131, a microphone 132, operation sections 140, and a camera section 141. The configuration of the casing 102 is not limited to this. For example, it may be possible to adopt a configuration in which the input section and the display section each are independent, or it may be possible to adopt a configuration having a slide mechanism or the folded structure.

Figure 30:
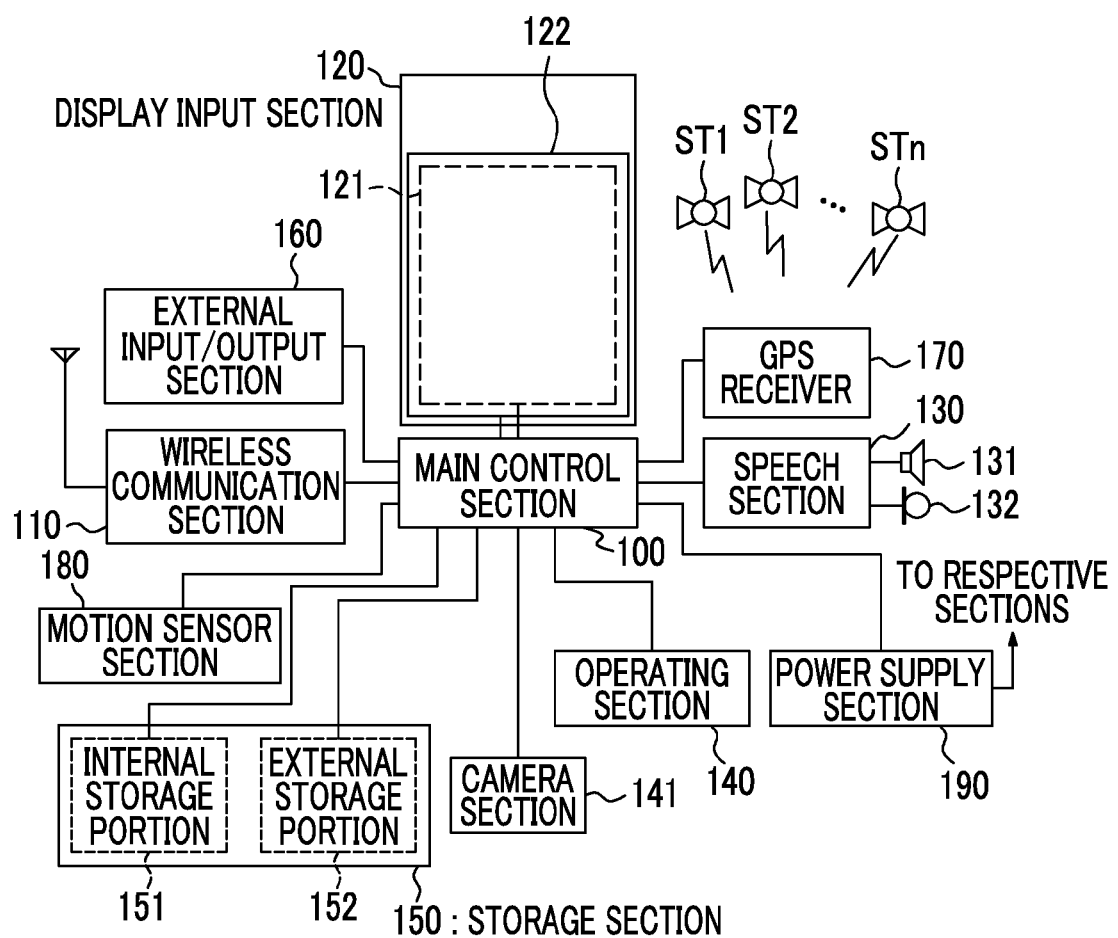
FIG. 30 is a block diagram illustrating a configuration of the smartphone.

FIG. 30 is a block diagram illustrating a configuration of the smartphone 101 shown in FIG. 29. As shown in FIG. 30, the smartphone 101 includes, as main components, a wireless communication section 110, a display input section 120, a speech section 130, operation sections 140, a camera section 141, a storage section 150, an external input/output section 160, a global positioning system (GPS) receiver 170, a motion sensor section 180, a power supply section 190, and a main control section 100. As the main function of the smartphone 101, there is provided a wireless communication function for performing mobile wireless communication with a base station device BS through a mobile communication network NW.

The wireless communication section 110 performs wireless communication with the base station device BS, which is included in the mobile communication network NW, in accordance with an instruction of the main control section 100. The wireless communication section 110 transmits and receives various kinds of file data such as audio data and image data, e-mail data, and the like, and receives Web data, streaming data, and the like, by using wireless communication.

The display input section 120 displays image (still image and moving image) information or text information so as to visually transfer the information to a user in accordance with control of the main control section 100, and detects a user operation on the displayed information. The display input section 120 is, for example, a touch panel.

The display panel 121 of the display input section 120 is configured to use a liquid crystal display (LCD), an organic electro-luminescence display (OELD), or the like as a display device. The operation panel 122 of the display input section 120 is a device that is provided to view an image which is displayed on a display screen of the display panel 121 and that detects a single pair of coordinates or a plurality of pairs of coordinates at which an operation is performed by a user's finger or a stylus. When the operation panel 122 is operated by a user's finger or a stylus, the device outputs a detection signal, which is generated due to the operation, to the main control section 100. The main control section 100 detects an operation position (coordinates) on the display panel 121, on the basis of the input detection signal.

In the smartphone 101 of the present embodiment, the operation panel 122 is disposed to completely cover the display panel 121, and the display panel 121 and the operation panel 122 are integrated to constitute the display input section 120. In this case, the operation panel 122 may have a function of also detecting a user operation in a region outside the display panel 121. That is, the operation panel 122 may include a detection region (hereinafter referred to as a display region) for a part which overlaps with the display panel 121 and a detection region (hereinafter referred to as a non-display region) for the other part at the outer edge which does not overlap with the display panel 121.

A size of the display region and a size of the display panel 121 may completely coincide with each other, but both do not have to coincide with each other. It is not always necessary for the size of the display region and the size of the display panel 121 to coincide with each other. The operation panel 122 may include two sensing regions of the outer edge part and the other inside part. A width of the outer edge part is appropriately designed depending on a size of the casing 102 and the like. Examples of the position detection method adopted by the operation panel 122 may include a matrix switch method, a resistance film method, a surface elastic wave method, an infrared method, an electromagnetic induction method, and an electrostatic capacitance method, and the like.

The speech section 130 includes a speaker 131 and a microphone 132. The speech section 130 converts a sound of a user, which is input through the microphone 132, into sound data, which can be processed in the main control section 100. The speaker 131 decodes sound data, which is received by the wireless communication section 110 or the external input/output section 160, and outputs the data. For example, the speaker 131 can be mounted on a surface the same as the surface on which the display input section 120 is provided, and the microphone 132 can be mounted on a side surface of the casing 102.

The operation section 140 is a hardware key using a key switch or the like, and receives an instruction from a user. For example, as shown in FIG. 29, the operation sections 140 are mounted on the side surface of the casing 102 of the smartphone 101. The operation sections 140 are button type switches each of which is turned on if it is pressed by a finger or the like and is turned off due to restoring force of a spring if the finger is released.

The storage section 150 stores a control program and control data of the main control section 100, application software, address data in which names, phone numbers, and the like of communication partners are associated, received and transmitted e-mail data, Web data which is downloaded by Web browsing, and downloaded contents data. Further, the storage section 150 temporarily stores streaming data and the like. The storage section 150 is constituted of an internal storage portion 151, which is built into the smartphone, and an external storage portion 152 which has a removable external memory slot. The internal storage portion 151 and the external storage portion 152 is implemented by using a storage medium such as a flash memory type, a hard disk type, a multimedia card micro type, a card type memory (such as a MicroSD (registered trademark) memory), a random access memory (RAM), or a read only memory (ROM).

The external input/output section 160 has a function of an interface with external devices connected to the smartphone 101. The external input/output section 160 is for communication (such as universal serial bus (USB) or IEEE1394) between the smartphone 101 and other external devices, direct or indirect connection to networks (such as the Internet, wireless LAN, Bluetooth (registered trademark), radio frequency identification (RFID), infrared communication (Infrared Data Association: IrDA) (registered trademark), ultra wideband (UWB) (registered trademark), and ZigBee (registered trademark)), or the like.

Examples of the external devices connected to the smartphone 101 include a wired/wireless headset, a wired/wireless external charger, a wired/wireless data port, a memory card which is connected through a card socket, a subscriber identity module (SIM) or user identity module (UIM) card, external audio and video devices which are connected through audio and video input/output (I/O) terminals, external audio and video devices which are connected in a wireless manner, a smartphone which is connected in a wired or wireless manner, a personal computer which is connected in a wired or wireless manner, a PDA which is connected in a wired or wireless manner, a personal computer which is connected in a wired or wireless manner, an earphone, and the like. The external input/output section may transfer the data, which is transmitted from such external devices, to the components within the smartphone 101, and to transmit the data within the smartphone 101 to the external devices.

The GPS receiver 170 receives a plurality of GPS signals, which are transmitted from GPS satellites ST1 to STn, in accordance with instructions of the main control section 100, executes positioning calculation processing based on the received GPS signals, and detects a position formed of a latitude, a longitude, and an altitude of the smartphone 101. The GPS receiver 170 may detect the position by using position information if it is possible to acquire the position information from the wireless communication section 110 or the external input/output section 160 (for example, wireless LAN).

The motion sensor section 180 includes, for example, a triaxial acceleration sensor, and detects physical movement of the smartphone 101, in accordance with an instruction of the main control section 100. By detecting physical movement of the smartphone 101, a speed of acceleration and a direction of the movement of the smartphone 101 are detected. A detection result obtained by the motion sensor section 180 is output to the main control section 100.

The power supply section 190 supplies the respective sections of the smartphone 101 with electric power, which is stored in a battery (not shown), in accordance with an instruction of the main control section 100.

The main control section 100 includes a micro processor, and integrally controls the respective sections of the smartphone 101 by performing an operation on the basis of control data or a control program stored in the storage section 150. The main control section 100 has an application processing function and a mobile communication control function of controlling the respective sections of a communication system in order to perform data communication and sound communication through the wireless communication section 110.

The application processing function is implemented by an operation of the main control section 100 using application software stored in the storage section 150. Examples of the application processing function include: an infrared communication function of performing data communication with other devices by controlling the external input/output section 160; an e-mail function of transmitting and receiving e-mails; a Web browsing function of browsing Web pages; and the like.

The main control section 100 has an image processing function of displaying a video on the display input section 120 and the like, on the basis of image data (still image and moving image data) such as received data and downloaded streaming data. The image processing function means a function of causing the main control section 100 to decode the image data, apply image processing to the decoding result, and display an image on the display input section 120.

The main control section 100 executes display control for the display panel 121 and operation detection control to detect the user operation through the operation sections 140 and the operation panel 122.

Through execution of the display control, the main control section 100 displays an icon for activating application software and a window for displaying a software key such as a scroll bar or creating an e-mail. The scroll bar means a software key for receiving an instruction to move a display portion of an image on a large image which is not entirely shown in the display region of the display panel 121.

Through execution of the operation detection control, the main control section 100 detects the user operation performed through the operation section 140, receives an operation performed on the icon or a text input performed in an input field of the window through the operation panel 122, or receives a request to scroll a displayed image through the scroll bar.

The main control section 100 has a touch panel control function performed through execution of the operation detection control. The function determines whether the operation position of the operation panel 122 is in the overlapping part (display region) which overlaps with the display panel 121 or the other part (non-display region) at the outer edge which does not overlap with the display panel 121, and controls the display position of the software key or the sensing region of the operation panel 122.

The main control section 100 may detect a gesture operation performed on the operation panel 122, and may execute a preset function in response to the detected gesture operation. The gesture operation is not a simple touch operation used in the past. The gesture operation means an operation for drawing a locus with a finger or the like, an operation of specifying a plurality of positions at the same time, or an operation of drawing loci from a plurality of positions to at least one position as combination of the above-mentioned operations.

The camera section 141 is a digital camera for performing electronic photography by using the imaging element such as a complementary metal oxide semiconductor (CMOS) or a charge-coupled device (CCD). Under the control of the main control section 100, the camera section 141 converts the image data, which is obtained through image capturing, into compressed image data such as data of a joint photographic coding experts group (JPEG), and records the data in the storage section 150 or outputs the data through the external input/output section 160 or the wireless communication section 110. In the smartphone 101 of the present embodiment shown in FIG. 29, the single camera section 141 is mounted on the same side as the display input section 120. However, the mounting position thereof is not limited to this. The camera section 141 may be mounted on the rear side of the display input section 120, or a plurality of camera sections 141 may be mounted. In addition, in the case where the plurality of camera sections 141 is mounted, photography may be performed using a single camera section 141 by selecting the camera section 141 for the photography, or photography may be performed using the plurality of camera sections 141 at the same time.

The camera section 141 can be used in various functions of the smartphone 101. For example, an image, which is acquired by the camera section 141, can be used to be displayed on the display panel 121, and an image of the camera section 141 as one of the operation inputs of the operation panel 122 can be used. When the GPS receiver 170 detects a position, the GPS receiver 170 may detect the position with reference to the image acquired from the camera section 141. Further, it may be possible to determine a direction of optical axis of the camera section 141 of the smartphone 101 or determine current user environment, using the GPS receiver 170 in combination with the triaxial acceleration sensor or without using the triaxial acceleration sensor, with reference to the image acquired from the camera section 141. The image acquired from the camera section 141 may be used in the application software.

The position information acquired by the GPS receiver 170, the sound information acquired by the microphone 132 (or text information obtained through sound text conversion performed by the main control section 100 or the like), posture information acquired by the motion sensor section 180, and the like may be added to the image data of the still image or the moving image which is obtained using the camera section 141. Further, the image data of the still image or the moving image, to which the position information, the sound information, the posture information, and the like are added, may be recorded in the storage section 150, or may be output through the external input/output section 160 or the wireless communication section 110.

In the above-mentioned smartphone 101, the image processing circuit 32 of FIG. 3 can be appropriately implemented by, for example, the main control section 100, the storage section 150, and the like.

What is claimed is:

1. An imaging device comprising:
   an imaging element that has a plurality of pixels arranged in a first direction and a second direction perpendicular to the first direction, where each of the plurality of pixels has a color filter and a photodiode which receives light transmitted through the color filter and outputs pixel data; and
   an abnormal oblique-incident-light detection unit detecting abnormal oblique incident light which is incident into the imaging element on the basis of the pixel data,
   wherein the plurality of pixels includes at least four types of determination pixels for which patterns of color filters of pixels adjacent in a positive direction and a negative direction of the first direction and pixels adjacent in a positive direction and a negative direction of the second direction are different from one another,
   wherein at least one of pixels, which are adjacent to each determination pixel in the positive direction and the negative direction of the first direction, and pixels, which are adjacent to the determination pixel in the positive direction and the negative direction of the second direction, is a first color pixel that has a color filter with a first color,
   wherein among the pixels which are adjacent to each determination pixel in the positive direction and the negative direction of the first direction and the pixels which are adjacent to the determination pixel in the positive direction and the negative direction of the second direction, a pixel, which is opposed to the first color pixel with the determination pixel interposed therebetween, has a color filter other than the color filter with the first color, and
   wherein the abnormal oblique-incident-light detection unit detects abnormal oblique incident light, which is incident into the imaging element, on the basis of average values of the respective pixel data pieces corresponding to the types of the determination pixels in an area which is an area within the imaging element and includes types of a plurality of the determination pixels.

2. The imaging device according to claim 1, wherein the abnormal oblique-incident-light detection unit detects an incidence direction of the abnormal oblique incident light, which is incident into the imaging element, on the basis of the average values of the respective pixel data pieces corresponding to the types of the determination pixels in the area.

3. The imaging device according to claim 1, further comprising
   a storage unit storing a determination table in which information about incidence of the abnormal oblique incident light into the imaging element is associated with data patterns based on the average values of the respective pixel data pieces corresponding to the types of the determination pixels in the area, wherein the abnormal oblique-incident-light detection unit detects the abnormal oblique incident light, which is incident into the imaging element, with reference to the determination table.

4. The imaging device according to claim 3, wherein in the determination table, the information about incidence of the abnormal oblique incident light into the imaging element is determined for each color type of the abnormal oblique incident light, and wherein the abnormal oblique-incident-light detection unit detects a color type of the abnormal oblique incident light on the basis of the pixel data for each color type of the color filters in the area of the imaging element, and detects abnormal oblique incident light, which is incident into the imaging element, with reference to the determination table corresponding to the detected color type of the abnormal oblique incident light.

5. The imaging device according to claim 3, wherein in the determination table, when an average value of a sum of average values of various-type pixel data for determination as the respective pixel data pieces corresponding to the at least four types of the determination pixels or a median of the average values of the various-type pixel data for determination is set as a reference, a data pattern, which indicates proportions of the various-type pixel data for determination, is associated with the information about incidence of the abnormal oblique incident light into the imaging element.

6. The imaging device according to claim 3, wherein in the determination table, ranks based on magnitudes of the average values of the various-type pixel data are associated with the information about incidence of the abnormal oblique incident light into the imaging element, and wherein the abnormal oblique-incident-light detection unit ranks the at least four types of the determination pixels on the basis of the average values of the various-type pixel data in the area, and detects abnormal oblique incident light, which is incident into the imaging element, with reference to the determination table.

7. The imaging device according to claim 4, wherein the plurality of pixels includes at least first color type pixels having first color type color filters, second color type pixels having second color type color filters, and third color type pixels having third color type color filters, and wherein the abnormal oblique-incident-light detection unit determines the at least four types of the determination pixels by setting color filters having a color type corresponding to the detected color type of the abnormal oblique incident light as color filters with the first color among the first color type color filters, the second color type color filters, and the third color type color filters.

8. The imaging device according to claim 7, wherein the abnormal oblique-incident-light detection unit determines that abnormal oblique incident light is incident into the imaging element, the abnormal oblique incident light having a color type corresponding to color filters having a color type indicating a largest value, among a value of X times an average value of the pixel data of the first color type pixels obtained when $0<X\leq 1$, a value of Y times an average value of the pixel data of the second color type pixels obtained when $0<Y\leq 1$, and a value of Z times an average value of the pixel data of the third color type pixels obtained when $0<Z\leq 1$, in the area of the imaging element.

9. The imaging device according to claim 1, further comprising a correction unit correcting the pixel data of pixels having the photodiodes, in which the abnormal oblique incident light is detected, on the basis of a detection result of the abnormal oblique-incident-light detection unit.

10. The imaging device according to claim 1, wherein the area is an area including all of the plurality of pixels of the imaging element.

11. The imaging device according to claim 1, wherein the area is each of a plurality of divided areas which are obtained by dividing the imaging element into a plurality of areas.

12. The imaging device according to claim 11, wherein the plurality of divided areas includes all of the plurality of pixels of the imaging element.

13. The imaging device according to claim 1, wherein in the imaging element, a plurality of first divided areas is set, and a plurality of second divided areas, which are divided in a way different from that of the first divided areas, is set, wherein the plurality of first divided areas and the plurality of second divided areas at least partially overlap, wherein the plurality of pixels includes pixels some of which are classified as some of the first divided areas and are classified as some of the second divided areas, and wherein the abnormal oblique-incident-light detection unit detects abnormal oblique incident light, which is incident into each of the first divided areas, on the basis of the average values of the respective pixel data pieces corresponding to the types of the determination pixels in each of the first divided areas, detects abnormal oblique incident light, which is incident into each of the second divided areas, on the basis of the average values of the respective pixel data pieces corresponding to the types of the determination pixels in each of the second divided areas, and detects abnormal oblique incident light, which is incident into each of areas where the respective first divided areas overlap with the respective second divided areas, on the basis of a detection result of the abnormal oblique incident light which is incident into each of the first divided areas and a detection result of the abnormal oblique incident light which is incident into each of the second divided areas.

14. The imaging device according to claim 13, wherein each of the second divided areas overlaps with the two or more first divided areas.

15. The imaging device according to claim 13, wherein each of the first divided areas and each of the second divided areas have the same shape and size, and wherein the first divided areas and the second divided areas are set such that each first divided area deviates by a half of a size of the first divided area in at least one of the first direction and the second direction.

16. The imaging device according to claim 1, wherein the plurality of pixels includes a plurality of basic pixel array groups which have color filter array patterns and are arranged in the first direction and the second direction, and wherein each of the plurality of basic pixel array groups includes at least one set of the at least four types of the determination pixel.

17. The imaging device according to claim 1,
wherein the at least four types of the determination pixels include first determination pixels, second determination pixels, third determination pixels, and fourth determination pixels,
wherein the first color pixel is adjacent to each first determination pixel in the positive direction of the first direction, and the pixels having color filters other than the color filter with the first color are adjacent to the first determination pixel in the negative direction of the first direction, the positive direction of the second direction, and the negative direction of the second direction,
wherein the first color pixel is adjacent to each second determination pixel in the negative direction of the first direction, and the pixels having color filters other than the color filter with the first color are adjacent to the second determination pixel in the positive direction of the first direction, the positive direction of the second direction, and the negative direction of the second direction,
wherein the first color pixel is adjacent to each third determination pixel in the positive direction of the second direction, and the pixels having color filters other than the color filter with the first color are adjacent to the third determination pixel in the positive direction of the first direction, the negative direction of the first direction, and the negative direction of the second direction, and
wherein the first color pixel is adjacent to each fourth determination pixel in the negative direction of the second direction, and the pixels having color filters other than the color filter with the first color are adjacent to the fourth determination pixel in the positive direction of the first direction, the negative direction of the first direction, and the positive direction of the second direction.

18. The imaging device according to claim 1,
wherein the at least four types of the determination pixels include first determination pixels, second determination pixels, third determination pixels, and fourth determination pixels,
wherein the first color pixels are adjacent to each first determination pixel in the positive direction of the first direction and the positive direction of the second direction, and the pixels having color filters other than the color filters with the first color are adjacent to the first determination pixel in the negative direction of the first direction and the negative direction of the second direction,
wherein the first color pixels are adjacent to each second determination pixel in the negative direction of the first direction and the positive direction of the second direction, and the pixels having color filters other than the color filters with the first color are adjacent to the second determination pixel in the positive direction of the first direction and the negative direction of the second direction,
wherein the first color pixels are adjacent to each third determination pixel in the positive direction of the first direction and the negative direction of the second direction, and the pixels having color filters other than the color filters with the first color are adjacent to the third determination pixel in the negative direction of the first direction and the positive direction of the second direction, and
wherein the first color pixels are adjacent to each fourth determination pixel in the negative direction of the first direction and the negative direction of the second direction, and the pixels having color filters other than the color filters with the first color are adjacent to the fourth determination pixel in the positive direction of the first direction and the positive direction of the second direction.

19. The imaging device according to claim 1,
wherein each color filter with the first color is any one of a red filter, a transparent filter, and a white filter.

20. The imaging device according to claim 16,
wherein each of the basic pixel array groups includes two first sub-pixel-array groups and two second sub-pixel-array groups each of which has a pixel array of 3×3 pixels in the first direction and the second direction,
wherein the first sub-pixel-array groups are adjacent to the second sub-pixel-array groups in the first direction and the second direction, and the second sub-pixel-array groups are adjacent to the first sub-pixel-array groups in the first direction and the second direction,
wherein each first sub-pixel-array group includes second color pixels which are disposed at a center and four corners and have color filters with a second color, the first color pixels which are disposed to be adjacent to the pixel at the center in the positive direction and the negative direction of the first direction, and third color pixels which are disposed to be adjacent to the pixel at the center in the positive direction and the negative direction of the second direction and have color filters with a third color,
wherein each second sub-pixel-array group includes the second color pixels which are disposed at a center and four corners, the first color pixels which are disposed to be adjacent to the pixel at the center in the positive direction and the negative direction of the second direction, and the third color pixels which are disposed to be adjacent to the pixel at the center in the positive direction and the negative direction of the first direction, and
wherein the determination pixels are constituted of two pixels, which are disposed in one diagonal direction, among the pixels disposed at the four corners of the first sub-pixel-array groups and two pixels, which are disposed in the other diagonal direction, among the pixels disposed at the four corners of the second sub-pixel-array groups.

21. An image processing device comprising the imaging device according to claim 1,
wherein the plurality of pixels includes at least four types of determination pixels for which patterns of color filters of pixels adjacent in a positive direction and a negative direction of the first direction and pixels adjacent in a positive direction and a negative direction of the second direction are different from one another,
wherein at least one of pixels, which are adjacent to each determination pixel in the positive direction and the negative direction of the first direction, and pixels, which are adjacent to the determination pixel in the positive direction and the negative direction of the second direction, is a first color pixel that has a color filter with a first color,
wherein among the pixels which are adjacent to each determination pixel in the positive direction and the negative direction of the first direction and the pixels which are adjacent to the determination pixel in the positive direction and the negative direction of the second direction, a pixel, which is opposed to the first color pixel with the determination pixel interposed therebetween, has a color filter other than the color filter with the first color, and wherein the abnormal oblique-incident-light detection unit detects abnormal oblique incident light, which is incident into the imaging element, on the basis of average values of the respective pixel data pieces corresponding to the types of the determination pixels in an area which is an area within the imaging element and includes types of a plurality of the determination pixels.

22. An image processing method for an imaging device, the method comprising detecting abnormal oblique incident light which is incident into an imaging element that has a plurality of pixels arranged in a first direction and a second direction perpendicular to the first direction, where each of the plurality of pixels has a color filter and a photodiode which receives light transmitted through the color filter and outputs pixel data, wherein the plurality of pixels includes at least four types of determination pixels for which patterns of color filters of pixels adjacent in a positive direction and a negative direction of the first direction and pixels adjacent in a positive direction and a negative direction of the second direction are different from one another, wherein at least one of pixels, which are adjacent to each determination pixel in the positive direction and the negative direction of the first direction, and pixels, which are adjacent to the determination pixel in the positive direction and the negative direction of the second direction, is a first color pixel that has a color filter with a first color, wherein among the pixels which are adjacent to each determination pixel in the positive direction and the negative direction of the first direction and the pixels which are adjacent to the determination pixel in the positive direction and the negative direction of the second direction, a pixel, which is opposed to the first color pixel with the determination pixel interposed therebetween, has a color filter other than the color filter with the first color, and wherein in the detecting of the abnormal oblique incident light, abnormal oblique incident light, which is incident into the imaging element, is detected on the basis of average values of the respective pixel data pieces corresponding to the types of the determination pixels in an area which is an area within the imaging element and includes types of a plurality of the determination pixels.

23. A non-transitory computer readable medium storing a program for causing a computer to execute an image processing method, the program causing the computer to execute detecting abnormal oblique incident light which is incident into an imaging element that has a plurality of pixels arranged in a first direction and a second direction perpendicular to the first direction, where each of the plurality of pixels has a color filter and a photodiode which receives light transmitted through the color filter and outputs pixel data, wherein the plurality of pixels includes at least four types of determination pixels for which patterns of color filters of pixels adjacent in a positive direction and a negative direction of the first direction and pixels adjacent in a positive direction and a negative direction of the second direction are different from one another, wherein at least one of pixels, which are adjacent to each determination pixel in the positive direction and the negative direction of the first direction, and pixels, which are adjacent to the determination pixel in the positive direction and the negative direction of the second direction, is a first color pixel that has a color filter with a first color, wherein among the pixels which are adjacent to each determination pixel in the positive direction and the negative direction of the first direction and the pixels which are adjacent to the determination pixel in the positive direction and the negative direction of the second direction, a pixel, which is opposed to the first color pixel with the determination pixel interposed therebetween, has a color filter other than the color filter with the first color, and wherein abnormal oblique incident light, which is incident into the imaging element, is detected on the basis of average values of the respective pixel data pieces corresponding to the types of the determination pixels in an area which is an area within the imaging element and includes types of a plurality of the determination pixels.

* * * * *